(12) United States Patent
Choi et al.

(10) Patent No.: US 12,334,485 B2
(45) Date of Patent: Jun. 17, 2025

(54) DISPLAY DEVICE FOR IMPROVING INTERNAL QUANTUM EFFICIENCY

(71) Applicant: Samsung Display Co., LTD., Yongin-si (KR)

(72) Inventors: Jin Woo Choi, Seoul (KR); Min Woo Kim, Hwaseong-si (KR); Sung Kook Park, Suwon-si (KR); Sung Eun Baek, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 457 days.

(21) Appl. No.: 17/827,369

(22) Filed: May 27, 2022

(65) Prior Publication Data

US 2023/0049635 A1    Feb. 16, 2023

(30) Foreign Application Priority Data

Aug. 10, 2021 (KR) ........................ 10-2021-0105689

(51) Int. Cl.
*H01L 25/16* (2023.01)
*G09G 3/32* (2016.01)
(Continued)

(52) U.S. Cl.
CPC ......... *H01L 25/167* (2013.01); *H10H 29/142* (2025.01); *G09G 3/32* (2013.01);
(Continued)

(58) Field of Classification Search
CPC ..... H01L 25/167; H01L 27/156; H01L 24/05; H01L 24/08; H01L 24/32; H01L 24/48; H01L 24/80; H01L 24/92; H01L 2224/92; H01L 2924/0132; H01L 2924/0133; H01L 33/507; H01L 33/44; H01L 33/60; H01L 27/1214; H01L 33/36; H01L 33/483;
(Continued)

(56) References Cited

U.S. PATENT DOCUMENTS 9,997,561 B2   6/2018  Cha et al.
10,388,693 B2  8/2019  Cha et al.
(Continued)

FOREIGN PATENT DOCUMENTS

KR    2017-0116296 A    10/2017

*Primary Examiner* — Kyoung Lee
*Assistant Examiner* — Sophia W Kao
(74) *Attorney, Agent, or Firm* — Womble Bond Dickinson (US) LLP

(57) ABSTRACT

A display device includes a substrate, a first light-emitting element, a second light-emitting element, and a third light-emitting element on the substrate, each of the first, second, and third light-emitting elements includes a first semiconductor layer, an active layer, a second semiconductor layer, and a third semiconductor layer, an opening formed in the second semiconductor layer and the third semiconductor layer of the third light-emitting element, and a wavelength conversion member located at the opening, wherein the first light-emitting element and the third light-emitting element are configured to emit first light, and the second light-emitting element is configured to emit second light, and the wavelength conversion member is configured to convert the first light from the third light-emitting element into third light.

29 Claims, 48 Drawing Sheets

(51) Int. Cl.
*H01L 23/00* (2006.01)
*H10H 29/14* (2025.01)

(52) U.S. Cl.
CPC ............... *G09G 2300/0426* (2013.01); *G09G 2300/0842* (2013.01); *H01L 24/05* (2013.01); *H01L 24/08* (2013.01); *H01L 24/32* (2013.01); *H01L 24/48* (2013.01); *H01L 24/80* (2013.01); *H01L 24/92* (2013.01); *H01L 2224/05073* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05166* (2013.01); *H01L 2224/05562* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05666* (2013.01); *H01L 2224/08145* (2013.01); *H01L 2224/32145* (2013.01); *H01L 2224/48157* (2013.01); *H01L 2224/80006* (2013.01); *H01L 2224/8013* (2013.01); *H01L 2224/80132* (2013.01); *H01L 2224/80805* (2013.01); *H01L 2224/92* (2013.01); *H01L 2924/0132* (2013.01); *H01L 2924/0133* (2013.01)

(58) Field of Classification Search
CPC ........... H01L 33/50; H01L 33/62; G09G 3/32; G09G 2300/0426; G09G 2300/0842; G09G 2300/0452; G09G 2320/0295; G09G 3/3241
See application file for complete search history.

(56) References Cited

U.S. PATENT DOCUMENTS

| | | | |
|---|---|---|---|
| 10,644,062 B2 | 5/2020 | Cha et al. | |
| 11,251,225 B2 | 2/2022 | Cha et al. | |
| 2017/0294479 A1* | 10/2017 | Cha | H01L 33/62 |
| 2020/0175908 A1 | 6/2020 | Ahmed et al. | |
| 2020/0184884 A1* | 6/2020 | Lau | H05B 45/10 |
| 2020/0227592 A1 | 7/2020 | Zhang et al. | |
| 2021/0199972 A1* | 7/2021 | Joung | H10K 77/10 |
| 2021/0296543 A1* | 9/2021 | Aoyama | H01L 33/504 |
| 2021/0359017 A1* | 11/2021 | Koshihara | H10K 59/352 |
| 2022/0352424 A1 | 11/2022 | Choi et al. | |

* cited by examiner

DISPLAY DEVICE FOR IMPROVING INTERNAL QUANTUM EFFICIENCY

CROSS-REFERENCE TO RELATED APPLICATION

This application claims priority to and the benefit of Korean Patent Application No. 10-2021-0105689 filed on Aug. 10, 2021 in the Korean Intellectual Property Office, the entire disclosure of which is incorporated by reference herein.

BACKGROUND

1. Field

The present disclosure relates to a display device.

2. Description of the Related Art

With the advancement of the information age, the demand for a display device for displaying an image has increased with various forms. The display device may be a flat panel display device such as a liquid crystal display device, a field emission display device, and a light-emitting display. The light-emitting display device may include an organic light-emitting display device including an organic light-emitting diode element as a light-emitting element, an inorganic light-emitting display device including an inorganic semiconductor element as a light-emitting element, or a micro light-emitting diode element as a light-emitting element.

Recently, a head mounted display including a light-emitting display device has been developed. The head mounted display (HMD) is a glasses type monitor device of a virtual reality (VR) or augmented reality (AR), which is worn by a user in the form of glasses or helmet and forms a focus at a distance close to eyes of the user.

A high-resolution micro light-emitting diode display panel including a micro light-emitting diode element is applied to a head mounted display. Because the micro light-emitting diode element emits light of a single color, the micro light-emitting diode display panel may include a wavelength conversion layer for converting a wavelength of light emitted from the micro light-emitting diode element to display various colors.

SUMMARY

Aspects and features of embodiments of the present disclosure are to provide a display device that may improve internal quantum efficiency of a light-emitting element even at a low current density.

Aspects and features of embodiments of the present disclosure are not limited to those mentioned above, and additional aspects and features of the present disclosure, which are not mentioned herein, will be clearly understood by those skilled in the art from the following description of the present disclosure.

According to one or more embodiments of the disclosure, the display device includes a substrate, a first light-emitting element, a second light-emitting element, and a third light-emitting element on the substrate, each of the first, second, and third light-emitting elements including a first semiconductor layer, an active layer, a second semiconductor layer, and a third semiconductor layer, an opening formed in the second semiconductor layer and the third semiconductor layer of the third light-emitting element, and a wavelength conversion member located at the opening, wherein the first light-emitting element and the third light-emitting element are configured to emit first light, and the second light-emitting element is configured to emit second light, and the wavelength conversion member is configured to convert the first light from the third light-emitting element into third light.

In one or more embodiments, the second semiconductor layer and the third semiconductor layer are common layers that are continuous at the first light-emitting element, the second light-emitting element and the third light-emitting element.

In one or more embodiments, the opening overlaps the third light-emitting element, and does not overlap the first light-emitting element and the second light-emitting element.

In one or more embodiments, the opening is formed in a shape that passes through the third semiconductor layer and allows at least a portion of the second semiconductor layer to be recessed at a suitable thickness.

In one or more embodiments, a depth of the opening is smaller than a sum of thicknesses of the second semiconductor layer and the third semiconductor layer.

In one or more embodiments, a thickness of the second semiconductor layer that overlaps the opening is at least 1 μm.

In one or more embodiments, the wavelength conversion member includes a wavelength conversion layer configured to convert the first light into the third light, the opening being filled with the wavelength conversion layer.

In one or more embodiments, the wavelength conversion member includes a color filter on the wavelength conversion layer, where the color filter is configured to transmit the third light.

In one or more embodiments, a lower surface of the color filter is aligned and matched with an upper surface of the third semiconductor layer.

In one or more embodiments, an upper surface of the color filter is aligned and matched with that of the third semiconductor layer.

In one or more embodiments, the display device further includes a light-shielding member on the third semiconductor layer, wherein the light-shielding member does not overlap the first light-emitting element, the second light-emitting element, and the third light-emitting element, and wherein the light-shielding member is at a same layer as the color filter.

In one or more embodiments, the first semiconductor layer, the active layer, the second semiconductor layer, and the third semiconductor layer are located sequentially in a direction away from the substrate.

In one or more embodiments, a width of the opening is the same as that of the third light-emitting element or greater than that of the third light-emitting element.

In one or more embodiments, the display device further includes a reflective layer on an inner side of the opening.

In one or more embodiments, the first light is blue light, the second light is green light, and the third light is red light.

In one or more embodiments, the substrate further includes a plurality of pixel circuits including at least one transistor, and pixel electrodes on the plurality of pixel circuits and respectively connected with the plurality of pixel circuits.

In one or more embodiments, the first light-emitting element, the second light-emitting element, and the third light-emitting element are bonded to corresponding ones of the pixel electrodes, and the display device further includes a filler filled between the first to third light-emitting elements and the substrate.

In one or more embodiments, the display device further includes a transparent substrate on the third semiconductor layer, wherein the opening passes through the transparent substrate.

According to one or more embodiments of the disclosure, the display device includes a substrate, a first light-emitting element, a second light-emitting element, and a third light-emitting element on the substrate, each of the first, second, and third light-emitting elements including a first semiconductor layer, an active layer, a second semiconductor layer, and a third semiconductor layer, and a wavelength conversion member overlapping the third light-emitting element, wherein the first light-emitting element is configured to emit first light, the second light-emitting element is configured to emit second light and the third light-emitting element is configured to emit third light, and the wavelength conversion member is configured to transmits the third light from the third light-emitting element.

In one or more embodiments, the wavelength conversion member includes a color filter configured to transmit the third light and to shield the first light and the second light.

In one or more embodiments, the display device further includes an opening formed in the second semiconductor layer and the third semiconductor layer of the third light-emitting element, wherein the opening overlaps the third light-emitting element.

In one or more embodiments, the wavelength conversion member is located in the opening, and an upper surface of the wavelength conversion member is aligned and matched with that of the third semiconductor layer.

According to one or more embodiments of the disclosure, the display device includes a substrate including a first light emission area for emitting first light, a second light emission area for emitting second light, and a third light emission area for emitting third light, a plurality of light-emitting elements on the substrate and located at corresponding ones of the first light emission area, the second light emission area, and the third light emission area, an opening overlapping the third light emission area, and a wavelength conversion member located in the opening, wherein the plurality of light-emitting elements includes a plurality of semiconductor layers continuously located in the plurality of light-emitting elements, and the opening is in at least a portion of the plurality of semiconductor layers.

In one or more embodiments, the plurality of light-emitting elements includes a first light-emitting element overlapping the first light emission area, the first light-emitting element being configured to emit the first light, a second light-emitting element overlapping the second light emission area, the second light-emitting element being configured to emit the second light, and a third light-emitting element overlapping the third light emission area, the third light-emitting element being configured to emit the first light.

In one or more embodiments, the wavelength conversion member includes a wavelength conversion layer configured to convert the first light emitted from the third light-emitting element into the third light.

In one or more embodiments, the wavelength conversion member includes a color filter on the wavelength conversion layer, the color filter being configured to transmit the third light and to shield the first light and the second light.

In one or more embodiments, each of the plurality of light-emitting elements includes a first semiconductor layer, an active layer, a second semiconductor layer, and a third semiconductor layer located sequentially in a direction away from the substrate, wherein the opening penetrates through the third semiconductor layer and has a recess at the second semiconductor layer.

In the display device according to embodiments of the present disclosure, an opening is formed on a light-emitting element for emitting first light and a wavelength conversion member for converting the first light into third light is formed, whereby the third light may be implemented at a low current density to improve internal quantum efficiency.

Also, in the display device according to embodiments of the present disclosure, an opening may be formed to be deep so that a color filter and a wavelength conversion layer may be formed in the opening, whereby the color filter and the wavelength conversion layer may easily be aligned. A thickness of the wavelength conversion layer may be increased to improve optical conversion efficiency.

In addition, the display device according to embodiments of the present disclosure includes a light-shielding member surrounding light emission areas to prevent a color mixture from occurring due to permeation of light into portions between the light emission areas, thereby improving a color reproduction rate.

In addition, in the display device according to embodiments of the present disclosure, since a reflective layer is provided in an opening, light conversion efficiency of a wavelength conversion layer disposed in the opening may be improved.

The effects according to the embodiments of the present disclosure are not limited to those mentioned above, and more various effects are included in the following description of the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, detailed embodiments of the present disclosure will be described with reference to the accompanying drawings.

Figure 1:
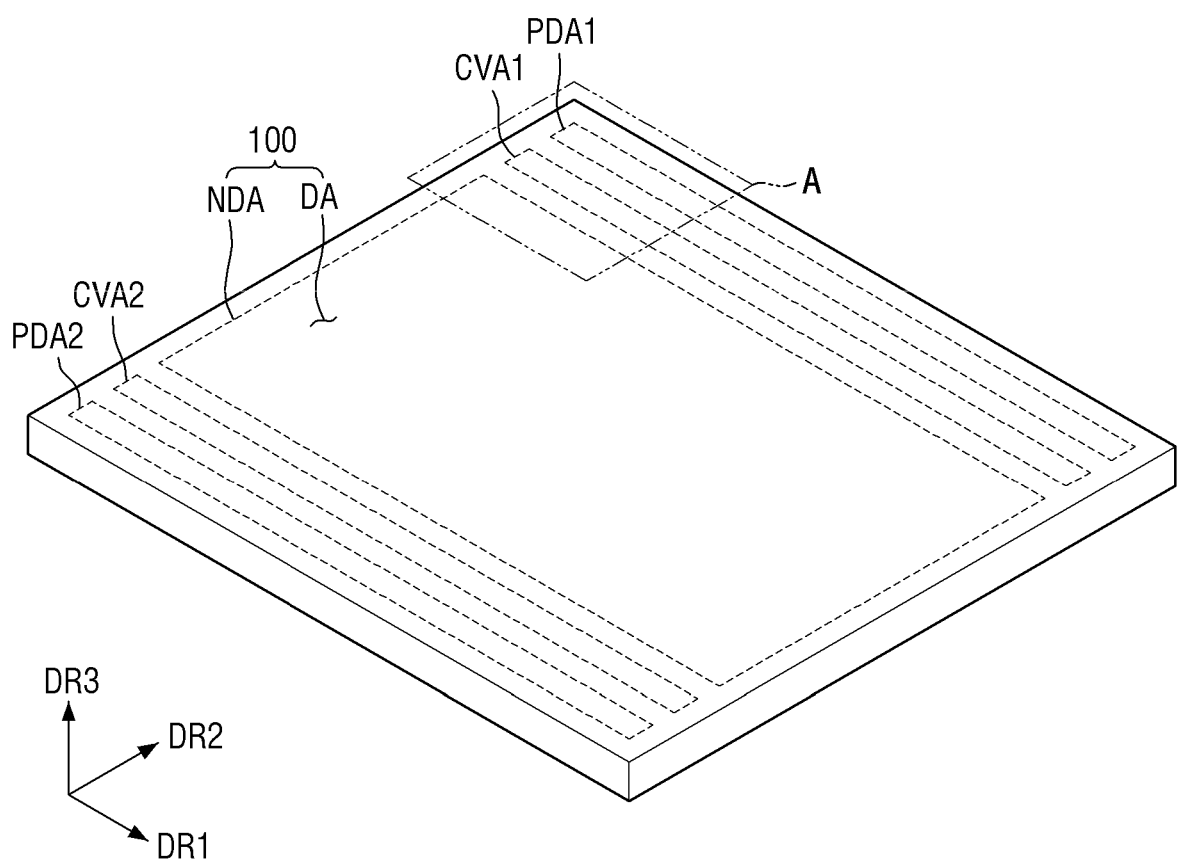
FIG. 1 is a layout view illustrating a display device according to one or more embodiments of the present disclosure.
Figure 2:
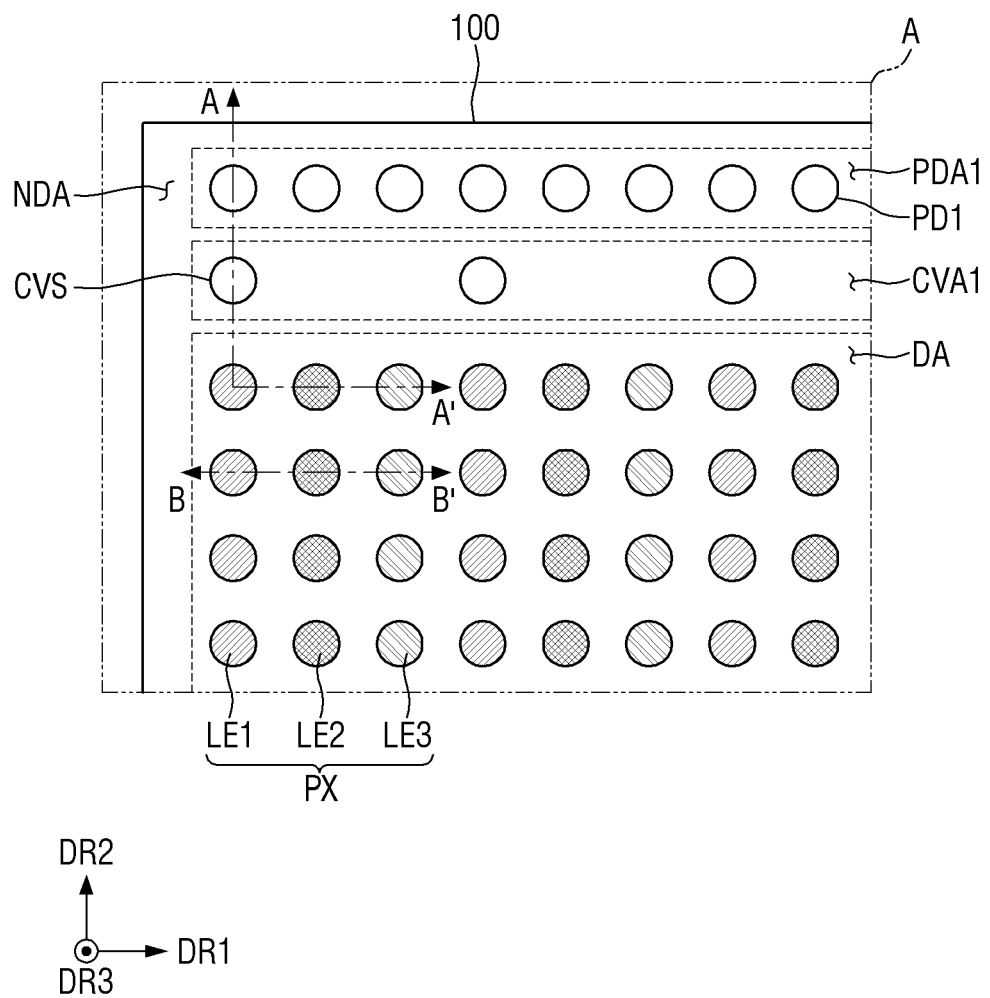
FIG. 2 is a detailed layout view illustrating an area A of FIG. 1.
Figure 3:
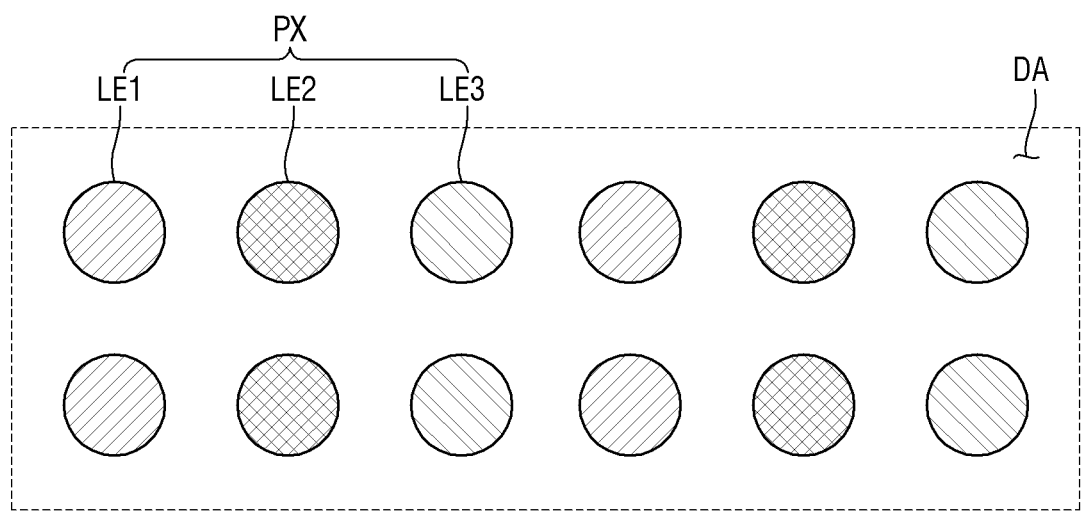
FIG. 3 is a layout view illustrating pixels of a display panel according to one or more embodiments of the present disclosure.
Figure 3:
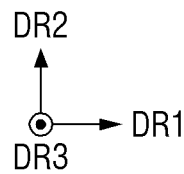

FIG. 1 is a layout view illustrating a display device according to one or more embodiments of the present disclosure. FIG. 2 is a detailed layout view illustrating an area A of FIG. 1. FIG. 3 is a layout view illustrating pixels of a display panel according to one or more embodiments of the present disclosure.

Although the display device according to one or more embodiments of the present disclosure is a micro light-emitting diode display device (or nano light-emitting diode display device) including a micro light-emitting diode (or nano light-emitting diode) as a light-emitting element in FIGS. 1 to 3, the embodiments of the present disclosure are not limited thereto.

Also, although the display device according to one or more embodiments of the present disclosure is a light-emitting diode on silicon (LEDoS) having light-emitting diodes disposed on a semiconductor circuit board 110 (e.g., see FIG. 4) formed by a semiconductor process using a silicon wafer, as light-emitting elements in FIGS. 1 to 3, the embodiments of the present disclosure are not limited thereto.

In addition, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. In this case, "left," "right," "up," and "down" indicate directions when the display panel 100 is viewed from the plane. For example, "right" indicates one side of the first direction DR1, "left" indicates the other side of the first direction DR1, "upper" indicates one side of the second direction DR2, and "lower" indicates the other side of the second direction DR2. In addition, "upper" indicates one side of the third direction DR3, and "lower" indicates the other side of the third direction DR3.

Referring to FIGS. 1 to 3, the display device 10 according to one or more embodiments includes a display panel 100 that includes a display area DA and a non-display area NDA.

The display panel 100 may have a rectangular plane shape having a long side of the first direction DR1 and a short side of the second direction DR2, but the plane shape of the display panel 100 is not limited thereto. The display panel 100 may have another polygonal shape in addition to the rectangular shape, a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In the example of FIG. 1, the plane shape of the display area DA is a rectangular shape. The display area DA may be disposed in a central area of the display panel 100. The non-display area NDA may be disposed in the vicinity of the display area DA around the edge or periphery of the display area DA. The non-display area NDA may be disposed to surround the display area DA.

The display area DA of the display panel 100 may include a plurality of pixels PX. The pixels PX may be defined as a minimum light emission unit capable of displaying white light.

Each of the plurality of pixels PX may include first to third light-emitting elements LE1, LE2, and LE3 that emit light. Each of the plurality of pixels PX includes three light-emitting elements LE1, LE2, and LE3 in one or more embodiments of the present disclosure, but embodiments of the present disclosure are not limited thereto. Also, each of the first to third light-emitting elements LE1, LE2, and LE3 has a circular plane shape in one or more embodiments of the present disclosure, but embodiments of the present disclosure are not limited thereto.

The first light-emitting element LE1 may emit first light. The first light may be the light of a blue wavelength band. For example, a main peak wavelength (B-peak) of the first light may range from 370 nm to 460 nm, approximately, but embodiments of the present disclosure are not limited thereto.

The second light-emitting element LE2 may emit second light. The second light may be the light of a green wavelength band. For example, a main peak wavelength (G-peak) of the second light may range from 480 nm to 560 nm, approximately, but embodiments of the present disclosure are not limited thereto.

The third light-emitting element LE3 may emit the first light. The first light may be the light of a blue wavelength band. For example, a main peak wavelength (B-peak) of the first light may range from 370 nm to 460 nm, approximately, but embodiments of the present disclosure are not limited thereto. In the present embodiment, the third light-emitting element LE3 emits the first light, but the first light may be converted into third light by a wavelength conversion layer and/or a color filter, which will be described later. The third light may be the light of a red wavelength band. The red wavelength band may range from 600 nm to 750 nm.

The first light-emitting elements LE1, the second light-emitting elements LE2, and the third light-emitting elements LE3 may alternately be disposed along the first direction DR1. For example, the first light-emitting elements LE1, the second light-emitting elements LE2, and the third light-emitting elements LE3 may be disposed along the first direction DR1 in due order. The first light-emitting elements LE1 may be disposed along the second direction DR2. The second light-emitting elements LE2 may be disposed along the second direction DR2. The third light-emitting elements LE3 may be disposed along the second direction DR2.

The non-display area NDA may include a first common voltage supply area CVA1, a second common voltage supply area CVA2, a first pad area PDA1, and a second pad area PDA2.

The first common voltage supply area CVA1 may be disposed between the first pad area PDA1 and the display area DA in the second direction DR2. The second common voltage supply area CVA2 may be disposed between the second pad area PDA2 and the display area DA in the second direction DR2. Each of the first common voltage supply area CVA1 and the second common voltage supply area CVA2 may include a plurality of common voltage supply portions CVS connected to a common electrode A common voltage may be supplied to the common electrode through the plurality of common voltage supply portions CVS.

The plurality of common voltage supply portions CVS of the first common voltage supply area CVA1 may be electrically connected to any one of first pads PD1 of the first pad area PDA1. That is, the plurality of common voltage supply portions CVS of the first common voltage supply area CVA1 may be supplied with a common voltage from any one of the first pads PD1 of the first pad area PDA1.

The plurality of common voltage supply portions CVS of the second common voltage supply area CVA2 may electrically be connected to any one of second pads PD2 of the second pad area PDA2. That is, the plurality of common voltage supply portions CVS of the second common voltage supply area CVA2 may be supplied with a common voltage from any one of the second pads PD2 of the second pad area PDA2.

Although FIGS. 1 and 2 illustrate that the common voltage supply areas CVA1 and CVA2 are disposed at both sides of the display area DA in the second direction DR2, embodiments of the present disclosure are not limited thereto. For example, the common voltage supply areas CVA1 and CVA2 may be disposed to be around (or surround) the display area DA.

The first pad area PDA1 may be disposed above the display panel 100 in the second direction DR2. The first pad area PDA1 may include the first pads PD1 connected to an external circuit board.

The second pad area PDA2 may be disposed below the display panel 100 in the second direction DR2. The second pad area PDA2 may include second pads PD2 for connection with the external circuit board. In one or more embodiments, the second pad area PDA2 may be omitted.

Figure 4:
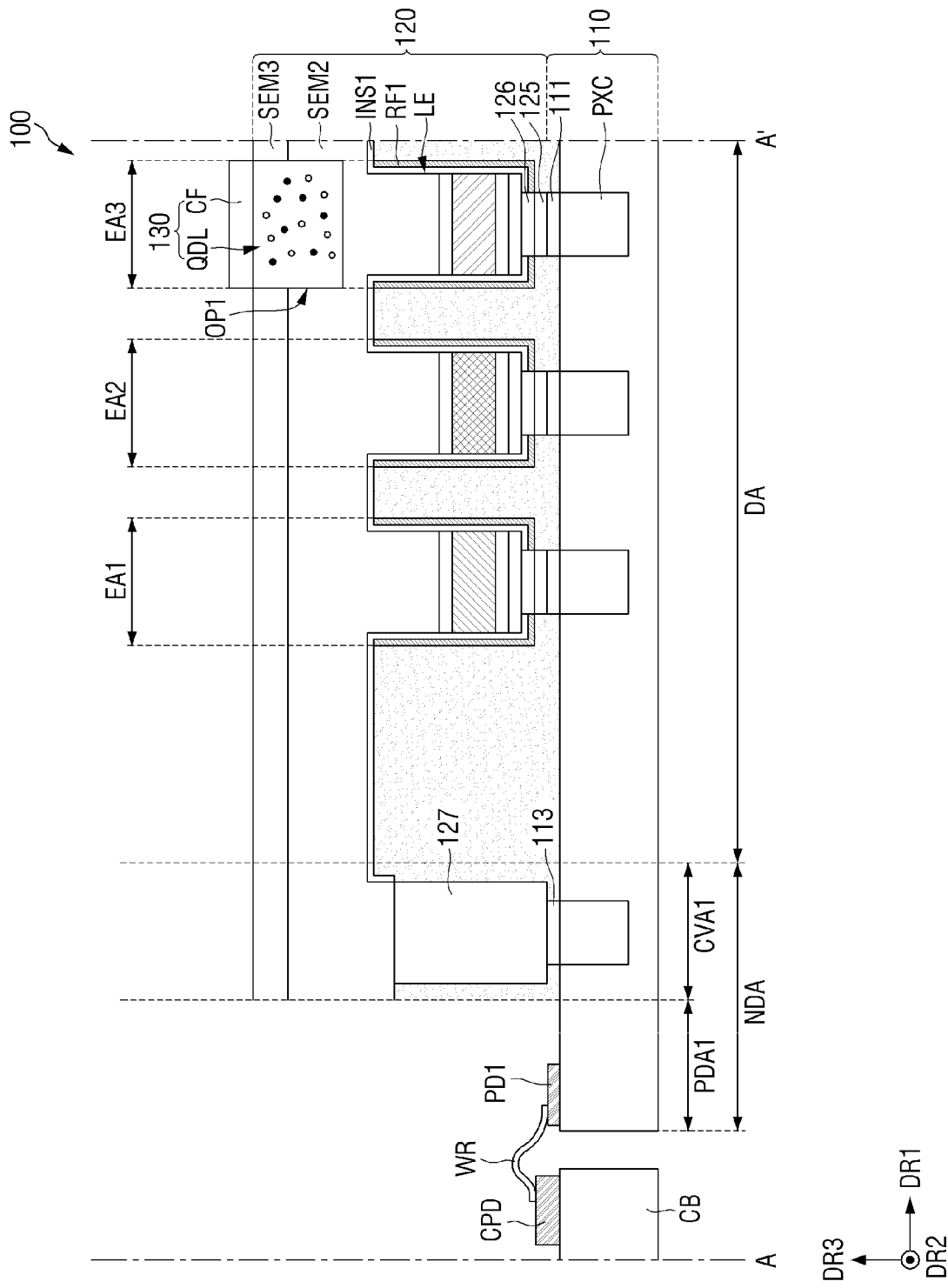
FIG. 4 is a cross-sectional view illustrating an example of a display panel taken along the line A-A' of FIG. 2.
Figure 5:
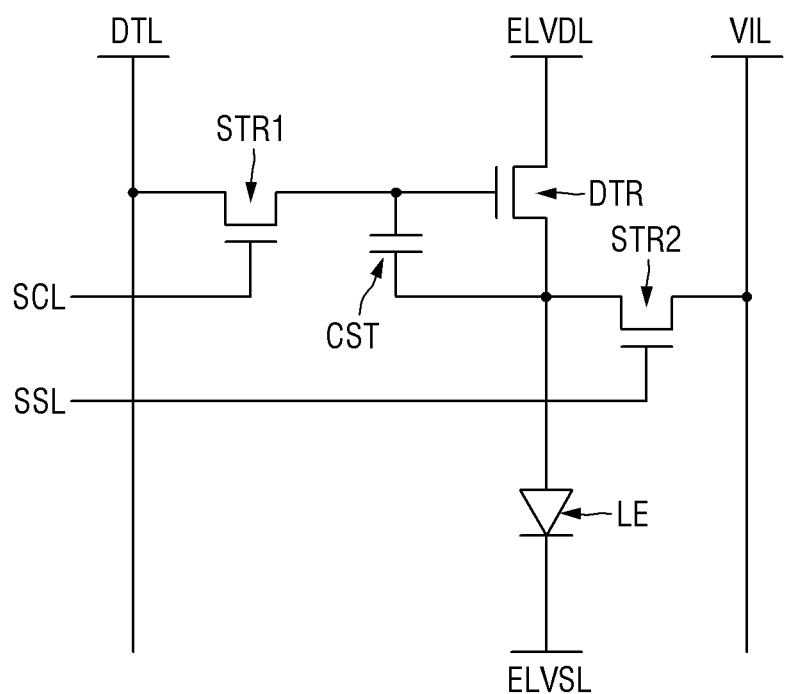
FIG. 5 is an equivalent circuit view illustrating one pixel of a display device according to one or more embodiments of the present disclosure.
Figure 6:
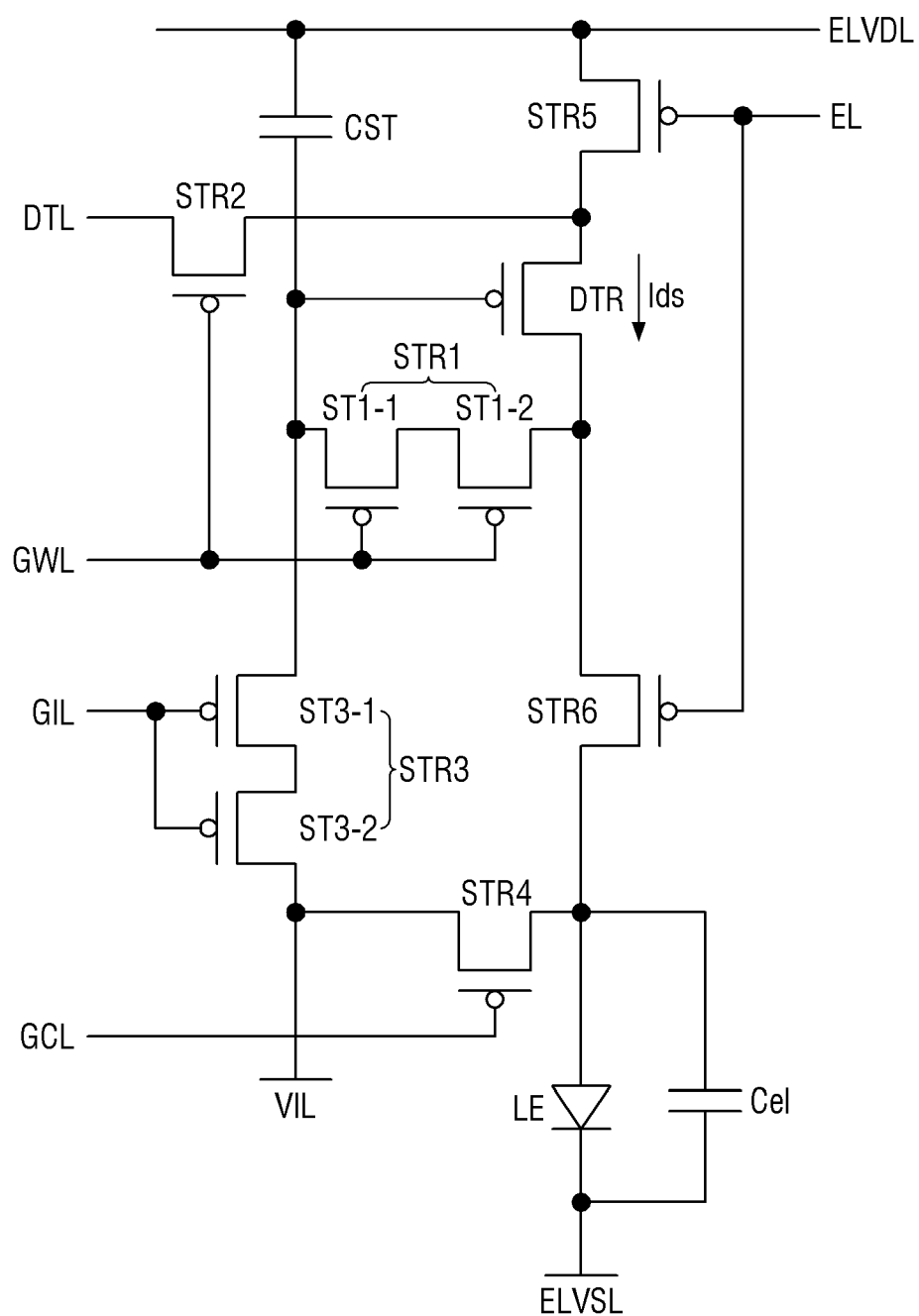
FIG. 6 is an equivalent circuit view illustrating one pixel of a display device according to one or more embodiments of the present disclosure.
Figure 7:
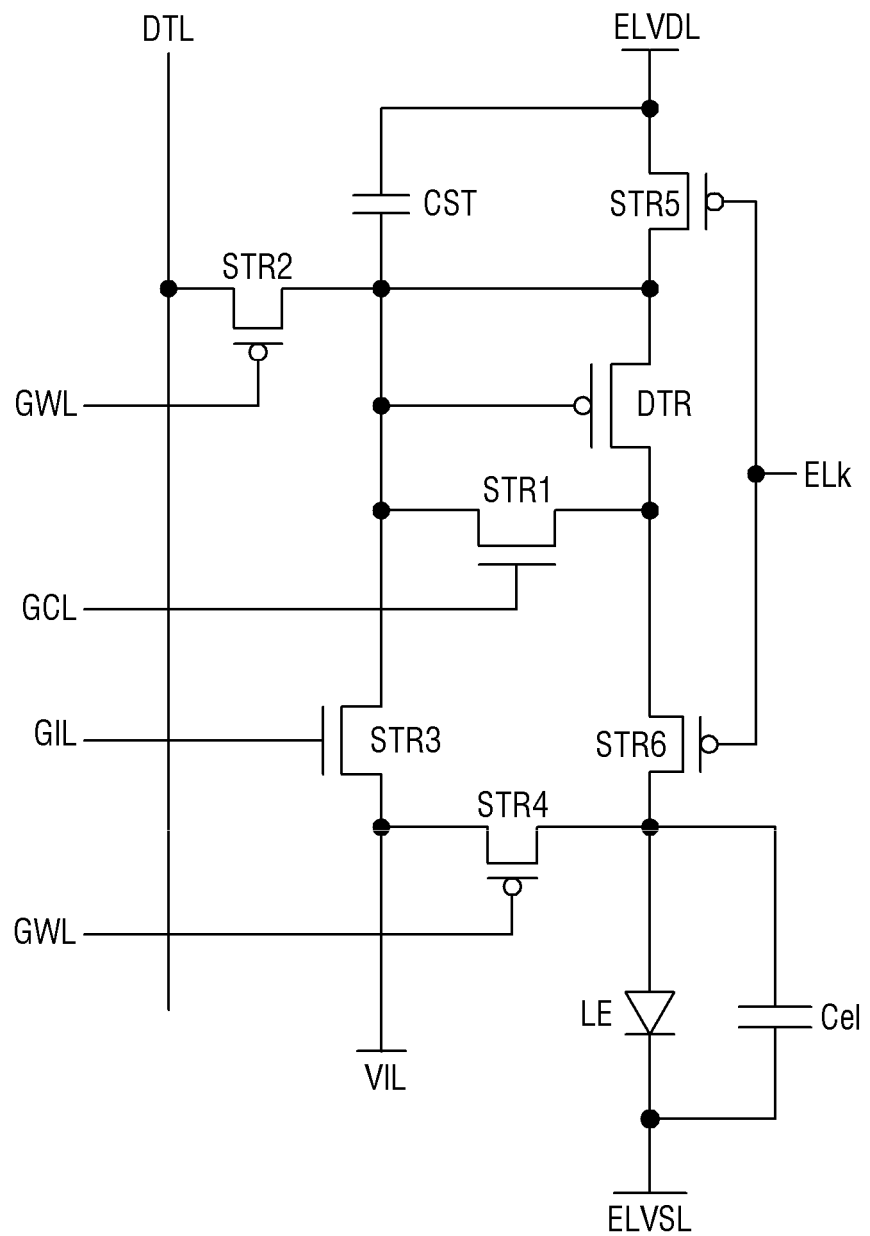
FIG. 7 is an equivalent circuit view illustrating one pixel of a display device according to one or more embodiments of the present disclosure.
Figure 8:
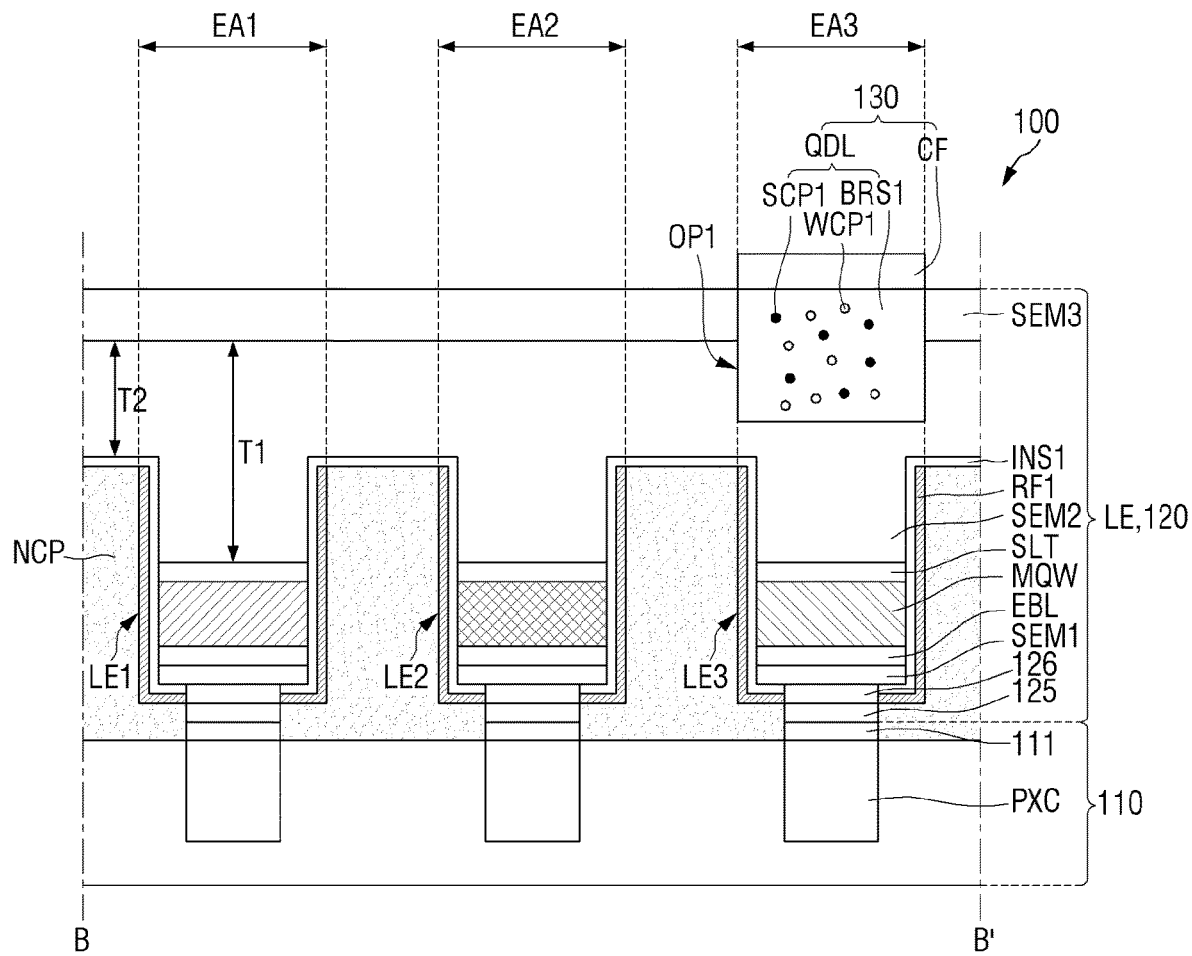
FIG. 8 is a cross-sectional view illustrating an example of a display panel taken along the line B-B' of FIG. 2.
Figure 8:
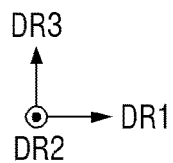
Figure 9:
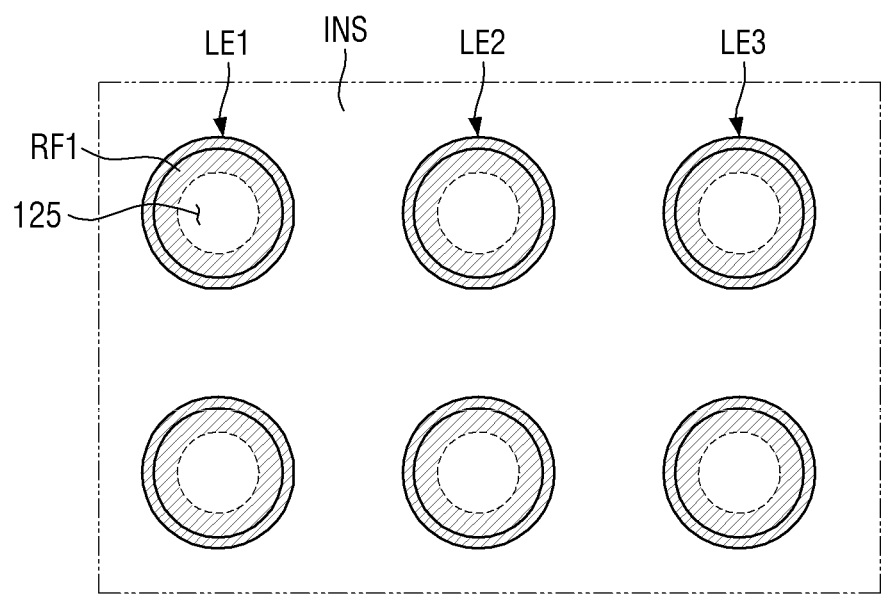
FIG. 9 is a plan view illustrating an example of a light-emitting element layer of a display panel according to one or more embodiments of the present disclosure.
Figure 10:
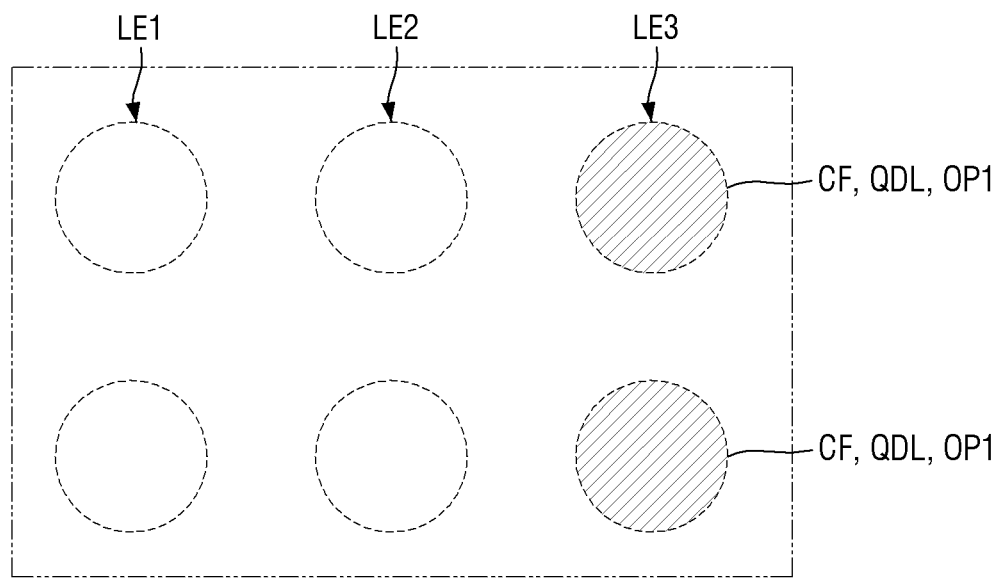
FIG. 10 is a plan view illustrating an example of a light-emitting element layer of a display panel according to one or more embodiments of the present disclosure.
Figure 11:
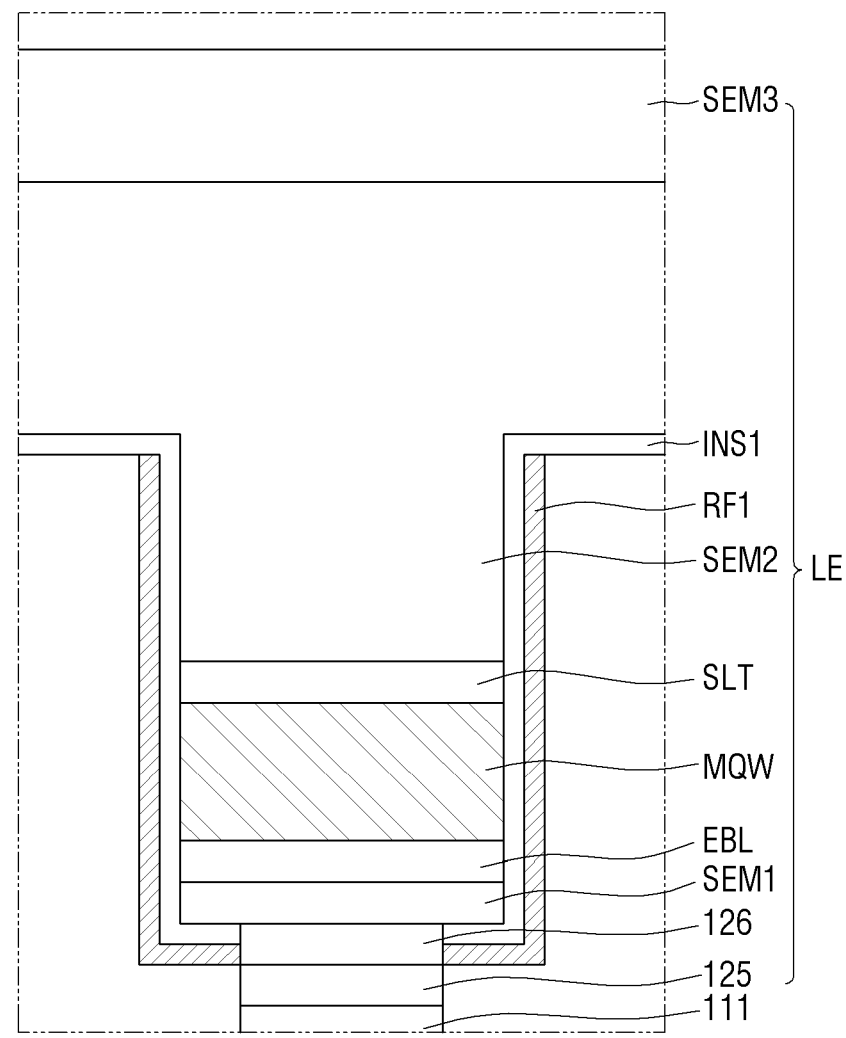
FIG. 11 is a cross-sectional view illustrating an example of a light-emitting element of a display panel according to one or more embodiments of the present disclosure.

FIG. 4 is a cross-sectional view illustrating an example of a display panel taken along the line A-A' of FIG. 2. FIG. 5 is an equivalent circuit view illustrating one pixel of a display device according to one or more embodiments of the present disclosure. FIG. 6 is an equivalent circuit view illustrating one pixel of a display device according to one or more embodiments of the present disclosure. FIG. 7 is an equivalent circuit view illustrating one pixel of a display device according to one or more embodiments of the present disclosure. FIG. 8 is a cross-sectional view illustrating an example of a display panel taken along the line B-B' of FIG. 2. FIG. 9 is a plan view illustrating an example of a light-emitting element layer of a display panel according to one or more embodiments of the present disclosure. FIG. 10 is a plan view illustrating an example of a light-emitting element layer of a display panel according to one or more embodiments of the present disclosure. FIG. 11 is a cross-sectional view illustrating an example of a light-emitting element of a display panel according to one or more embodiments of the present disclosure.

Referring to FIGS. 4 to 11, the display panel 100 according to one or more embodiments may include a semiconductor circuit board 110, a light-emitting element layer 120, and a wavelength conversion member 130.

The semiconductor circuit board 110 may include a plurality of pixel circuits PXC, pixel electrodes 111, first pads PD1, and a common contact electrode 113.

The semiconductor circuit board 110 is a silicon wafer substrate formed using a semiconductor process, and may be a first substrate. The plurality of pixel circuits PXC of the semiconductor circuit board 110 may be formed using a semiconductor process.

The plurality of pixel circuits PXC may be disposed in the display area DA and the non-display area NDA. Each of the plurality of pixel circuits PXC may be connected to a corresponding pixel electrode 111. That is, the plurality of pixel circuits PXC and the plurality of pixel electrodes 111 may be connected to each other in one-to-one correspondence. Each of the plurality of pixel circuits PXC may overlap the light-emitting element LE in the third direction DR3.

Each of the plurality of pixel circuits PXC may include at least one transistor formed by a semiconductor process. Each of the plurality of pixel circuits PXC may further include at least one capacitor formed by a semiconductor process. The plurality of pixel circuits PXC may include, for example, a CMOS circuit. Each of the pixel circuits PXC may apply a pixel voltage or an anode voltage to the pixel electrode 111.

Referring to FIG. 5, the plurality of pixel circuits PXC according to one or more embodiments may include three transistors DTR, STR1, and STR2 and one storage capacitor CST.

The light-emitting element LE emits light in accordance with a current supplied through a driving transistor DTR. The light-emitting element LE may be implemented as an inorganic light-emitting diode, an organic light-emitting diode, a micro light-emitting diode, a nano light-emitting diode, etc.

A first electrode (i.e., anode electrode) of the light-emitting element LE may be connected to a source electrode of the driving transistor DTR, and its second electrode (i.e., cathode electrode) may be connected to a second power line ELVSL supplied with a low potential voltage (e.g., a second power voltage) lower than a high potential voltage (e.g., a first power voltage) of a first power line ELVDL.

The driving transistor DTR adjusts the current flowing from the first power line ELVDL supplied with the first power voltage to the light-emitting element LE in accordance with a voltage difference between a gate electrode and a source electrode of the driving transistor DTR. The gate electrode of the driving transistor DTR may be connected to a first electrode of a first transistor STR1, its source electrode may be connected to the first electrode of the light-emitting element LE, and its drain electrode may be connected to the first power line ELVDL to which the first power voltage is applied.

The first transistor STR1 is turned on by a scan signal (e.g., a high level scan signal) of a scan line SCL to connect a data line DTL to the gate electrode of the driving transistor DTR. A gate electrode of the first transistor STR1 may be connected to the scan line SCL, its first electrode may be connected to the gate electrode of the driving transistor DTR, and its second electrode may be connected to the data line DTL.

The second transistor STR2 is turned on by a sensing signal (e.g., a high level scan signal) of a sensing signal line SSL to connect an initialization voltage line VIL to the source electrode of the driving transistor DTR. A gate electrode of the second transistor STR2 may be connected to the sensing signal line SSL, its first electrode may be connected to the initialization voltage line VIL, and its second electrode may be connected to the source electrode of the driving transistor DTR.

In one or more embodiments, the first electrode of each of the first and second transistors STR1 and STR2 may be a source electrode, and the second electrode thereof may be a drain electrode, but are not limited thereto, and vice versa.

The capacitor CST is formed between the gate electrode and the source electrode of the driving transistor DTR. The storage capacitor CST stores a differential voltage (or charge) of a gate voltage and a source voltage of the driving transistor DTR.

The driving transistor DTR and the first and second transistors STR1 and STR2 may be formed of thin film transistors (TFTs). In FIG. 5, the driving transistor DTR and the first and second transistors (or the first and second switching transistors) STR1 and STR2 are N-type metal oxide semiconductor field effect transistors (MOSFETs), but are not limited thereto. That is, the driving transistor DTR and the first and second switching transistors STR1 and STR2 may be P-type MOSFETs, or a portion of the transistors may be N-type MOSFET and the other portion of the transistors may be P-type MOSFET.

Referring to FIG. 6, the first electrode of the light-emitting element LE of the pixel circuit PXC according to one or more embodiments may be connected to a first electrode of a fourth transistor STR4 and a second electrode of a sixth transistor STR6, and its second electrode may be connected to the second power line ELVSL. A parasitic capacitance Cel may be formed between the first electrode and the second electrode of the light-emitting element LE.

Each pixel PX includes a driving transistor DTR, switch elements, and a capacitor CST. The switch elements include first to sixth transistors STR1, STR2, STR3, STR4, STR5, and STR6.

The driving transistor DTR includes a gate electrode, a first electrode, and a second electrode. The driving transistor DTR controls a drain-source current Ids (hereinafter, referred to as "driving current") flowing between the first electrode and the second electrode in accordance with a data voltage applied to the gate electrode.

The capacitor CST is formed between the gate electrode of the driving transistor DTR and the first power line ELVDL. One electrode of the capacitor CST may be connected to the gate electrode of the driving transistor DTR, and the other electrode thereof may be connected to the first power line ELVDL.

When the first electrode of each of the first to sixth transistors STR1 (ST1-1, ST1-2), STR2, STR3 (ST3-1, ST3-2), STR4, STR5, and STR6 and the driving transistor DTR is a source electrode, the second electrode thereof may be a drain electrode. Alternatively, when the first electrode of each of the first to sixth transistors STR1, STR2, STR3, STR4, STR5, and STR6 and the driving transistor DTR is a drain electrode, the second electrode thereof may be a source electrode.

An active layer of each of the first to sixth transistors STR1, STR2, STR3, STR4, STR5, and STR6 and the driving transistor DTR may be formed of any one of poly silicon, amorphous silicon, and oxide semiconductor. When a semiconductor layer of each of the first to sixth transistors STR1, STR2, STR3, STR4, STR5, and STR6 and the driving transistor DTR is formed of poly silicon, a process for forming the same may be a low temperature poly silicon (LTPS) process.

In FIG. 6, the first to sixth transistors STR1, STR2, STR3, STR4, STR5, and STR6 and the driving transistor DTR are formed of P-type MOSFETs, but are not limited thereto, and may be formed of N-type MOSFETs.

Furthermore, a first power voltage of the first power line ELVDL, a second power voltage of the second power line ELVSL, and a third power voltage of a third power line VIL may be set in consideration of characteristics of the driving transistor DTR, characteristics of the light-emitting element LE, etc.

Referring to FIG. 7, the pixel circuit PXC according to one or more embodiments of the present disclosure is different from that according to the embodiment of FIG. 6 in that the driving transistor DTR, the second transistor STR2, the fourth transistor STR4, the fifth transistor STR5, and the sixth transistor STR6 are formed of P-type MOSFETs, and the first transistor STR1 and the third transistor STR3 are formed of N-type MOSFETs.

The active layer of each of the driving transistor DTR, the second transistor STR2, the fourth transistor STR4, the fifth transistor STR5, and the sixth transistor STR6, which are formed of P-type MOSFETs, may be formed of poly silicon, and the active layer of each of the first transistor STR1 and the third transistor STR3, which are formed of N-type MOSFETs, may be formed of an oxide semiconductor.

The embodiment of FIG. 7 is different from the embodiment of FIG. 4 in that a gate electrode of the second transistor STR2 and a gate electrode of the fourth transistor STR4 are connected to a write scan line GWL, and the gate electrode of the first transistor STR1 is connected to a control scan line GCL. In FIG. 7, because the first transistor STR1 and the third transistor STR3 are formed of N-type MOSFETs, a scan signal of a gate high voltage may be applied to the control scan line GCL and an initialization scan line GIL. In contrast, because the second transistor STR2, the fourth transistor STR4, the fifth transistor STR5 and the sixth transistor STR6 are formed of P-type MOSFETs, a scan signal of a gate low voltage may be applied to the write scan line GWL and a light-emitting line ELk.

It should be noted that the equivalent circuit view of the pixel according to the above-described embodiment of the present disclosure is not limited to that shown in FIGS. 5 to 7. The equivalent circuit view of the pixel according to embodiments of the present disclosure may be formed in other known circuit structures, which may be adopted by those skilled in the art, in addition to the embodiments shown in FIGS. 5 to 7.

The plurality of pixel electrodes 111 may be disposed on a corresponding pixel circuit PXC. Each of the pixel electrodes 111 may be an exposed electrode exposed from the pixel circuit PXC. Each of the pixel electrodes 111 may be integrally formed with the pixel circuit PXC. Each of the pixel electrodes 111 may be supplied with a pixel voltage or an anode voltage from the pixel circuit PXC. The pixel electrodes 111 may include at least one of gold (Au), copper (Cu), tin (Sn), or silver (Ag). For example, the pixel electrodes 111 may include a 9:1 alloy, an 8:2 alloy or a 7:3 alloy of gold and tin, or may include an alloy (SAC305) of copper, silver and tin.

The common contact electrode 113 may be disposed in the first common voltage supply area CVA1 of the non-display area NDA. The common contact electrode 113 may be disposed on both sides of the display area DA. The common contact electrode 113 may be connected to any one of the first pads PD1 of the first pad area PDA1 through a circuit area formed in the non-display area NDA to receive a common voltage. The common contact electrode 113 may include the same material as that of the pixel electrodes 111. That is, the common contact electrode 113 and the pixel electrodes 111 may be formed by the same process.

Each of the first pads PD1 may be connected to a pad electrode CPD of the circuit board CB through a conductive connection member such as a corresponding wire WR. That is, the first pads PD1, the wires WR, and the pad electrodes CPD of the circuit board CB may be connected to one another in one-to-one correspondence.

The circuit board CB may be a flexible printed circuit board (FPCB), a printed circuit board (PCB), a flexible printed circuit (FPC), or a flexible film such as a chip on film (COF).

Because the second pads PD2 of the second pad area PDA2 may substantially be the same as the first pads PD1 described above, their description will be omitted.

The light-emitting element layer 120 may include light-emitting elements LE, a first insulating layer INS1, a connection electrode 125, an ohmic contact layer 126, a common connection electrode 127, and a first reflective layer RF1.

The light-emitting element layer 120 may include first light emission areas EA1, second light emission areas EA2 and third light emission areas EA3, which correspond to the respective light-emitting elements LE. The light-emitting element LE may be disposed in each of the first light emission areas EA1, the second light emission areas EA2, and the third light emission areas EA3 in one-to-one correspondence.

The light-emitting element LE may be disposed on the pixel electrode 111 in each of the first light emission areas EA1, the second light emission areas EA2, and the third light emission areas EA3. The light-emitting element LE may be a vertical light-emitting diode element longitudinally extended in the third direction DR3. That is, a length of the light-emitting element LE in the third direction DR3 may be longer than that in a horizontal direction. The length of the light-emitting element LE in the horizontal direction indicates a length in the first direction DR1 or a length in the second direction DR2. For example, the length of the light-emitting element LE in the third direction DR3 may be 1 μm to 5 μm, approximately.

The light-emitting element LE may be a micro light-emitting diode element. The light-emitting element LE may include a connection electrode 125, an ohmic contact layer 126, a first semiconductor layer SEM1, an electron blocking layer EBL, an active layer MQW, a superlattice layer SLT, a second semiconductor layer SEM2, and a third semiconductor layer SEM3, disposed sequentially along the third direction DR3 as shown in FIG. 11. For example, the connection electrode 125, the ohmic contact layer 126, the first semiconductor layer SEM1, the electron blocking layer EBL, the active layer MQW, the superlattice layer SLT, the second semiconductor layer SEM2, and the third semiconductor layer SEM3 may be sequentially deposited along the third direction DR3.

As shown in FIG. 11, the light-emitting element LE may have a cylindrical shape, a disk shape, or a rod shape, which has a width greater than a height, but is not limited thereto. The light-emitting element LE may have a shape, such as a rod, a wire and, a tube, and a polygonal pillar shape such as a cube, a rectangular parallelepiped and a hexagonal pillar, or may have various shapes such as an outer surface shape partially inclined and extended in one direction.

The connection electrode 125 may be disposed on the pixel electrode 111. The connection electrode 125 may be bonded to the pixel electrode 111 to apply a light-emitting signal to the light-emitting element LE. The light-emitting element LE may include at least one connection electrode 125. In FIG. 11, the light-emitting element LE includes one connection electrode 125, but is not limited thereto. As the case may be, the light-emitting element LE may include a larger number of connection electrodes 125, or may be omitted. The following description of the light-emitting element LE may be equally applied to even the case that the number of connection electrodes 125 is varied or another structure is further included in the light-emitting element LE.

The connection electrode 125 may reduce resistance between the light-emitting element LE and the pixel electrode 111 when the light-emitting element LE is electrically connected to the pixel electrode 111 in the display panel 100 according to one or more embodiments. The connection electrode 125 may include a conductive metal. For example, the connection electrode 125 may include at least one of gold (Au), copper (Cu), tin (Sn), titanium (Ti), aluminum (Al), or silver (Ag). For example, the connection electrode 125 may include a 9:1 alloy, an 8:2 alloy or a 7:3 alloy of gold and tin, or may include an alloy (SAC305) of copper, silver and tin.

The ohmic contact layer 126 may be disposed on the connection electrode 125. The ohmic contact layer 126 may be disposed between the connection electrode 125 and the first semiconductor layer SEM1. The ohmic contact layer 126 may be an ohmic connection electrode, but is not limited thereto. The ohmic contact layer 126 may be a Schottky connection electrode. The ohmic contact layer 126 may include ITO, but is not limited thereto, and may include at least one selected from gold (Au), copper (Cu), tin (Sn), titanium (Ti), aluminum (Al), or silver (Ag), or may be formed in their alloy or their multi-layered structure.

The first semiconductor layer SEM1 may be disposed on the ohmic contact layer 126. The first semiconductor layer SEM1 may be a p-type semiconductor, and may include a semiconductor material having a chemical formula of $Al_xGa_yIn_{1-x-y}N (0 \leq x \leq 1, 0 \leq y \leq 1, 0 \leq x+y \leq 1)$. For example, the first semiconductor layer SEM1 may be any one or more of AlGaInN, GaN, AlGaN, InGaN, AlN and InN, which are doped with p-type dopant. For example, the first semiconductor layer SEM1 may be doped with a p-type dopant, and the p-type dopant may be Mg, Zn, Ca, Se, Ba, or the like. For example, the first semiconductor layer SEM1 may be a p-GaN doped with p-type Mg. A thickness of the first semiconductor layer SEM1 may range from 30 nm to 200 nm, but is not limited thereto.

The electron blocking layer EBL may be disposed on the first semiconductor layer SEM1. The electron blocking layer EBL may be a layer for suppressing or preventing too many electrons from flowing to the active layer MQW. For example, the electron blocking layer EBL may be p-AlGaN doped with p-type Mg. A thickness of the electron blocking layer EBL may range from 10 nm to 50 nm, approximately, but is not limited thereto. In one or more embodiments, the electron blocking layer EBL may be omitted.

The active layer MQW may be disposed on the electron blocking layer EBL. The active layer MQW may emit light by combination of electron-hole pairs in accordance with an electrical signal applied through the first semiconductor layer SEM1 and the second semiconductor layer SEM2. The active layer MQW may emit first light, i.e., light of a blue wavelength band, or second light, i.e., light of a green wavelength band.

The active layer MQW may include a single or multiple quantum well structure material. When the active layer MQW includes a multiple quantum well structure material, a plurality of well layers and a plurality of barrier layers may alternately be deposited. In this case, the well layer may be formed of, but not limited to, InGaN, and the barrier layer may be formed of, but not limited to, GaN or AlGaN. A thickness of the well layer may be 1 nm to 4 nm, approximately, and a thickness of the barrier layer may be 3 nm to 10 nm, approximately.

Alternately, the active layer MQW may have a structure in which semiconductor materials having a high band gap energy and semiconductor materials having a low band gap energy are alternately deposited, and may include different Group III to Group V semiconductor materials depending on a wavelength range of light that is emitted. The light emitted from the active layer MQW is not limited to the first light, and the active layer MQW may emit second light (e.g., light of a green wavelength band) or third light (e.g., light of a red wavelength band) as the case may be. In one or more embodiments, when the semiconductor material included in the active layer MQW is indium, a color of light that is emitted may be varied depending on a content of indium. For example, when the content of indium is about 15%, the active layer MQW may emit light of a blue wavelength band. When the content of indium is about 25%, the active layer MQW may emit light of a green wavelength band. When the content of indium is about 35% or more, the active layer MQW may emit light of a red wavelength band.

The superlattice layer SLT may be disposed on the active layer MQW. The superlattice layer SLT may be a layer for mitigating stress between the second semiconductor layer SEM2 and the active layer MQW. For example, the superlattice layer SLT may be formed of InGaN or GaN. A thickness of the superlattice layer SLT may be 50 nm to 200 nm, approximately. In one or more embodiments, the superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ $(0 \leq x \leq 1, 0 \leq y \leq 1, 0 \leq x+y \leq 1)$. For example, the second semiconductor layer SEM2 may be any one or more of AlGaInN, GaN, AlGaN, InGaN, AlN and InN, which are doped with n-type dopant. For example, the second semiconductor layer SEM2 may be doped with an n-type dopant, and the n-type dopant may be Si, Ge, Sn, or the like. For example, the second semiconductor layer SEM2 may be an n-GaN doped with n-type Si. A thickness of the second semiconductor layer SEM2 may range from 2 μm to 4 μm, but is not limited thereto.

As shown in FIGS. 4 and 8, the second semiconductor layer SEM2 may be a common layer that is commonly connected to the plurality of light-emitting elements LE. At least a portion of the second semiconductor layer SEM2 may be disposed in each of the light-emitting elements LE in the third direction DR3 to form a patterned shape, and the other portion of the second semiconductor layer SEM2 may continuously be extended in the first direction DR1 and commonly disposed in the plurality of light-emitting elements LE. The second semiconductor layer SEM2 allows the common voltage applied through the common contact electrode 113 to be commonly applied to the plurality of light-emitting elements LE.

The third semiconductor layer SEM3, which will be described later, is disposed as a common layer together with the second semiconductor layer SEM2, but does not have conductivity, whereby a signal may be applied through the second semiconductor layer SEM2 having conductivity. The second semiconductor layer SEM2 and the third semiconductor layer SEM3 may be extended from the display area DA to the non-display area NDA. A thickness T1 of an area of the second semiconductor layer SEM2, which is overlapped with the first semiconductor layer SEM1 of the light-emitting element LE, may be greater than a thickness T2 of an area of the second semiconductor layer SEM2, which is not overlapped with the first semiconductor layer SEM1.

The third semiconductor layer SEM3 may be disposed on the second semiconductor layer SEM2. The third semiconductor layer SEM3 may be an undoped semiconductor. The third semiconductor layer SEM3 may include the same material as that of the second semiconductor SEM2, however, the material of the third semiconductor layer SEM3 may be a material that is not doped with an n-type or p-type dopant. In one or more embodiments, the third semiconductor layer SEM3 may be at least one of InAlGaN, GaN, AlGaN, InGaN, AlN or InN, which is not doped, but is not limited thereto.

The third semiconductor layer SEM3 may be a common layer commonly connected to the plurality of light-emitting elements LE. The third semiconductor layer SEM3 may continuously be extended in the first direction DR1 and commonly disposed in the plurality of light-emitting elements LE. The third semiconductor layer SEM3 may act as a base layer of the plurality of light-emitting elements LE. In the manufacturing process of the light-emitting element layer, which will be described later, layers constituting the light-emitting elements LE are formed on the third semiconductor layer SEM3, whereby the third semiconductor layer SEM3 acts as a base layer.

The common connection electrode 127 may be disposed in the first common voltage supply area CVA1 of the non-display area NDA. The common connection electrode 127 may be disposed on one surface of the second semiconductor layer SEM2. The common connection electrode 127 may serve to transfer a common voltage signal of the light-emitting elements LE from the common contact electrode 113. The common connection electrode 127 may be made of the same material as that of the connection electrodes 125. For connection with the common contact electrode 113, the common connection electrode 127 may be formed to be thick in the third direction DR3.

The light-emitting elements LE may receive a pixel voltage or an anode voltage of the pixel electrode 111 through the connection electrode 125, and may receive a common voltage through the second semiconductor layer SEM2. The light-emitting element LE may emit light (e.g., light with a predetermined luminance) in accordance with a voltage difference between the pixel voltage and the common voltage.

The first insulating layer INS1 may be disposed on a side and an upper surface of the second semiconductor layer SEM2, sides of each of the light-emitting elements LE, and a side of the ohmic contact layer 126. The first insulating layer INS1 may insulate the second semiconductor layer SEM2, the light-emitting elements LE, and the ohmic contact layer 126 from the other layers.

As shown in FIG. 8, the first insulating layer INS1 may be disposed to be around (or surround) the light-emitting elements LE. The first insulating layer INS1 may include an inorganic insulating material such as silicon oxide (SiOx), silicon nitride (SiNx), silicon oxynitride (SiOxNy), aluminum oxide (AlxOy) and aluminum nitride (AlN). A thickness of the first insulating layer INS1 may be 0.1 μm, approximately, but is not limited thereto.

The first reflective layer RF1 serves to reflect light moving upward and downward in left and right side directions not an upper direction among the light emitted from the light-emitting element LE. The first reflective layer RF1 may be disposed in the display area DA. The first reflective layer RF1 may be disposed in the display area DA to overlap the first light emission area EA1, the second light emission area EA2, and the third light emission area EA3.

The first reflective layer RF1 may be disposed on the sides of the ohmic contact layers 126 and the sides of each of the light-emitting elements LE. The first reflective layer RF1 may be disposed directly on the first insulating layer INS1, and may be disposed on a side of the first insulating layer INS1. The first reflective layer RF1 may be disposed to be spaced from the connection electrode 125 and the light-emitting elements LE.

As shown in FIG. 9, the first reflective layer RF1 may be disposed in the display area DA to surround the light-emitting elements LE. Each of the light-emitting elements LE may be surrounded by the first insulating layer INS1, and the first insulating layer INS1 may be surrounded by the first reflective layer RF1. The first reflective layers RF1 may be disposed to be spaced from each other, and may be disposed to be spaced from another first reflective layers RF1 of the light-emitting elements LE, which are adjacent thereto. That is, the first reflective layers RF1 may be disposed to be spaced from each other in the first direction DR1 and the second direction DR2. The first reflective layer RF1 and the first insulating layer INS1 are shown as having a plane shape of a rectangular closed loop, but are not limited thereto, and may have various shapes depending on the plane shape of the light-emitting element LE.

The first reflective layer RF1 may include a metal material having high reflectance, such as aluminum (Al). A thickness of the first reflective layer RF1 may be 0.1 μm, approximately, but is not limited thereto.

Meanwhile, the display panel 100 according to one or more embodiments may include a first light-emitting element LE1, a second light-emitting element LE2, and a third light-emitting element LE3. The first light-emitting element LE1 may emit first light (e.g., blue light), the second light-emitting element LE2 may emit second light (e.g., green light), and the third light-emitting element LE3 may emit the first light. That is, the first light-emitting element LE1 and the third light-emitting element LE3 may emit the same light, i.e., the first light.

When the active layer MQW of each of the light-emitting elements LE1, LE2, and LE3 is made of InGaN and emits red light that is third light, internal quantum efficiency IQE may be deteriorated at a high current density. Therefore, in the present embodiment, instead of forming a light-emitting element for emitting third light, a light-emitting element for emitting first light is formed, and a wavelength conversion member 130 for converting the first light into the third light is provided on the light-emitting element, whereby efficiency of the third light may be increased.

According to one or more embodiments, the wavelength conversion member 130 may be disposed on the light-emitting element layer 120. The wavelength conversion member 130 may include a wavelength conversion layer QDL and a color filter CF.

The wavelength conversion member 130 may be disposed in a first opening OP1 formed in the second semiconductor layer SEM2 and the third semiconductor layer SEM3 of the light-emitting element layer 120. The first opening OP1 may be disposed to overlap the third light emission area EA3, and thus may correspond to the third light emission area EA3.

Also, the first opening OP1 may overlap the third light-emitting element LE3, and may not overlap the first light-emitting element LE1 and the second light-emitting element LE2.

The first opening OP1 may be formed in a shape that passes through the third semiconductor layer SEM3 and allows at least a portion of the second semiconductor layer SEM2 to be recessed. The first opening OP1 may serve to provide a space for forming the wavelength conversion layer QDL and the color filter CF, which will be described later. To this end, the first opening OP1 may have a suitable depth (e.g., a set or predetermined depth). For example, the first opening OP1 may range from 1 μm to 10 μm, but is not limited thereto. In one or more embodiments, the depth of the first opening OP1 may be smaller than a sum of the thickness of the third semiconductor layer SEM3 and the thickness of the second semiconductor layer SEM2.

As shown in FIG. 10, a plane shape of the first opening OP1 may be a circular shape, but is not limited thereto. The plane shape of the first opening OP1 may follow (or correspond to) the plane shape of the light emitting element LE. For example, the plane shape of the first opening OP1 may be a polygonal shape such as a triangular shape, a rectangular shape and a pentagonal shape.

The wavelength conversion layer QDL may be disposed in the first opening OP1. The wavelength conversion layer QDL may emit light by converting or shifting a peak wavelength of incident light into light of another specific peak wavelength. The wavelength conversion layer QDL may convert the first light of a blue color, which is emitted from the third light-emitting element LE3, into the third light of a red color.

The wavelength conversion layer QDL may be disposed to overlap the third light-emitting element LE3 and the color filter CF in the third direction DR3. The wavelength conversion layer QDL may include a first base resin BRS1, first wavelength conversion particles WCP1, and first scatterers SCP1.

The first base resin BRS1 may include a light-transmissive organic material. The first base resin BRS1 may include an epoxy resin, an acrylic resin, a cardo resin or an imide resin.

The first wavelength conversion particles WCP1 may convert the first light incident from the third light-emitting element LE3 into the third light. For example, the first wavelength conversion particles WCP1 may convert light of a blue wavelength band into light of a red wavelength band. The first wavelength conversion particles WCP1 may be quantum dots (QD), quantum rods, fluorescent materials, or phosphor materials. For example, the quantum dots may be granular materials for allowing electrons to emit a specific color when the electrons are transited from a conduction band to a valence band.

The quantum dots may be semiconductor nano-crystal materials. The quantum dots may have a specific band gap in accordance with their composition and size, and thus may emit light having a unique wavelength after absorbing light. Examples of the semiconductor nano-crystals of the quantum dots may include Group-IV nano-crystal, Group II-VI compound nano-crystal, Group III-V compound nano-crystal, Group IV-VI nano-crystal or their combination.

The Group II-VI compound may be selected from a group made of two-element compounds selected from a group of CdSe, CdTe, ZnS, ZnSe, ZnTe, ZnO, HgS, HgSe, HgTe, MgSe, MgS and their mixture; three-element compounds selected from a group of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and their mixture; and four-element compounds selected from a group of HgZnTeS, CdZnSeS, CdZnSeTe, CdZnSTe, CdHgSeS, CdHgSeTe, CdHgSTe, HgZnSeS, HgZnSeTe, HgZnSTe and their mixture.

The Group III-V compound may be selected from a group made of two-element compounds selected from a group of GaN, GaP, GaAs, GaSb, AlN, AlP, AlAs, AlSb, InN, InP, InAs, InSb and their mixture; three-element compounds selected from a group of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and their mixture; and four-element compounds selected from a group of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and their mixture.

The Group IV-VI compound may be selected from a group made of two-element compounds selected from a group of SnS, SnSe, SnTe, PbS, PbSe, PbTe and their mixture; three-element compounds selected from a group of SnSeS, SnSeTe, SnSTe, PbSeS, PbSeTe, PbSTe, SnPbS, SnPbSe, SnPbTe and their mixture; and four-element compounds selected from a group of SnPbSSe, SnPbSeTe, SnPbSTe and their mixture. Group IV element may be selected from a group of Si, Ge and their mixture. Group IV compound may be a two-element compound selected from a group of SiC, SiGe and their mixture.

At this time, the two-element compounds, the three-element compounds or the four-element compounds may exist in particles at a uniform concentration, or may exist in the same particle by being divided into states having partially different concentration distributions. Also, the two-element compounds, the three-element compounds or the four-element compounds may have a core/shell structure in which one quantum dot surrounds another quantum dot. An interface of the core and the shell may have a concentration gradient in which a concentration of an element existing in the shell is lowered toward the center.

In one or more embodiments, the quantum dot may have a core-shell structure that includes a core having the aforementioned nano-crystal and a shell surrounding the core. The shell of the quantum dot may serve as a passivation layer for maintaining semiconductor characteristics by preventing chemical denaturation of the core from occurring, and may also serve as a charging layer for giving electrophoresis characteristics to the quantum dot. The shell may be a single layer or multiple layers. Examples of the shell of the quantum dot may include an oxide of metal or non-metal, a semiconductor compound, or their combination.

For example, examples of the oxide of metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO or a three-element compound such as $MgAl_2O_4$, $CoFe_2O_4$, $NiFe_2O_4$, and $CoMn_2O_4$, but the present disclosure is not limited thereto.

Also, examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the present disclosure is not limited thereto.

The first scatterers SCP1 may have a refractive index different from that of the first base resin BRS1, and may form an optical interface with the first base resin BRS1. For example, the first scatterers SCP1 may be light-scattering particles. The first scatterers SCP1 may include a material, which may scatter at least a portion of transmissive light, without special limitation. For example, the first scatterers SCP1 may be metal oxide particles or organic particles. An example of the metal oxide may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). A material of the organic particles may include an acrylic resin or a urethane-based resin. The first scatterers SCP1 may scatter light in a random direction regardless of an incident direction of incident light without substantially converting a wavelength of light.

The wavelength conversion layer QDL increases the content of the first wavelength conversion particles WCP1 included in the wavelength conversion layer QDL as its thickness is increased in the third direction DR3, whereby light conversion efficiency of the wavelength conversion layer QDL may be increased. Therefore, it is desirable that the thickness of the wavelength conversion layer QDL is set in consideration of light conversion efficiency of the wavelength conversion layer QDL.

To this end, the depth of the first opening OP1 in which the wavelength conversion layer QDL is disposed may range from 1 μm to 10 μm. In this case, a bottom surface of the first opening OP1 may be spaced from the first insulating layer INS1 in the third direction DR3. A distance between the bottom surface of the first opening OP1 and the first insulating layer INS1 may be at least 1 μm.

The color filter CF may be disposed on the wavelength conversion layer QDL. The color filter CF may be disposed to overlap the third light emission area EA3. Also, the color filter CF may be disposed to overlap the first opening OP1. The color filter CF may transmit the third light and absorb or shield the first light and the second light. For example, the color filter CF may transmit light of a red wavelength band and absorb or shield light of a blue wavelength band, a green wavelength band, etc.

A lower surface of the color filter CF may be matched (or at the same level) with an upper surface of the third semiconductor layer SEM3. The color filter CF may be disposed on the wavelength conversion layer QDL filled in the first opening OP1, and the interface between the color filter CF and the wavelength conversion layer QDL may be matched (or at the same level) with the upper surface of the third semiconductor layer SEM3.

In the wavelength conversion member 130 described above, the first light emitted from the third light-emitting element LE3 may be converted into the third light in the wavelength conversion layer QDL. The first light that is not partially converted and the converted third light may coexist in the wavelength conversion layer QDL. In this case, the color filter CF may transmit only the third light, whereby the third light of a red color, of which color shift is avoided, may be emitted from the third light emission area EA3. Therefore, the light emitted from the display panel 100 may implement a full color in such a manner that the first light is emitted from the first light emission area EA1, the second light is emitted from the second light emission area EA2 and the third light is emitted from the third light emission area EA3, respectively.

In one or more embodiments, a filler NCP may be disposed between the semiconductor circuit board 110 and the light-emitting element layer 120. The filler NCP may serve to bond the semiconductor circuit board 110 and the light-emitting element layer 120 with each other. The filler NCP may be disposed to be filled between the semiconductor circuit board 110 and the light-emitting element layer 120. The filler NCP may include an insulating material, for example, an organic insulating material.

As described above, in the display device according to embodiments of the present disclosure, the opening is formed on the light-emitting element for emitting the first light, and the wavelength conversion member for converting the first light into the third light is formed, whereby the third light may be implemented at a low current density to improve internal quantum efficiency.

Hereinafter, a display panel 100 according to one or more embodiments of the present disclosure will be described with reference to other drawings.

Figure 12:
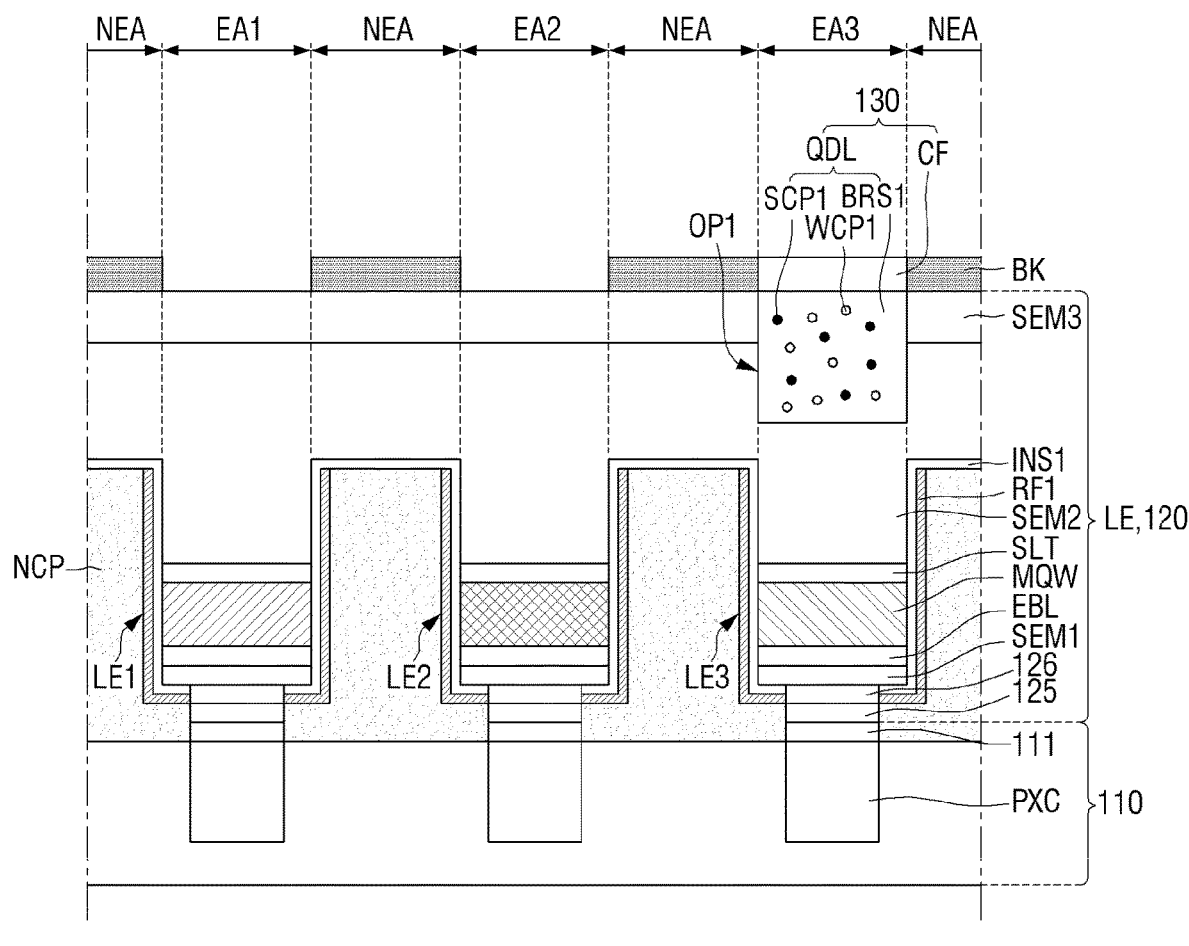
FIG. 12 is a cross-sectional view illustrating a display panel according to one or more embodiments of the present disclosure.
Figure 13:
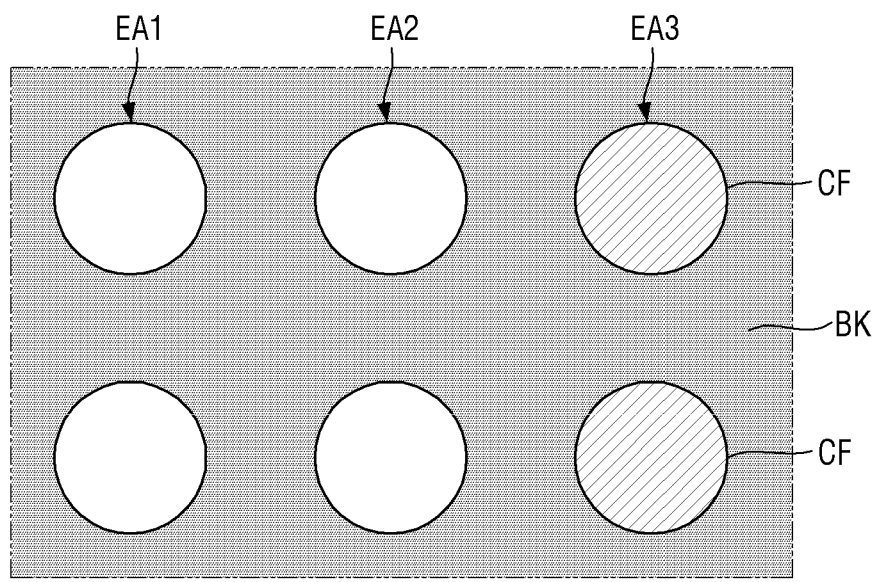
FIG. 13 is a plan view illustrating an example of a light-emitting element layer according to one or more embodiments of the present disclosure.
Figure 13:
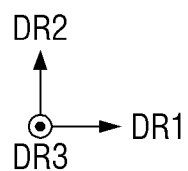

FIG. 12 is a cross-sectional view illustrating a display panel according to another embodiment of the present disclosure. FIG. 13 is a plan view illustrating an example of a light-emitting element layer according to another embodiment of the present disclosure.

Referring to FIGS. 12 and 13, the display panel 100 is different from that of the embodiment of FIGS. 8 to 11 in that a light-shielding member BK is disposed on the third semiconductor layer SEM3. Hereinafter, the same configuration as that of FIGS. 8 to 11 will be described briefly or omitted, and a difference from the embodiment of FIGS. 8 to 11 will be described in detail.

The display panel 100 may include a light-shielding member BK on the third semiconductor layer SEM3. The light-shielding member BK may be disposed on the third semiconductor layer SEM3. The light-shielding member BK may be disposed in the display area DA, and may not overlap the plurality of light emission areas EA1, EA2 and EA3. The light-shielding member BK may not overlap the color filter CF. The light-shielding member BK may be disposed in the non-light emission area NEA, from which light is not emitted, in addition to the plurality of light emission areas EA1, EA2 and EA3. Also, the light-shielding member BK may not overlap the plurality of light-emitting elements LE1, LE2 and LE3 and the first reflective layer RF1.

The light-shielding member BK may shield transmission of light. The light-shielding member BK may prevent a color mixture from occurring due to permeation of light into portions among the first to third light emission areas EA1, EA2, and EA3, thereby improving a color reproduction rate. The light-shielding member BK may be disposed in a shape surrounding the first to third light emission areas EA1, EA2, and EA3 on the plane. The light-shielding member BK may be disposed to be around (or surround) the color filter CF.

The light-shielding member BK may include an organic light-shielding material and a liquid-repellent component. In this case, the liquid-repellent component may be made of a fluoride-containing monomer or a fluoride-containing polymer. In detail, the liquid-repellent component may include a fluoride-containing aliphatic polycarbonate. For example, the light-shielding member BK may be made of a black organic material containing the liquid-repellent component, but is not limited thereto. The light-shielding member BK may be a black matrix BM.

In one or more embodiments, the display panel 100 may include the light-shielding member BK surrounding the plurality of light emission areas EA1, EA2, and EA3 to prevent a color mixture from occurring due to permeation of light into the portions among the first to third light emission areas EA1, EA2, and EA3, thereby improving a color reproduction rate.

Figure 14:
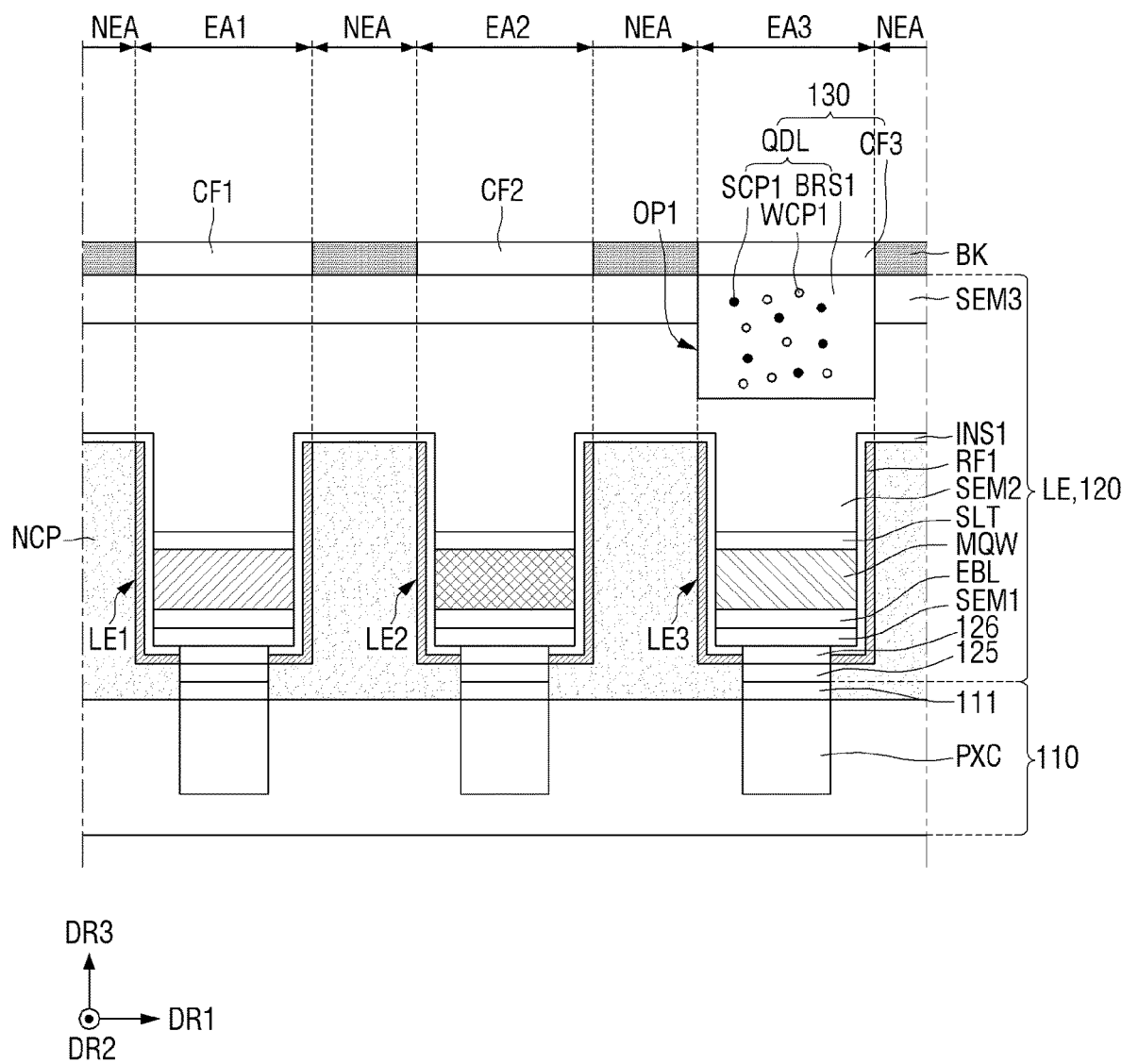
FIG. 14 is a cross-sectional view illustrating a display panel according to one or more embodiments of the present disclosure.

FIG. 14 is a cross-sectional view illustrating a display panel according to one or more embodiments of the present disclosure.

Referring to FIG. 14, the embodiment of FIG. 14 is different from that of the embodiment of FIGS. 12 and 13 in that the wavelength conversion member 130 of the display panel 100 includes a first color filter CF1, a second color filter CF2 and a third color filter CF3. Hereinafter, the same configuration as that of FIGS. 12 and 13 will be described briefly or omitted, and a difference from the embodiment of FIGS. 12 and 13 will be described in detail.

The wavelength conversion member 130 may include a first color filter CF1, a second color filter CF2, and a third color filter CF3.

The first color filter CF1 may be disposed to overlap the first light emission area EA1. Also, the first color filter CF1 may transmit the first light emitted from the first light-emitting element LE1, and may absorb or shield the second light and the third light. For example, the first color filter CF1 may transmit light of a blue wavelength band and absorb or shield light of a green wavelength band, a red wavelength band, etc.

The second color filter CF2 may be disposed to overlap the second light emission area EA2. Also, the second color filter CF2 may transmit the second light, and may absorb or shield the first light and the third light. For example, the second color filter CF2 may transmit light of a green wavelength band and absorb or shield light of a blue wavelength band, a red wavelength band, etc.

The third color filter CF3 may be disposed to overlap the third light emission area EA3. Also, the third color filter CF3 may transmit the third light, and may absorb or shield the first light and the second light. For example, the third color filter CF3 may transmit light of a red wavelength band and absorb or shield light of a blue wavelength band, a green wavelength band, etc.

In the present embodiment, the wavelength conversion member 130 may include the first color filter CF1 overlapped with the first light-emitting element LE1 in the third direction DR3 and the second color filter CF2 overlapped with the second light-emitting element LE2 in the third direction DR3 in addition to the third color filter CF3, thereby preventing color shift of the first light emitted from the first light-emitting element LE1 and color shift of the second light emitted from the second light-emitting element LE2 from occurring.

Figure 15:
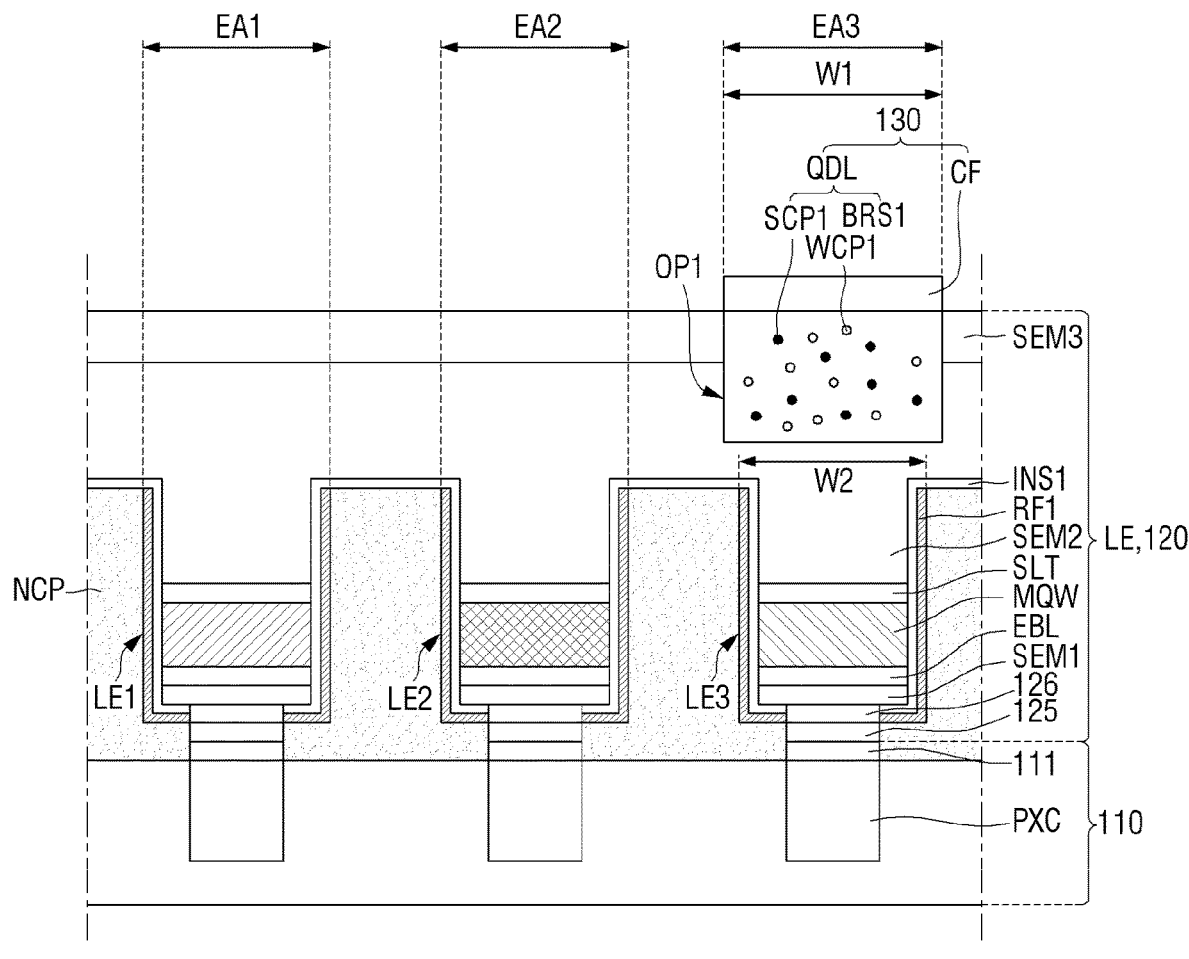
FIG. 15 is a cross-sectional view illustrating a display panel according to one or more embodiments of the present disclosure.
Figure 16:
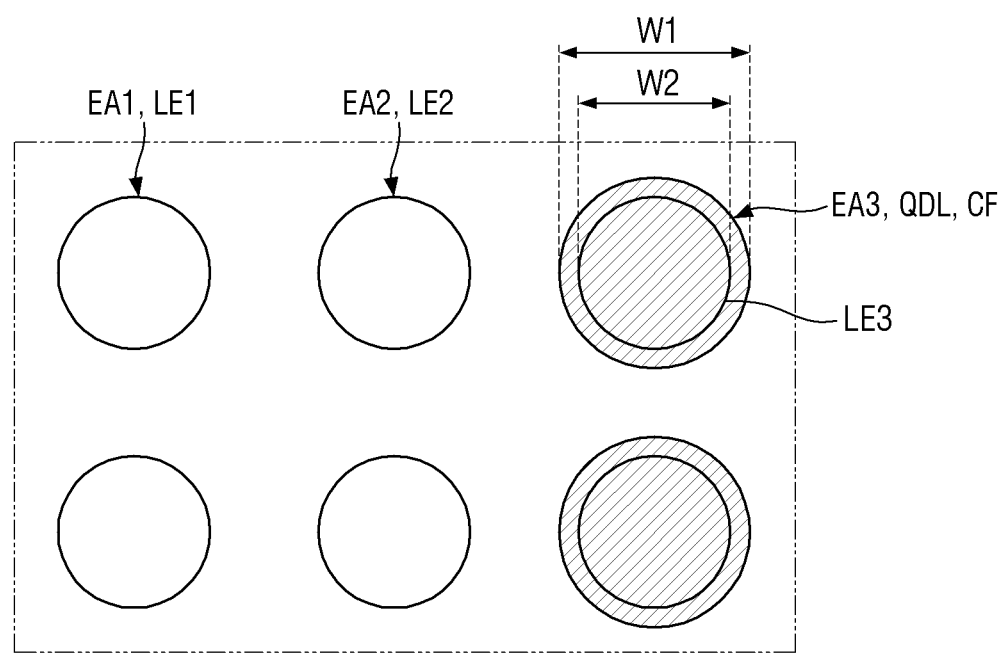
FIG. 16 is a cross-sectional view illustrating a display panel according to one or more embodiments of the present disclosure.

FIG. 15 is a cross-sectional view illustrating a display panel according to one or more embodiments of the present disclosure. FIG. 16 is a cross-sectional view illustrating a display panel according to one or more embodiments of the present disclosure.

Referring to FIGS. 15 and 16, the embodiment of FIGS. 15 and 16 is different from that of the embodiment of FIGS. 8 to 14 in that a width W1 of the first opening OP1 of the display panel 100 is greater than a width W2 of the third light-emitting element LE3. Hereinafter, the same configuration as that of FIGS. 8 to 14 will be described briefly or omitted, and a difference from the embodiment of FIGS. 8 to 14 will be described in detail.

The width W1 of the first opening OP1 may be greater than the width W2 of the third light-emitting element LE3. In a space between the first opening OP1 and the third light-emitting element LE3, light emitted from the active layer MQW of the third light-emitting element LE3 may laterally leak. Therefore, in the present embodiment, the width W1 of the first opening OP1 may be greater than the width W2 of the third light-emitting element LE3, whereby the first light that laterally leaks may be converted into the third light by the wavelength conversion layer QDL and then emitted. Therefore, light extraction efficiency may be improved.

As the width W1 of the first opening OP1 is increased, a plane size of the third light emission area EA3 may also be greater than that of the third light-emitting element LE3. As the plane size of the third light emission area EA3 is increased, emission efficiency of the third light may be improved.

Figure 17:
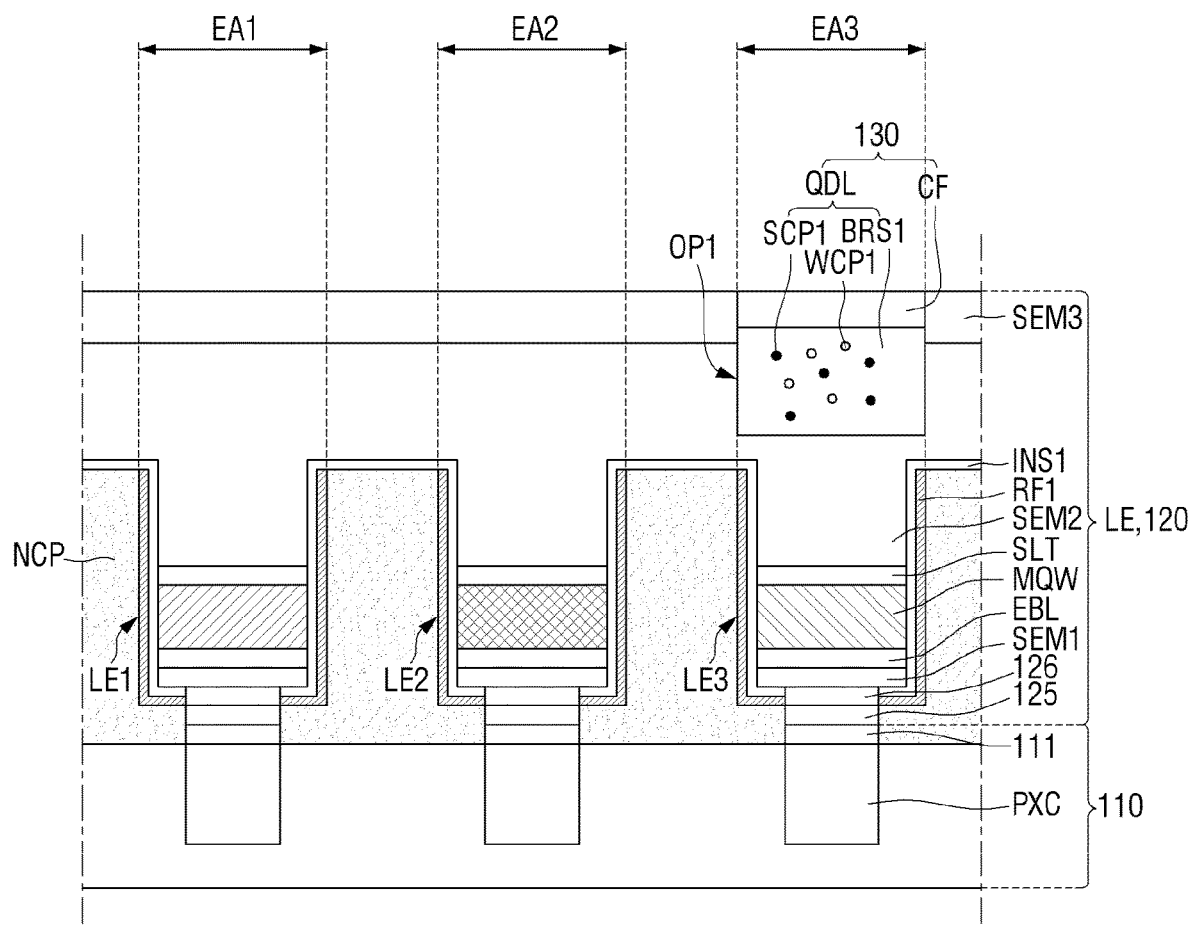
FIG. 17 is a cross-sectional view illustrating a display panel according to one or more embodiments of the present disclosure.

FIG. 17 is a cross-sectional view illustrating a display panel according to one or more embodiments of the present disclosure.

Referring to FIG. 17, the embodiment of FIG. 17 is different from that of the embodiment of FIGS. 8 to 16 in that the color filter CF of the display panel 100 is disposed in the first opening OP1. Hereinafter, the same configuration as that of FIGS. 8 to 16 will be described briefly or omitted, and a difference from the embodiment of FIGS. 8 to 16 will be described in detail.

The first opening OP1 may be formed to have a deep depth unlike the above-described embodiments. Therefore, the color filter CF may be disposed in the first opening OP1.

In detail, the wavelength conversion layer QDL and the color filter CF may be disposed in the first opening OP1. The color filter CF and the wavelength conversion layer QDL may be disposed in the first opening OP1 disposed in the third light emission area EA3. The color filter CF may be in contact with a side of the first opening OP1. An upper surface of the color filter CF may be aligned and matched (or at the same level) with the upper surface of the third semiconductor layer SEM3. A lower surface of the color filter CF may be disposed inside the third semiconductor layer SEM3, and the interface between the color filter CF and the wavelength conversion layer QDL may also be disposed inside the third semiconductor layer SEM3.

In one or more embodiments, the first opening OP1 may be formed to be deep so that the color filter CF and the wavelength conversion layer QDL may be formed in the first opening OP1, whereby the color filter CF and the wavelength conversion layer QDL may easily be aligned. The thickness of the wavelength conversion layer QDL may be increased to improve optical conversion efficiency.

Figure 18:
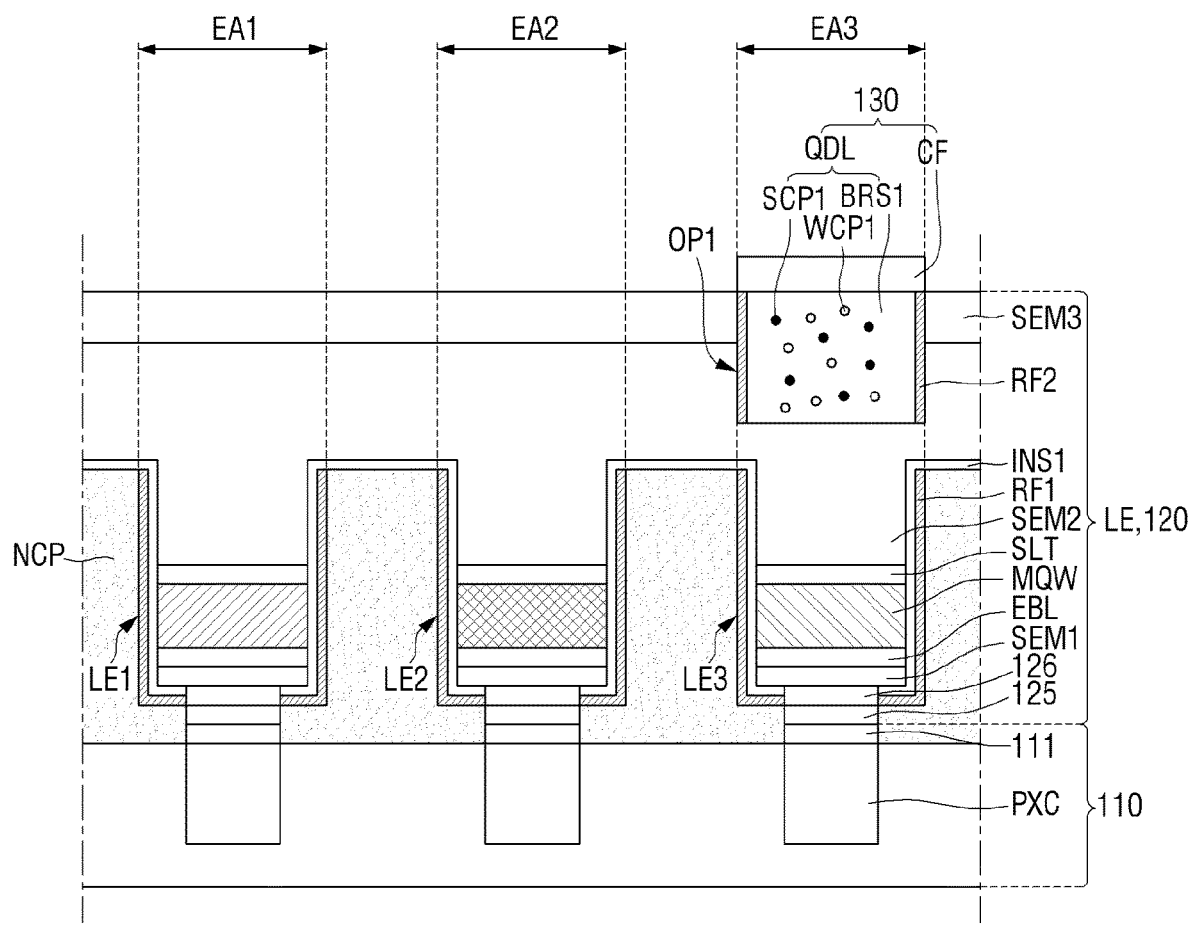
FIG. 18 is a cross-sectional view illustrating a display panel according to one or more embodiments of the present disclosure.

FIG. 18 is a cross-sectional view illustrating a display panel according to one or more embodiments of the present disclosure.

Referring to FIG. 18, the embodiment of FIG. 18 is different from the embodiment of FIGS. 8 to 17 in that a second reflective layer RF2 is disposed in the first opening OP1. Hereinafter, the same configuration as that of FIGS. 8 to 17 will be described briefly or omitted, and a difference from the embodiment of FIGS. 8 to 17 will be described in detail.

The second reflective layer RF2 may be disposed in the first opening OP1. The second reflective layer RF2 may be disposed on a side surface of the first opening OP1, that is, on each side of the second semiconductor layer SEM2 and the third semiconductor layer SEM3. The second reflective layer RF2 serves to reflect light moving in the left and right side directions not the upper direction among the light emitted from the third light-emitting element LE3. The second reflective layer RF2 may be disposed in the display area DA, and may be disposed to overlap the third light emission area EA3.

The second reflective layer RF2 may be disposed to be around (or surround) the wavelength conversion layer QDL in the display area DA. A plane shape of the second reflective layer RF2 may be a circular shape, and may follow a plane shape of the first opening OP1.

The second reflective layer RF2 may include the same material as that of the first reflective layer RF1 described above, and may include a metal material having high reflectance, such as aluminum (Al) but is not limited thereto. The second reflective layer RF2 may be formed of a DBR layer. A thickness of the second reflective layer RF2 may be 0.1 μm, approximately, but is not limited thereto.

The color filter CF may be disposed on the wavelength conversion layer QDL and the second reflective layer RF2, but is not limited thereto. In one or more embodiments, the color filter CF may overlap the wavelength conversion layer QDL, and may not overlap the second reflective layer RF2.

In the present embodiment, the second reflective layer RF2 may be disposed on the side of the first opening OP1 so that the third light converted by the wavelength conversion layer QDL may be prevented from leaking to the side, thereby improving light extraction efficiency.

Figure 19:
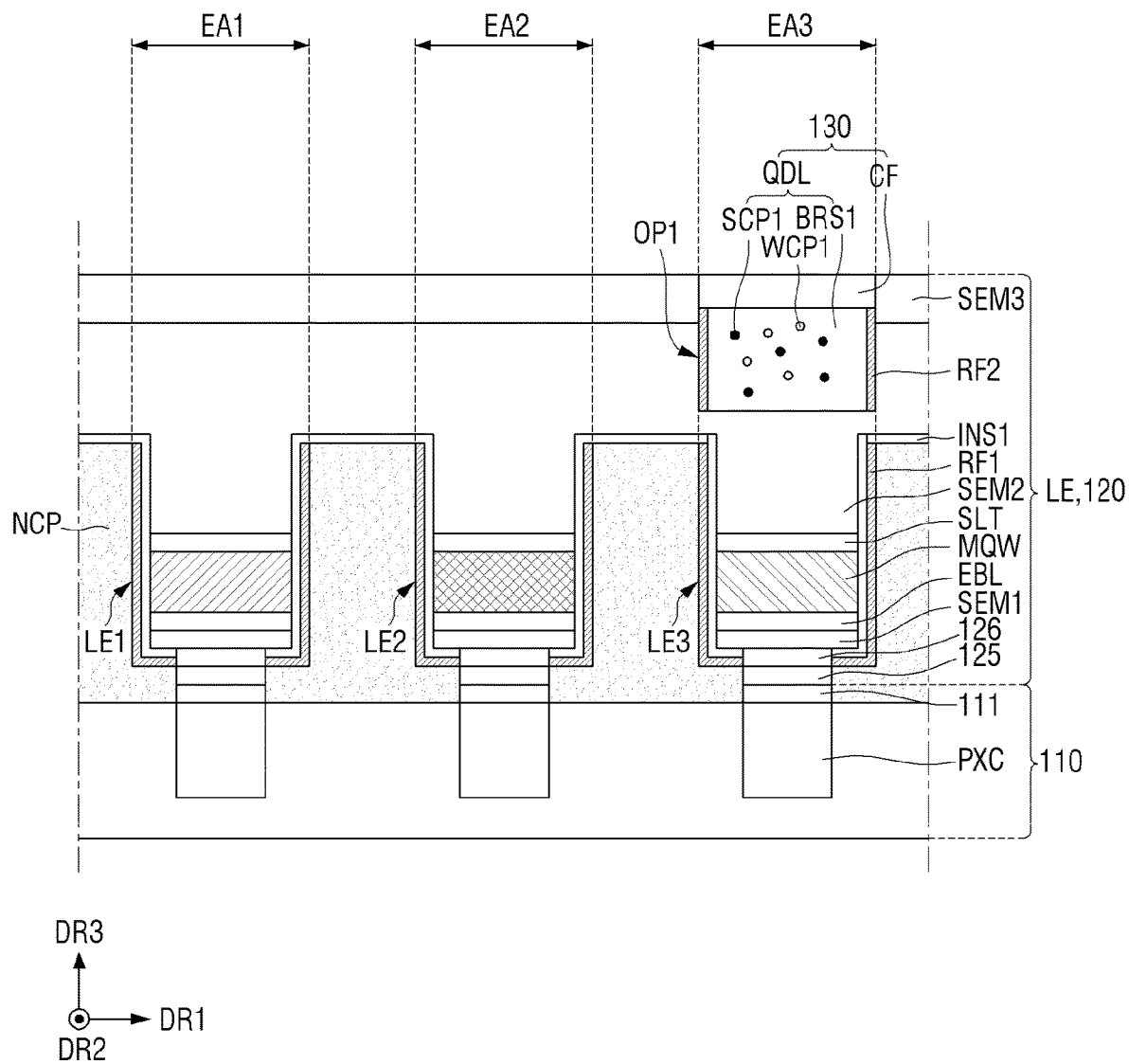
FIG. 19 is a cross-sectional view illustrating a display panel according to one or more embodiments of the present disclosure.

FIG. 19 is a cross-sectional view illustrating a display panel according to one or more embodiments of the present disclosure.

Referring to FIG. 19, the embodiment of FIG. 19 is different from the embodiment of FIG. 18 in that the color filter CF is disposed in the first opening OP1. Hereinafter, the same configuration as that of FIG. 18 will be described briefly or omitted, and a difference from the embodiment of FIG. 18 will be described in detail.

The color filter CF may be disposed in the first opening OP1 in which the second reflective layer RF2 is formed on the side. The side of the color filter CF may be in contact with a side of the second reflective layer RF2. The upper surface of the color filter CF may be aligned and matched (or at the same level) with the upper surface of the third semiconductor layer SEM3.

In the present embodiment, the color filter CF may be disposed in the first opening OP1 to improve extraction efficiency of the third light reflected from the second reflective layer RF2.

Figure 20:
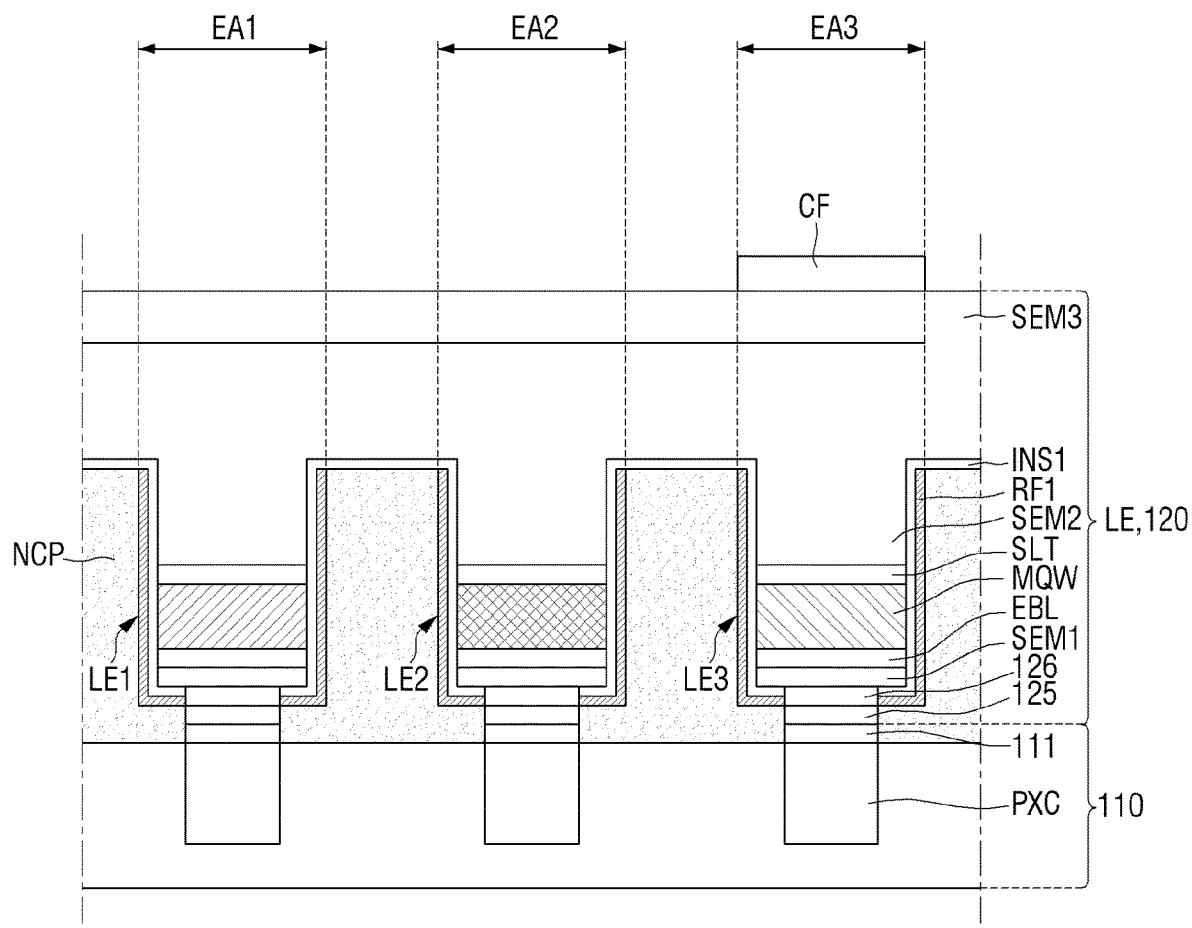
FIG. 20 is a cross-sectional view illustrating a display panel according to one or more embodiments of the present disclosure.

FIG. 20 is a cross-sectional view illustrating a display panel according to one or more embodiments of the present disclosure.

Referring to FIG. 20, the embodiment of FIG. 20 is different from the embodiment of FIGS. 8 to 19 in that the third light-emitting element LE3 emits the third light, the first opening OP1 is omitted, and the color filter CF is disposed on the third semiconductor layer SEM3. Hereinafter, the same configuration as that of FIGS. 8 to 19 will be described briefly or omitted, and a difference from the embodiment of FIGS. 8 to 19 will be described in detail.

In the present embodiment, the third light-emitting element LE3 corresponding to the third light emission area EA3 may emit the third light. The third light may be the light of a red wavelength band. The red wavelength band may be 600 nm to 750 nm, approximately, but the embodiment of the present disclosure is not limited thereto.

The wavelength conversion layer for converting a wavelength of light may be omitted as the third light-emitting element LE3 emits the third light. Therefore, unlike the above-described embodiments, the first opening OP1 may not be provided in the second semiconductor layer SEM2 and the third semiconductor layer SEM3.

The color filter CF may be disposed on the third semiconductor layer SEM3 corresponding to the third light emission area EA3. The color filter CF may be a red color filter that transmits the third light and blocks or absorbs the first light and the second light. The color filter CF may be disposed to overlap with the third light-emitting element LE3.

In the present embodiment, the third light-emitting element LE3 may include the color filter CF for emitting the third light of a red color and transmitting the third light, thereby improving the color shift of the third light.

Figure 21:
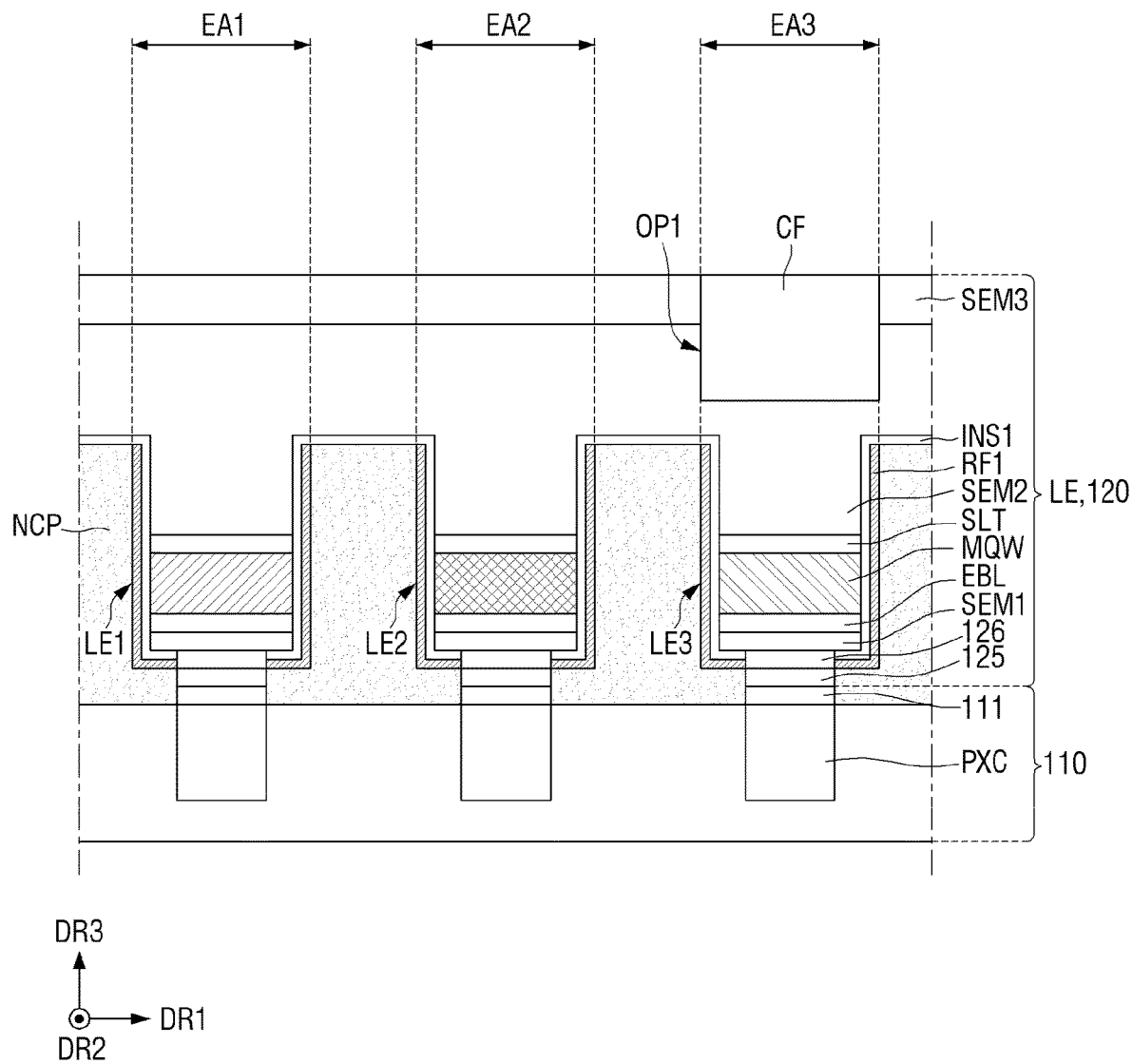
FIG. 21 is a cross-sectional view illustrating a display panel according to one or more embodiments of the present disclosure.

FIG. 21 is a cross-sectional view illustrating a display panel according to one or more embodiments of the present disclosure.

Referring to FIG. 21, the embodiment of FIG. 21 is different from the embodiment of FIG. 20 in that the first opening OP1 is disposed in the second semiconductor layer SEM2 and the third semiconductor layer SEM3, and the color filter CF is disposed in the first opening OP1. Hereinafter, the same configuration as that of FIG. 20 will be described briefly or omitted, and a difference from the embodiment of FIG. 20 will be described in detail.

The third light-emitting element LE3 may emit the third light. The first opening OP1 may be disposed in the second and third semiconductor layers SEM2 and SEM3 that overlap the third light-emitting element LE3 in the third direction DR3. Because the first opening OP1 has been described as above, its description may be omitted.

The color filter CF may be disposed in the first opening OP1. The color filter CF may be in contact with the side of the first opening OP1, that is, the side of the second semiconductor layer SEM2 and the side of the third semiconductor layer SEM3. The upper surface of the color filter CF may be aligned and matched (or at the same level) with the upper surface of the third semiconductor layer SEM3.

The thickness of the color filter CF in the third direction DR3 disposed in the first opening OP1 may be the same as the depth of the first opening OP1. As the thickness of the color filter CF becomes thicker, shielding or absorbing capability of the first light and the second light may be improved to further improve the color shift of the third light.

Figure 22:
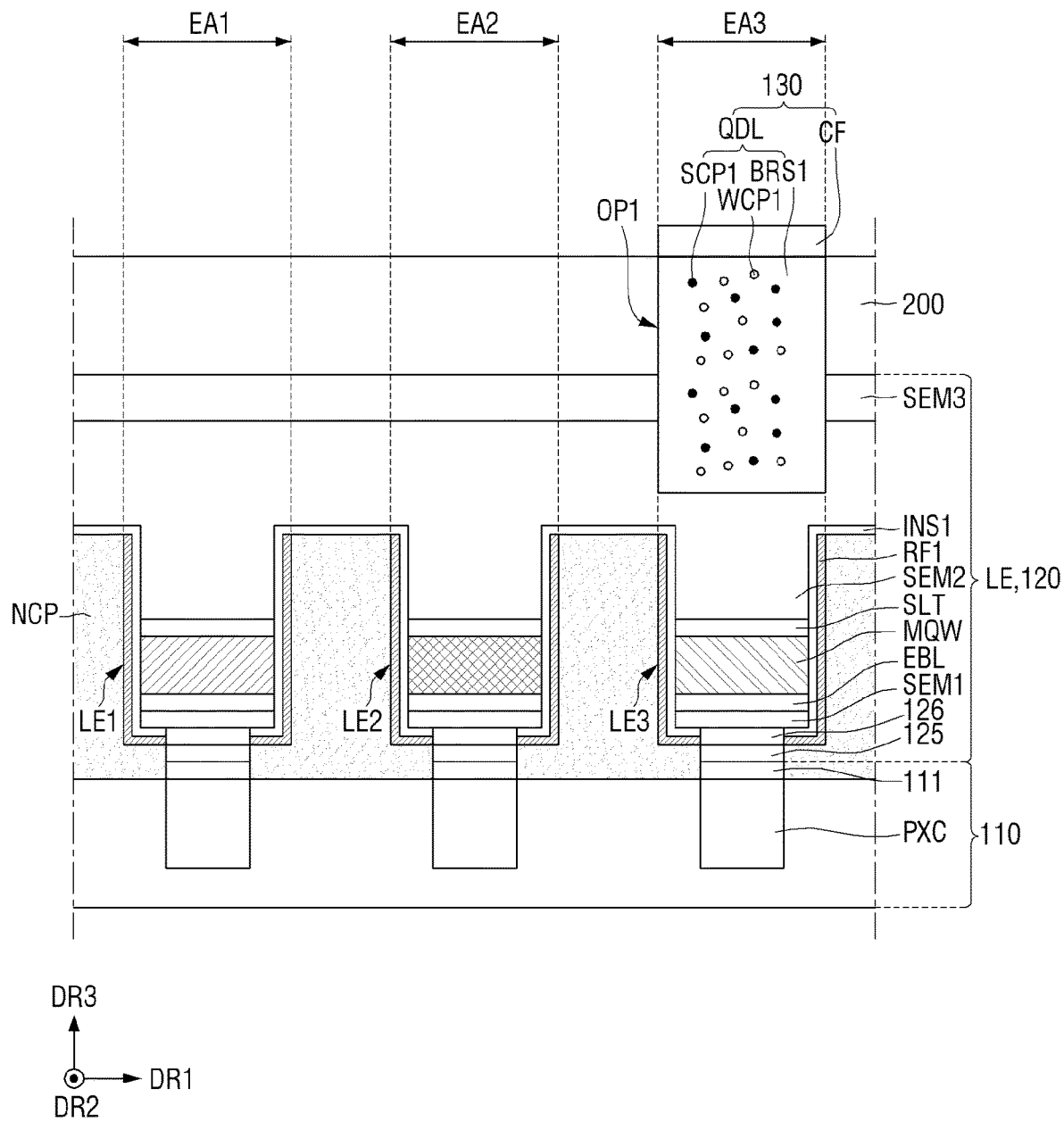
FIG. 22 is a cross-sectional view illustrating a display panel according to one or more embodiments of the present disclosure.

FIG. 22 is a cross-sectional view illustrating a display panel according to one or more embodiments of the present disclosure.

Referring to FIG. 22, the embodiment of FIG. 22 is different from the embodiment of FIGS. 8 to 21 in that the display panel 100 further includes a transparent substrate 200 disposed on the third semiconductor layer SEM3, and the first opening OP1 is disposed in the transparent substrate 200, the third semiconductor layer SEM3, and the second semiconductor layer SEM2. Hereinafter, the same configuration as that of FIGS. 8 to 21 will be described briefly or omitted, and a difference from the embodiment of FIGS. 8 to 21 will be described in detail.

The transparent substrate 200 may be disposed on the third semiconductor layer SEM3. The transparent substrate 200 may be a second substrate opposing (or facing) the semiconductor circuit board 110 that is a first substrate. The transparent substrate 200 may be disposed on the uppermost portion of the light-emitting element layer 120. The transparent substrate 200 may include a substrate having transparency, such as a sapphire substrate ($Al_2O_3$) and glass, but is not limited thereto. The transparent substrate 200 may be formed of a conductive substrate such as GaN, SiC, ZnO, Si, GaP and GaAs. In one or more embodiments, the transparent substrate 200 may be a sapphire substrate ($Al_2O_3$). Although there is no special limitation in a thickness of the transparent substrate 200, the transparent substrate 200 may have a thickness ranging from 400 μm to 1500 μm.

The first opening OP1 may be disposed in the transparent substrate 200, the third semiconductor layer SEM3, and the second semiconductor layer SEM2. In detail, the first opening OP1 may be disposed in a shape that passes through the transparent substrate 200 and the third semiconductor layer SEM3 and allows at least a portion of the second semiconductor layer SEM2 to be recessed.

The wavelength conversion layer QDL may be disposed in the first opening OP1. The wavelength conversion layer QDL may be in contact with a side of the transparent substrate 200, the side of the third semiconductor layer SEM3, and the side of the second semiconductor layer SEM2, respectively. The upper surface of the wavelength conversion layer QDL may be aligned and matched (or at the same level) with the upper surface of the transparent substrate 200.

The color filter CF may be disposed on the wavelength conversion layer QDL disposed in the first opening OP1. The lower surface of the color filter CF may be aligned and matched (or at the same level) with the upper surface of the transparent substrate 200.

As the transparent substrate 200 is very thick as described above, the first opening OP1 may also be formed to be deep. Therefore, the thickness of the wavelength conversion layer QDL disposed in the first opening OP1 may be increased, whereby optical conversion efficiency of converting the first light emitted from the third light-emitting element LE3 into the third light may be improved.

FIGS. 23A to 23E are detailed layout views illustrating one or more example of an area A of FIG. 1. FIG. 24 is a cross-sectional view illustrating an example of a display panel taken along the line C-C' of FIG. 23A.

Figure 23A:
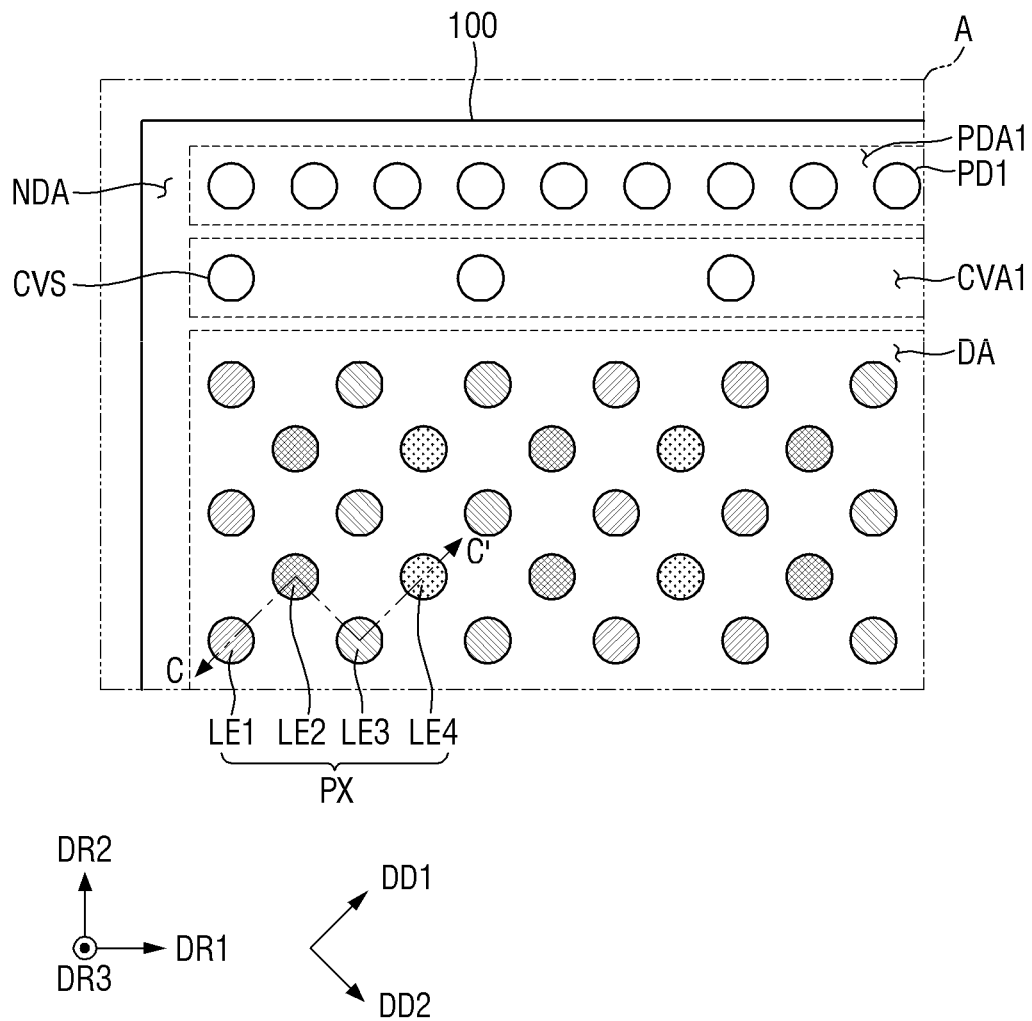
FIGS. 23A to 23E are detailed layout views illustrating one or more example of an area A of FIG. 1.
Figure 23B:
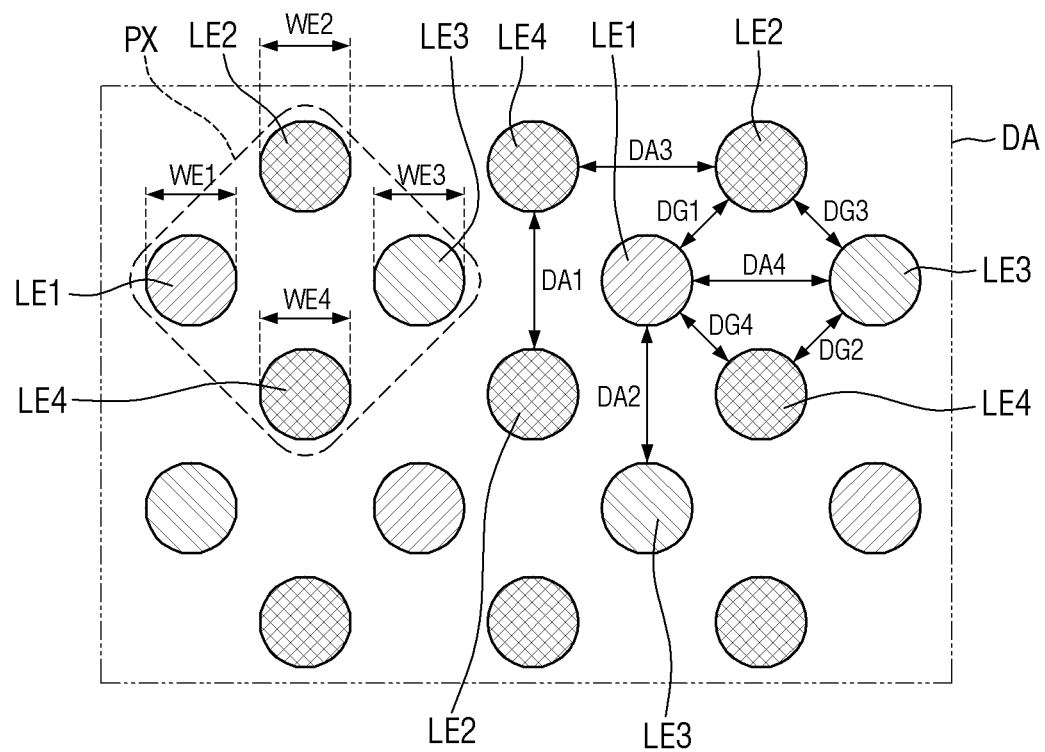
Figure 23B:
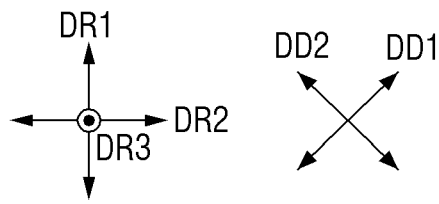
Figure 23C:
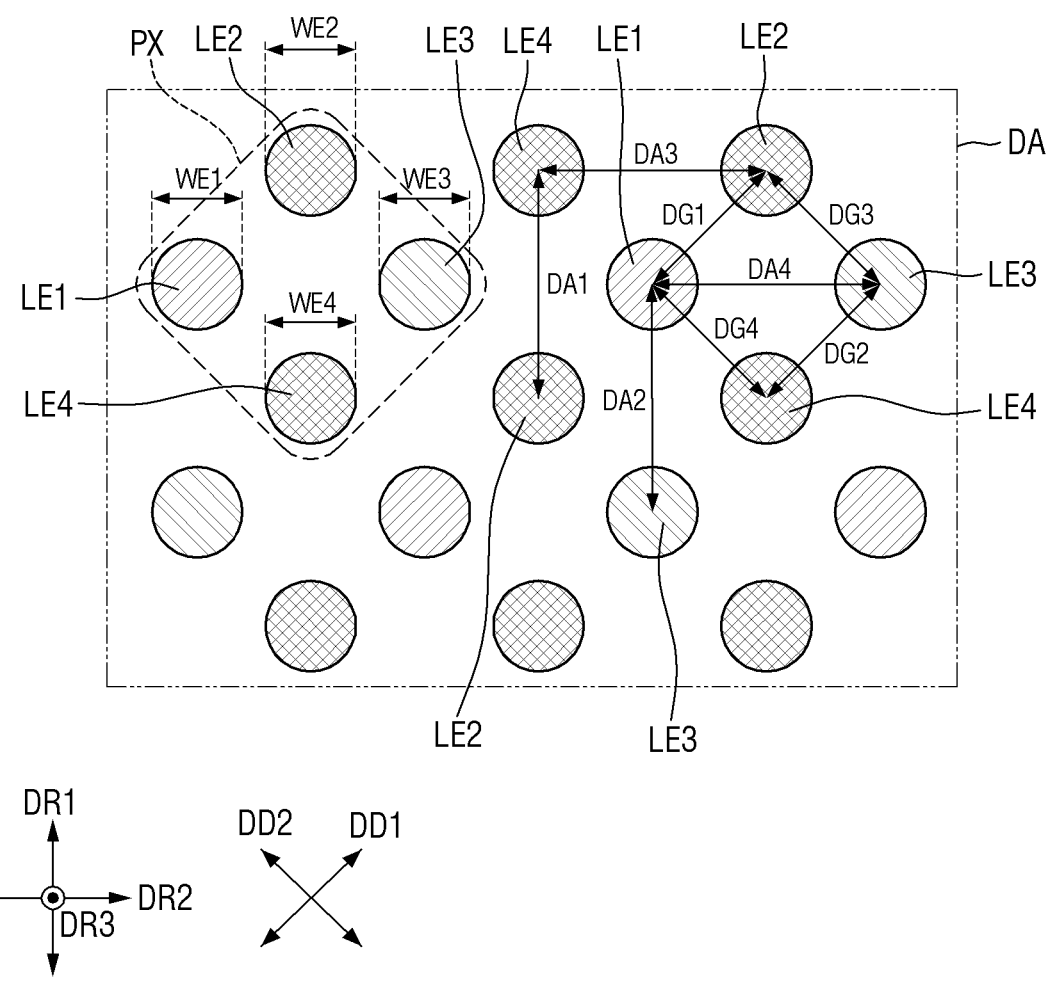
Figure 23D:
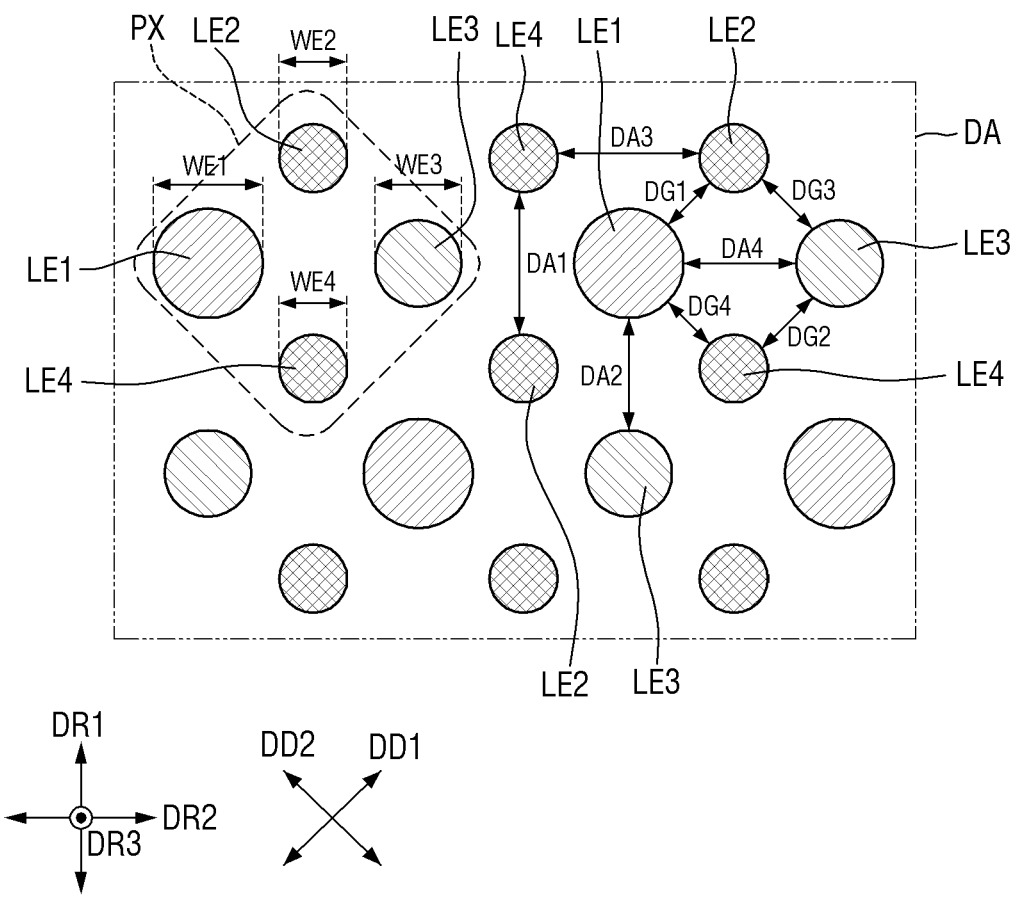
Figure 23E:
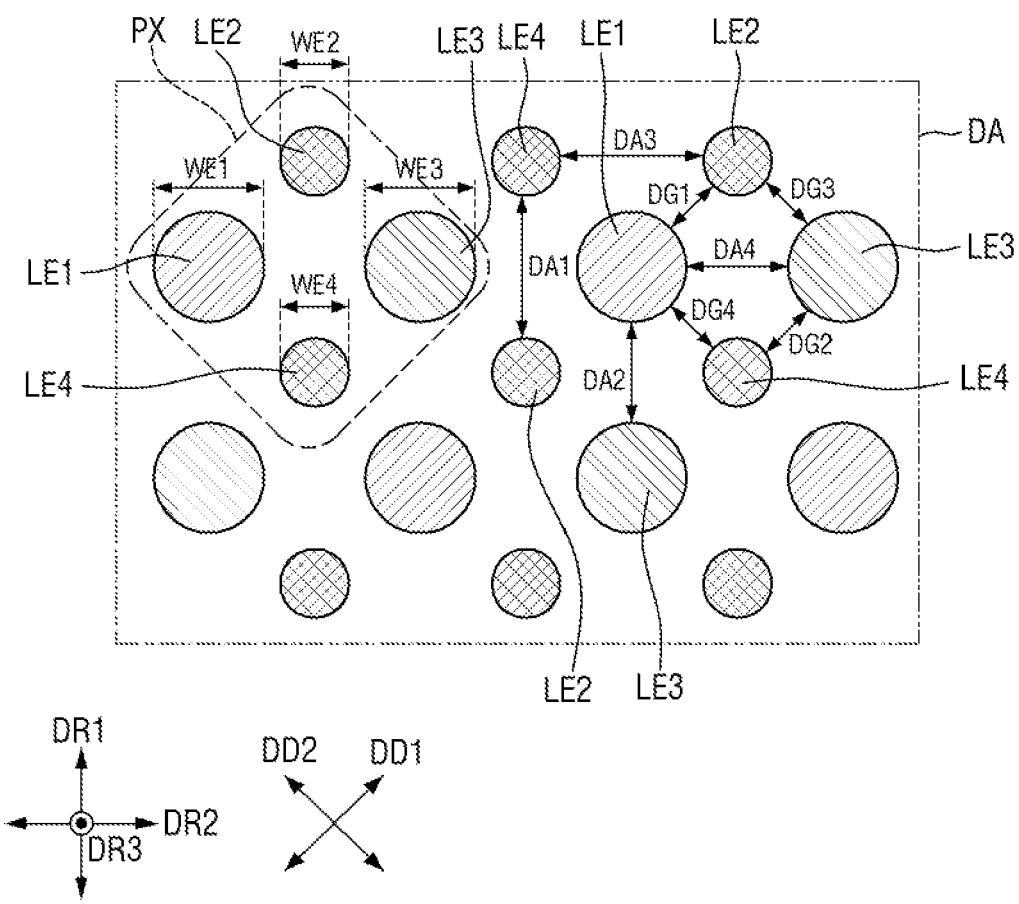
Figure 24:
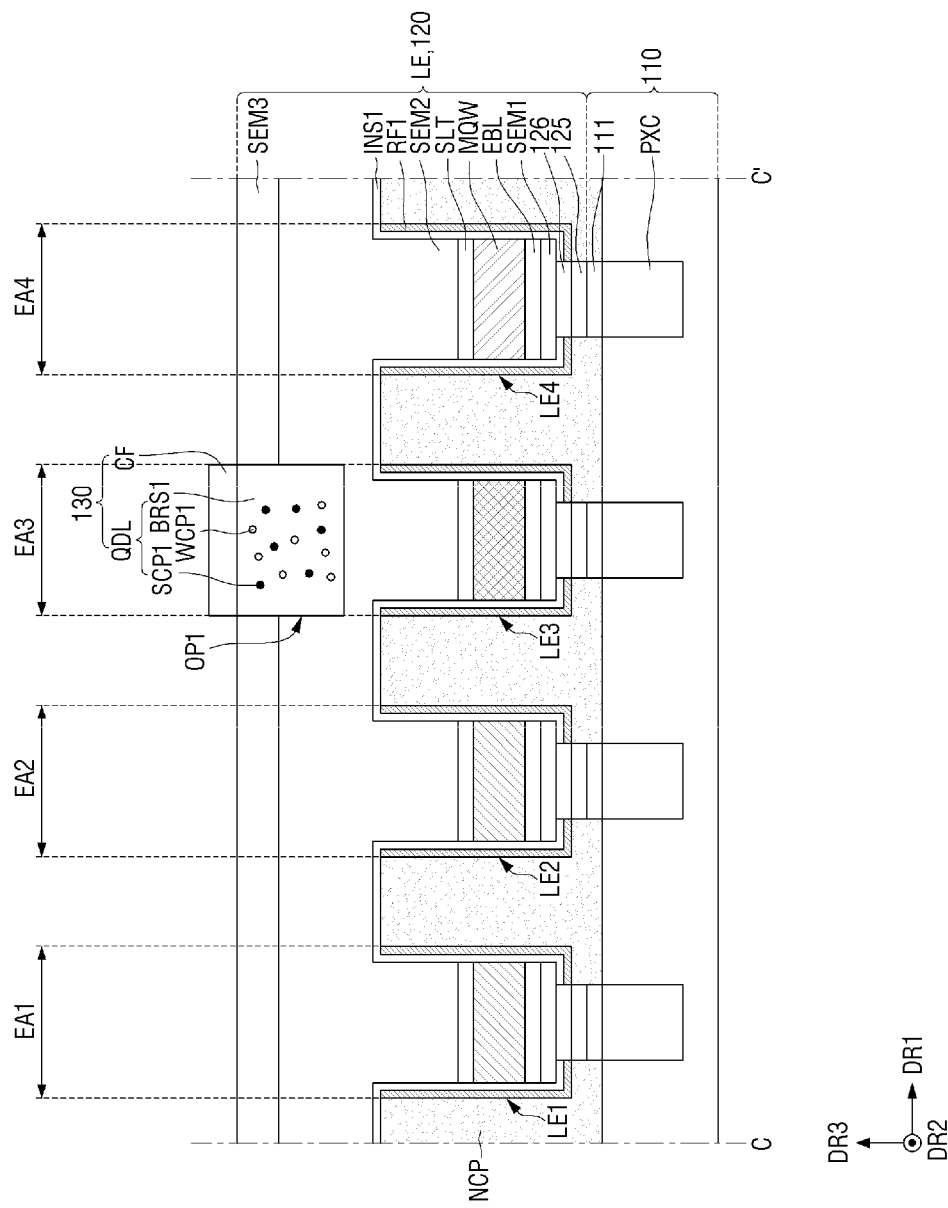
FIG. 24 is a cross-sectional view illustrating an example of a display panel taken along the line C-C' of FIG. 23A.

Referring to FIGS. 23A and 24, the embodiment of FIGS. 23A to 24 is different from the embodiment of FIGS. 2 and 3 in that the display panel further includes a fourth light-emitting element LE4 for emitting the second light the same as that of the second light-emitting element LE2 and each of the light emission areas EA1, EA2, EA3, and EA4 is disposed in a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In FIGS. 23 and 24, the description duplicated with the embodiment of FIGS. 2 and 3 will be omitted.

Referring to FIGS. 23A and 24, each of the plurality of pixels PX may include a first light-emitting element LE1 for emitting the first light, a second light-emitting element LE2 for emitting the second light, a third light-emitting element LE3 for emitting the first light, and a fourth light-emitting element LE4 for emitting the second light.

In the display area DA, the first light-emitting elements LE1 and the third light-emitting elements LE3 may be alternately disposed along the first direction DR1. The second light-emitting elements LE2 and the fourth light-emitting elements LE4 may be alternately disposed along the first direction DR1. The first light-emitting elements LE1, the second light-emitting elements LE2, the third light-emitting elements LE3 and the fourth light-emitting elements LE4 may be alternately disposed along a first diagonal direction DD1 and a second diagonal direction DD2. The first diagonal direction DD1 may be a diagonal direction of the first direction DR1 and the second direction DR2, and the second diagonal direction DD2 may be a direction orthogonal to the first diagonal direction DD1.

In each of the plurality of pixels PX, the first light-emitting element LE1 and the third light-emitting element LE3 may be disposed along the first direction DR1, and the second light-emitting element LE2 and the fourth light-emitting element LE4 may be disposed along the first direction DR1. In each of the plurality of pixels PX, the first light-emitting element LE1 and the second light-emitting element LE2 may be disposed along the first diagonal direction DD1, the second light-emitting element LE2 and the third light-emitting element LE3 may be disposed along the second diagonal direction DD2, and the third light-emitting element LE3 and the fourth light-emitting element LE4 may be disposed along the first diagonal direction DD1.

The fourth light-emitting element LE4 may be substantially the same as the second light-emitting element LE2. That is, the fourth light-emitting element LE4 may emit the second light, and may have the same structure as that of the second light-emitting element LE2.

The first light-emitting element LE1 may be disposed in the first light emission area EA1, the second light-emitting element LE2 may be disposed in the second light emission area EA2, the third light-emitting element LE3 may be disposed in the third light emission area EA3, and the fourth light-emitting element LE4 may be disposed in the fourth light emission area EA4.

A size of the first light emission area EA1, a size of the second light emission area EA2, a size of the third light emission area EA3 and a size of the fourth light emission area EA4 may be substantially the same as one another, but one or more embodiments of the present disclosure are not limited thereto. For example, in one or more embodiments, the size of the first light emission area EA1, the size of the second light emission area EA2, and the size of the third light emission area EA3 may be different from one another, and the size of the second light emission area EA2 may be the same as that of the fourth light emission area EA4.

A distance between the first and second light emission areas EA1 and EA2 that are neighboring to each other, a distance between the second and third light emission areas EA2 and EA3 that are neighboring to each other, a distance between the first and fourth light emission areas EA1 and EA4 that are neighboring to each other (e.g., see FIG. 23A), and a distance between the third and fourth light emission areas EA3 and EA4 that are neighboring to each other may be substantially the same as one another, but one or more embodiments of the present disclosure are not limited thereto. For example, the distance between the first and second light emission areas EA1 and EA2 that are neighboring to each other and the distance between the second and third light emission areas EA2 and EA3 that are neighboring to each other may be different from each other, and the distance between the first and fourth light emission areas EA1 and EA4 that are neighboring to each other (e.g., see FIG. 23A) and the distance between the third and fourth light emission areas EA3 and EA4 that are neighboring to each other may be different from each other. In this case, the distance between the first and second light emission areas EA1 and EA2 that are neighboring to each other and the distance between the first and fourth light emission areas EA1 and EA4 that are neighboring to each other (e.g., see FIG. 23A) may be substantially the same as each other, and the distance between the second and third light emission areas EA2 and EA3 that are neighboring to each other and the distance between the third and fourth light emission areas EA3 and EA4 that are neighboring to each other may substantially be the same as each other.

Referring to FIG. 23B, in a display device 10 according to one embodiment, each of the plurality of pixels PX may include four light-emitting elements LE1, LE2, LE3, and LE4, wherein the plurality of light-emitting elements LE1, LE2, LE3, and LE4 are spaced from one another in the first direction DR1 and the second direction DR2, and the elements most adjacent to each other may be spaced from each other in the diagonal directions DD1 and DD2 between the first direction DR1 and the second direction DR2.

In one or more embodiments, the first light-emitting element LE1, the second light-emitting element LE2, the third light-emitting element LE3, and the fourth light-emitting element LE4 may have the same diameter. For example, a first diameter WE1 of the first light-emitting element LE1, a second diameter WE2 of the second light-emitting element LE2, a third diameter WE3 of the third light-emitting element LE3 and a fourth diameter WE4 of the fourth light-emitting element LE4 may be the same as one another. In the embodiment of FIG. 3, the diameters of the first to third light-emitting elements LE1, LE2, and LE3 may be the same as one another, but are not limited thereto. In one or more embodiments, the diameters of the light-emitting elements LE1, LE2, LE3, and LE4 of FIG. 23B may be different from one another.

Distances DA1 and DA3 between the second and fourth light-emitting elements LE2 and LE4 that are adjacent to each other may be the same as distances DA2 and DA4 between the first and third light-emitting elements LE1 and LE3 that are adjacent to each other. For example, the first distance DA1 between the second and fourth light-emitting elements LE2 and LE4 that are adjacent to each other in the first direction DR1 may be the same as the second distance DA2 between the first and third light-emitting elements LE1 and LE3 that are adjacent to each other in the first direction DR1. The third distance DA3 between the second and fourth light-emitting elements LE2 and LE4 that are adjacent to each other in the second direction DR2 may be the same as the fourth distance DA4 between the first and third light-emitting elements LE1 and LE3 that are adjacent to each other in the second direction DR2. Also, a first diagonal distance DG1 between the first and second light-emitting elements LE1 and LE2 that are adjacent to each other in the first diagonal direction DD1 may be the same as a second diagonal distance DG2 between the third and fourth light-emitting elements LE3 and LE4 that are adjacent to each other in the first diagonal direction DD1. A third diagonal distance DG3 between the second and third light-emitting elements LE2 and LE3 that are adjacent to each other in the second diagonal direction DD2 may be the same as a fourth diagonal distance DG4 between the first and fourth light-emitting elements LE1 and LE4 that are adjacent to each other in the second diagonal direction DD2, but the present disclosure is not limited thereto. The distance between the light-emitting elements LE adjacent to each other may vary depending on the arrangement, diameter, etc. of the light-emitting elements LE.

In FIG. 23B, the distances DA1 to DA4 and DG1 to DG4 among the first to fourth light-emitting elements LE1, LE2, LE3, and LE4 are illustrated based on an outer portion of each of the light-emitting elements LE1, LE2, LE3, and LE4, but the present disclosure is not limited thereto. The distances DA1 to DA4 and DG1 to DG4 among the first to fourth light-emitting elements LE1, LE2, LE3, and LE4 may be shown based on the center of the light-emitting elements LE1, LE2, LE3, and LE4.

Referring to FIG. 23C, the distances DA1 and DA3 between the center of the second light-emitting element LE2 and the center of the fourth light-emitting element LE4, which are adjacent to each other, may be the same as the distances DA2 and DA4 between the center of the first light-emitting element LE1 and the center of the third light-emitting element LE3, which are adjacent to each other. For example, the first distance DA1 between the center of the second light-emitting element LE2 and the center of the fourth light-emitting element LE4, which are adjacent to each other in the first direction DR1, may be the same as the second distance DA2 between the center of the first light-emitting element LE1 and the center of the third light-emitting element LE3, which are adjacent to each other in the first direction DR1. The third distance DA3 between the center of the second light-emitting element LE2 and the center of the fourth light-emitting element LE4, which are adjacent to each other in the second direction DR2, may be the same as the fourth distance DA4 between the center of the first light-emitting element LE1 and the center of the third light-emitting element LE3, which are adjacent to each other in the second direction DR2. Also, the first diagonal distance DG1 between the center of the first light-emitting element LE1 and the center of the second light-emitting element LE2, which are adjacent to each other in the first diagonal direction DD1, may be the same as the second diagonal distance DG2 between the center of the third light-emitting element LE3 and the center of the fourth light-emitting element LE4, which are adjacent to each other in the first diagonal direction DD1. The third diagonal distance DG3 between the center of the second light-emitting element LE2 and the center of the third light-emitting element LE3, which are adjacent to each other in the second diagonal direction DD2, may be the same as the fourth diagonal distance DG4 between the center of the first light-emitting element LE1 and the center of the fourth light-emitting element LE4, which are adjacent to each other in the second diagonal direction DD2.

In the present embodiment, the distances DA1 to DA4 and DG1 to DG4 among the centers of the light-emitting elements LE1, LE2, LE3, and LE4 may be the same as one another, but are not limited thereto. The distances among the centers of the light-emitting elements LE1, LE2, LE3, and LE4 may be modified similarly to those described above with reference to the embodiment of FIG. 23B.

Referring to FIGS. 23D and 23E, in the display device according to one or more embodiments of the present disclosure, the light-emitting elements LE1, LE2, LE3, and LE4 may have their respective sizes different from each other. In the embodiment of FIG. 23D, the first diameter WE1 of the first light-emitting element LE1 may be greater than the diameters WE2, WE3, and WE4 of the second light-emitting element LE2, the third light-emitting element LE3 and the fourth light-emitting element LE4, and the third diameter WE3 of the third light-emitting element LE3 may be greater than the diameters WE2 and WE4 of the second light-emitting element LE2 and the fourth light-emitting element LE4. The second diameter WE2 of the second light-emitting element LE2 may be the same as the fourth diameter WE4 of the fourth light-emitting element LE4. The embodiment of FIG. 23E differs from the embodiment of FIG. 23D in that the first diameter WE1 of the first light-emitting element LE1 is the same as the third diameter WE3 of the third light-emitting element LE3.

In one or more embodiments, the distances among the adjacent light-emitting elements LE may partially be different from one another. For example, the first distance DA1 between the second light-emitting element LE2 and the fourth light-emitting element LE4, which are adjacent to each other in the first direction DR1, may be greater than the second distance DA2 between the first light-emitting element LE1 and the third light-emitting element LE3, which are adjacent to each other in the first direction DR1. The third distance DA3 between the second light-emitting element LE2 and the fourth light-emitting element LE4, which are adjacent to each other in the second direction DR2, may be greater than the fourth distance DA4 between the first light-emitting element LE1 and the third light-emitting element LE3, which are adjacent to each other in the second direction DR2. Also, the first diagonal distance DG1 between the first light-emitting element LE1 and the second light-emitting element LE2, which are adjacent to each other in the first diagonal direction DD1, may be different from the second diagonal distance DG2 between the third light-emitting element LE3 and the fourth light-emitting element LE4, which are adjacent to each other in the first diagonal direction DD1. The third diagonal distance DG3 between the second light-emitting element LE2 and the third light-emitting element LE3, which are adjacent to each other in the second diagonal direction DD2, may be different from the fourth diagonal distance DG4 between the first light-emitting element LE1 and the fourth light-emitting element LE4, which are adjacent to each other in the second diagonal direction DD2.

In the embodiment in which the first diameter WE1 of the first light-emitting element LE1 is greater than the third diameter WE3 of the third light-emitting element LE3 (e.g., see FIG. 23D), the first diagonal distance DG1 may be smaller than the second diagonal distance DG2, and the third diagonal distance DG3 may be greater than the fourth diagonal distance DG4, but the present disclosure is not limited thereto. The distances between the light-emitting elements LE adjacent to each other may vary depending on the arrangement, diameter, etc. of the light-emitting elements LE. For example, in the embodiment in which the first diameter WE1 of the first light-emitting element LE1 is the same as the third diameter WE3 of the third light-emitting element LE3 (e.g., see FIG. 23E), the first diagonal distance DG1 may be the same as the second diagonal distance DG2, and the third diagonal distance DG3 may be the same as the fourth diagonal distance DG4.

Also, although FIGS. 23D and 23E illustrate the distances based on the outer portion of the light-emitting elements LE1, LE2, LE3, and LE4 as the distances DA1 to DA4 and DG1 to DG4 among the light-emitting elements LE1, LE2, LE3, and LE4, the present disclosure is not limited thereto. Similarly to the embodiment of FIG. 23C, the distances among the light-emitting elements LE1, LE2, LE3, and LE4 described in FIGS. 23D and 23E may be equally applied even though the distances among the light-emitting elements LE1, LE2, LE3, and LE4 are compared with one another based on the centers of the light-emitting elements LE1, LE2, LE3, and LE4. However, in the embodiment in which the diameters of the light-emitting elements LE1, LE2, LE3, and LE4 are different from one another, the distances based on the outer portion of the light-emitting elements LE1, LE2, LE3, and LE4 may be different from the distances based on the centers of the light-emitting elements LE1, LE2, LE3, and LE4 in sizes.

Also, the first light emission area EA1 may emit the first light, the second light emission area EA2 and the fourth light emission area EA4 may emit the second light, and the third light emission area EA3 may emit the third light, but one or more embodiments of the present disclosure are not limited thereto. For example, the first light emission area EA1 may emit the first light, the second light emission area EA2 and the fourth light emission area EA4 may emit the third light, and the third light emission area EA3 may emit the second light. Alternatively, the first light emission area EA1 may emit the second light, the second light emission area EA2 and the fourth light emission area EA4 may emit the first light, and the third light emission area EA3 may emit the third light.

In addition, although the first light emission area EA1, the second light emission area EA2, the third light emission area EA3, and the fourth light emission area EA4 may have a circular plane shape, one or more embodiments of the present disclosure are not limited thereto. For example, the first light emission area EA1, the second light emission area EA2, the third light emission area EA3, and the fourth light emission area EA4 may have a polygonal shape, such as a triangular shape, a rectangular shape, a pentagonal shape, a hexagonal shape and an octagonal shape, an oval shape, or an irregular shape.

In the present embodiment, as described above, the third light-emitting element LE3 corresponding to the third light emission area EA3 may emit the first light, and the first opening OP1 overlapped with the third light emission area EA3 may be provided. The wavelength conversion layer QDL may be disposed in the first opening OP1, and the color filter CF may be disposed on the wavelength conversion layer QDL.

The first light emitted from the third light-emitting element LE3 may be converted into the third light in the wavelength conversion layer QDL and the third light may be transmitted in the color filter CF, whereby the third light may be emitted from the third light emission area EA3.

As described above, in the display device according to one or more embodiments of the present disclosure, the opening may be formed on the light-emitting element for emitting the first light, and the wavelength conversion member for converting the first light into the third light may be formed, whereby the third light may be implemented at a low current density to improve internal quantum efficiency.

Also, in the display device according to one or more embodiments of the present disclosure, the opening may be formed to be deep so that the color filter and the wavelength conversion layer may be formed in the opening, whereby the color filter and the wavelength conversion layer may easily be aligned. The thickness of the wavelength conversion layer may be increased to improve optical conversion efficiency.

Also, the display device according to one or more embodiments of the present disclosure may include the light-shielding member around (or surrounding) the light-emission areas to prevent a color mixture from occurring due to permeation of light into the portions between the light emission area, thereby improving a color reproduction rate.

Hereinafter, a manufacturing process of the display device 10 according to one or more embodiments of the present disclosure will be described with reference to other drawings.

Figure 25:
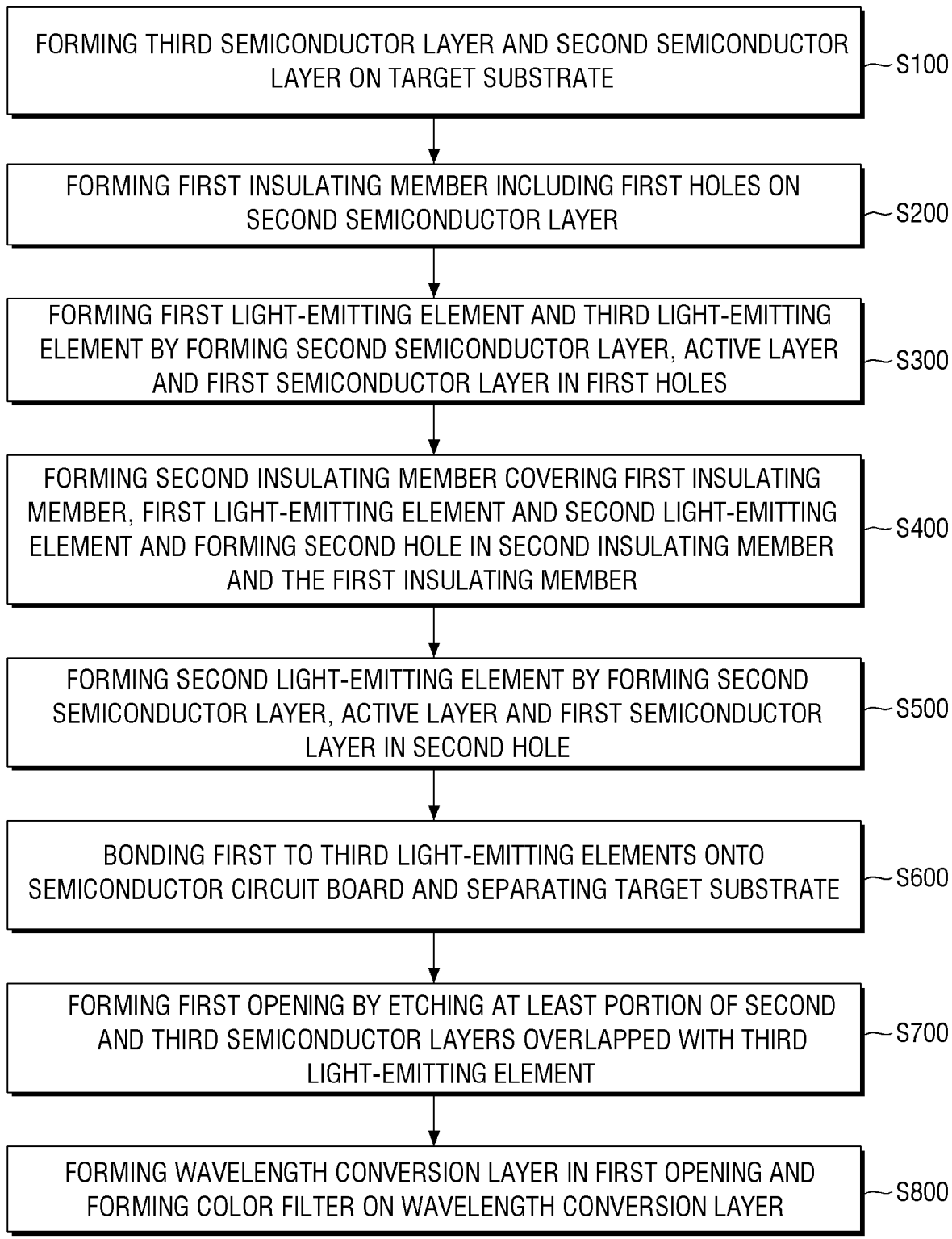
FIG. 25 is a flow chart illustrating a method for manufacturing a display panel according to one or more embodiments of the present disclosure.

FIG. 25 is a flow chart illustrating a method for manufacturing a display panel according to one or more embodiments of the present disclosure. FIGS. 26 to 40 are cross-sectional views illustrating a method for manufacturing a display panel according to one or more embodiments of the present disclosure.

In FIGS. 26 to 40, a structure based on the order of forming the respective layers of the display panel 100 of the display device 10 is shown as a cross-section. In FIGS. 26 to 40, the manufacturing process of the light-emitting element layer 120 and the wavelength conversion member 130 is mainly shown, which may correspond to the cross-sectional view of FIG. 8. Hereinafter, a method for manufacturing the display panel shown in FIGS. 26 to 40 will be described in conjunction with FIG. 25.

Figure 26:
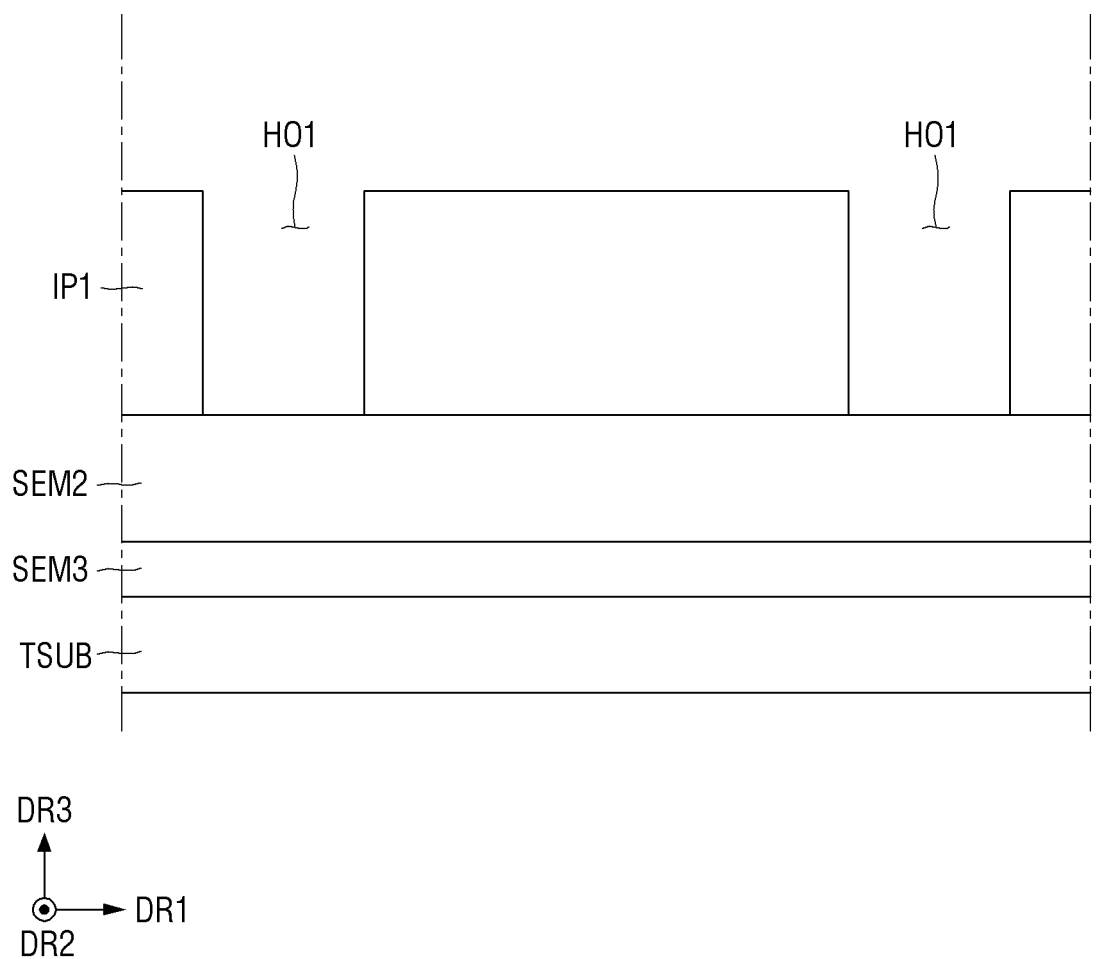
FIGS. 26 to 40 are cross-sectional views illustrating a method for manufacturing a display panel according to one or more embodiments of the present disclosure.

Referring to FIGS. 25 and 26, a third semiconductor layer SEM3 and a second semiconductor layer SEM2 are formed on a target substrate TSUB (S100 of FIG. 25).

First of all, the target substrate TSUB is prepared. The target substrate TSUB may be a sapphire substrate ($Al_2O_3$), but is not limited thereto. In one or more embodiments, a case that the target substrate TSUB is a sapphire substrate will be described by way of example.

The third semiconductor layer SEM3 and the second semiconductor layer SEM2 are formed on the target substrate TSUB. The third semiconductor layer SEM3 and the second semiconductor layer SEM2, which are grown by an epitaxial method, may be formed by growing a seed crystal. In this case, the third semiconductor layer SEM3 and the second semiconductor layer SEM2 may be formed by an electron beam deposition method, a physical vapor deposition (PVD) method, a chemical vapor deposition (CVD) method, a plasma laser deposition (PLD) method, a dual-type thermal evaporation method, sputtering, a metal organic chemical vapor deposition (MOCVD) method, etc. Preferably, the third semiconductor layer SEM3 and the second semiconductor layer SEM2 may be formed by the MOCVD method, but is not limited thereto.

There is no special limitation in a precursor material for forming the third semiconductor layer SEM3 and the second semiconductor layer SEM2 within the range that may typically be selected to form a target material. For example, the precursor material may be a metal precursor that includes an alkyl group such as a methyl group or an ethyl group. For example, the precursor material may be a compound such as trimethyl gallium ($Ga(CH_3)_3$), trimethyl aluminum ($Al(CH_3)_3$), and triethyl phosphate ($(C_2H_5)_3PO_4$), but is not limited thereto.

In detail, the third semiconductor layer SEM3 is formed on the target substrate TSUB. The third semiconductor layer SEM3 is deposited as a single layer as shown, but is not limited thereto. The third semiconductor layer SEM3 may be deposited as a plurality of layers. The third semiconductor layer SEM3 may be disposed to reduce a lattice constant difference between the second semiconductor layer SEM2 and the target substrate TSUB. For example, the third semiconductor layer SEM3 may include an undoped semiconductor, and may be a material that is not doped with an n-type or p-type. In one or more embodiments, the third semiconductor layer SEM3 may be at least one of InAlGaN, GaN, AlGaN, InGaN, AlN or InN, which is undoped, but is not limited thereto.

The second semiconductor layer SEM2 is formed on the third semiconductor layer SEM3 by the above-described method.

Subsequently, a first insulating member IP1 including a plurality of first holes HO1 is formed on the second semiconductor layer SEM2 (S200 of FIG. 25).

In detail, an insulating material layer is formed on the second semiconductor layer SEM2 and then patterned by a photolithography method to form the plurality of first holes HO1. The insulating material layer may be made of an inorganic insulating material such as silicon oxide, silicon nitride, and silicon oxynitride.

Figure 27:
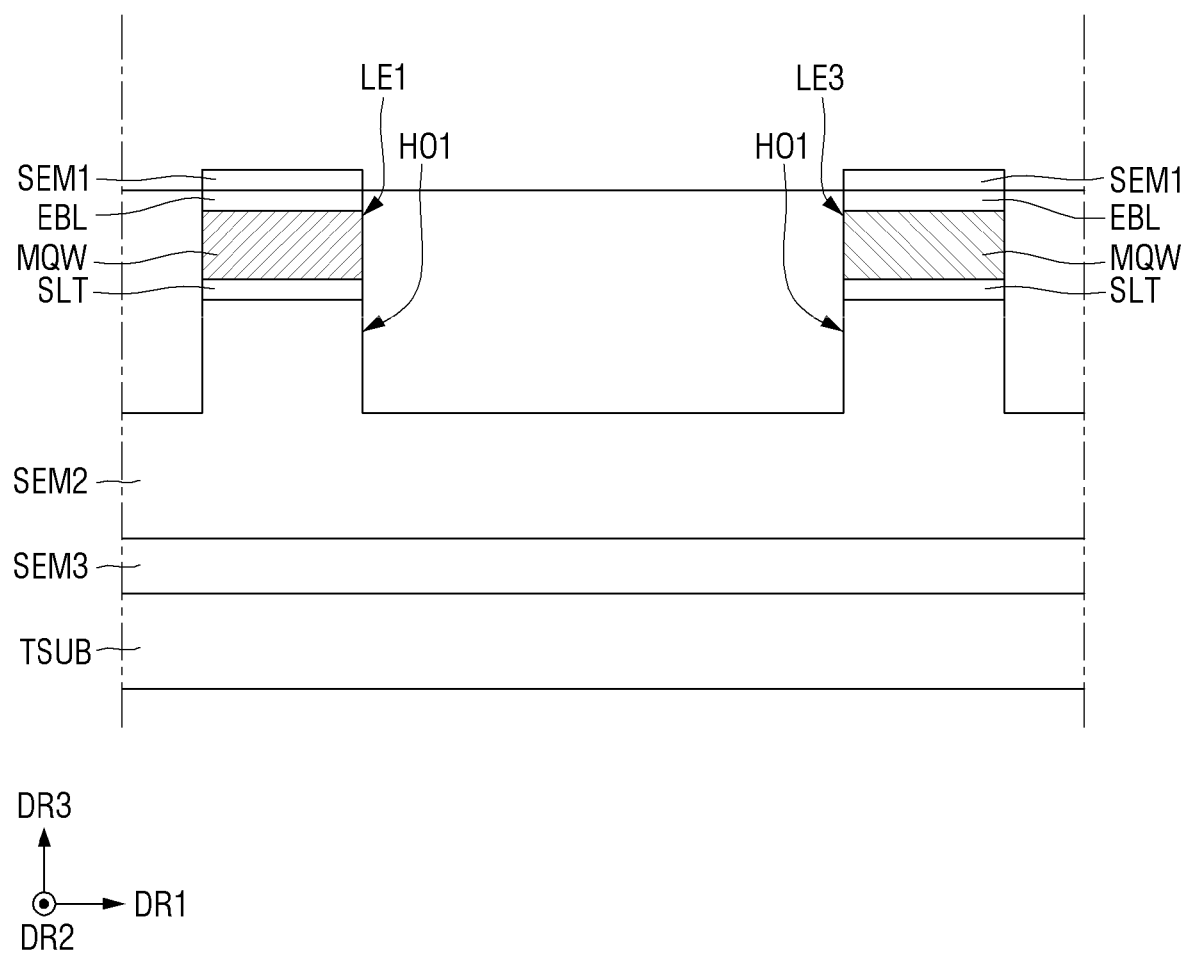

Then, referring to FIG. 27, the second semiconductor layer SEM2, an active layer MQW and a first semiconductor layer SEM1 are formed in the plurality of first holes HO1 to form a first light-emitting element LE1 and a third light-emitting element LE3 (S300 of FIG. 25).

In detail, the second semiconductor layer SEM2 is further formed on the target substrate TSUB by the above-described epitaxial method. The second semiconductor layer SEM2 acts as a seed on the second semiconductor layer SEM2 exposed by the first hole HO1, whereby the second semiconductor layer SEM2 is further grown in the plurality of first holes HO1.

Subsequently, a superlattice layer SLT, the active layer MQW, an electron blocking layer EBL, and the first semiconductor layer SEM1 are sequentially formed on the second semiconductor layer SEM2 by using the above-described epitaxial method. In one or more embodiments, the first semiconductor layer SEM1 may be formed to be protruded above an upper surface of the first insulating member IP1, but is not limited thereto.

As a result, the first light-emitting element LE1 and the third light-emitting element LE3 may be formed in the plurality of first holes HO1. The second semiconductor layer SEM2 and the third semiconductor layer SEM3 of the first light-emitting element LE1 and the third light-emitting element LE3 are formed as common layers. The first light-emitting element LE1 and the third light-emitting element LE3 may include active layers MQW formed of the same material to emit light of the same color. For example, the first light-emitting element LE1 and the third light-emitting element LE3 may emit first light of a blue color.

Figure 28:
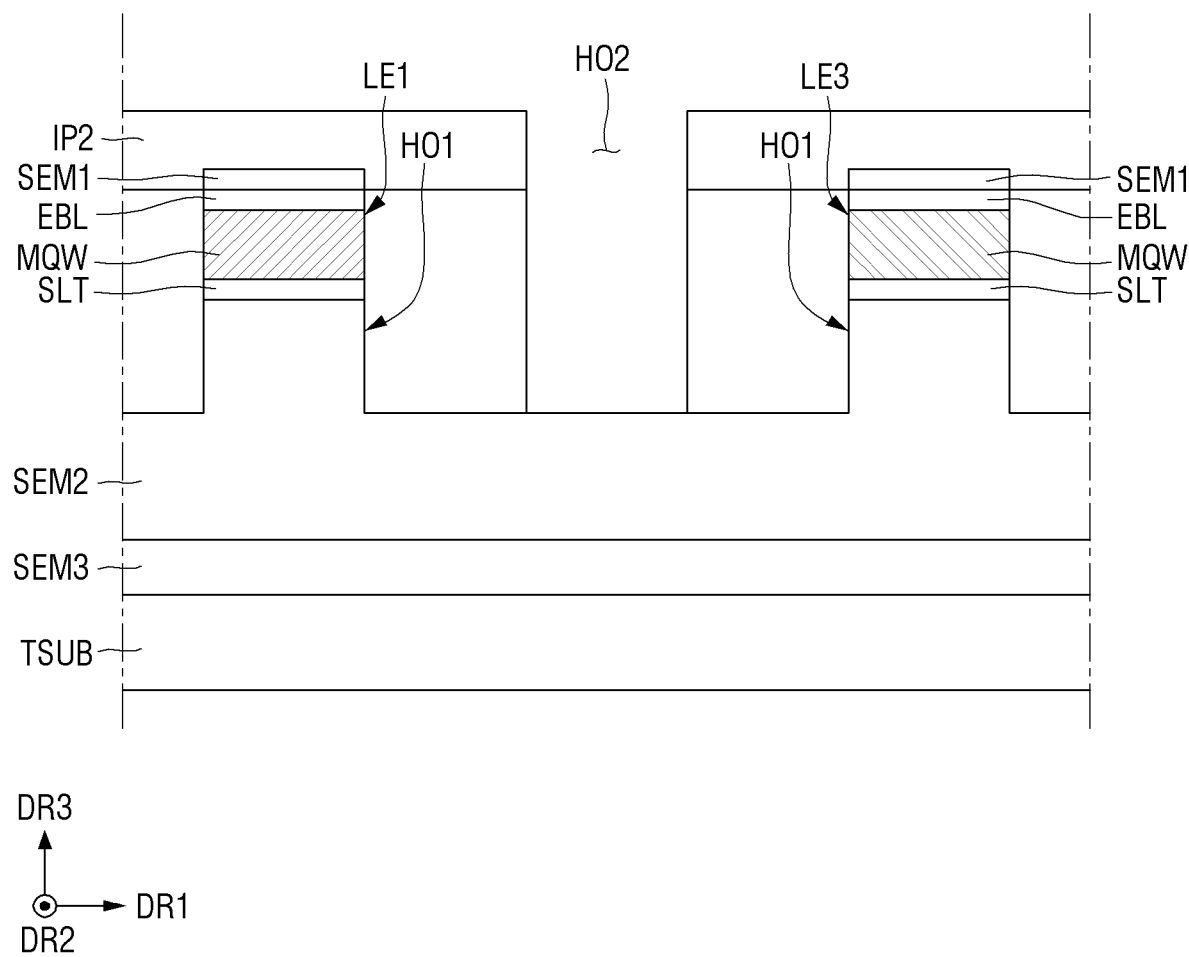

Next, referring to FIG. 28, a second insulating member IP2 covering the first insulating member IP1, the first light-emitting element LE1, and the third light-emitting element LE3 is formed, and a second hole HO2 is formed in the second insulating member IP2 and the first insulating member IP1 (S400 of FIG. 25).

In detail, an insulating material layer is deposited on the target substrate TSUB, in which the first insulating member IP1, the first light-emitting element LE1 and the third light-emitting element LE3 are formed, to form the second insulating member IP2. The second insulating member IP2 and the first insulating member IP1 are patterned by a photolithography method to form the second hole HO2. The second insulating member IP2 may be formed of the same material as that of the first insulating member IP1. The second hole HO2 may be formed between the plurality of first holes HO1.

Figure 29:
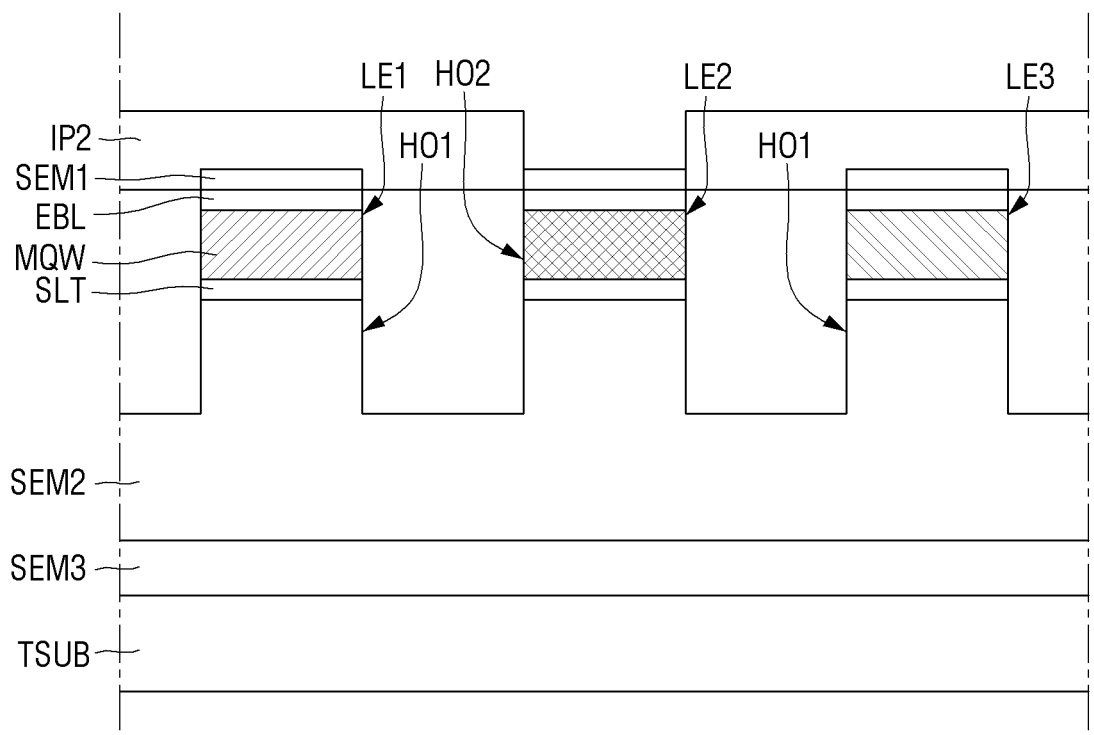

Next, referring to FIG. 29, the second semiconductor layer SEM2, the active layer MQW, and the first semiconductor layer SEM1 are formed in the second hole HO2 to form the second light-emitting element LE2 (S500 of FIG. 25).

In detail, the second semiconductor layer SEM2 is further formed on the target substrate TSUB by the above-described epitaxial method. The second semiconductor layer SEM2 acts as a seed on the second semiconductor layer SEM2 exposed by the second hole HO2, whereby the second semiconductor layer SEM2 is further grown in the second hole HO2. The second insulating member IP2 is masked on the first light-emitting element LE1 and the third light-emitting element LE3 so that additional semiconductor layers are not formed.

Subsequently, the superlattice layer SLT, the active layer MQW, the electron blocking layer EBL, and the first semiconductor layer SEM1 are sequentially formed on the second semiconductor layer SEM2 by using the above-described epitaxial method. As a result, the second light-emitting element LE2 may be formed in the second hole HO2. The second semiconductor layer SEM2 and the third semiconductor layer SEM3 of the first light-emitting element LE1 and the third light-emitting element LE3 are formed as common layers in the second light-emitting element LE2. The active layer MQW of the second light-emitting element LE2 may be formed of a material different from that of each of the first light-emitting element LE1 and the third light-emitting element LE3 to emit light of a color different from that of each of the first light-emitting element LE1 and the third light-emitting element LE3. For example, the second light-emitting element LE2 may emit second light of a green color.

Figure 30:
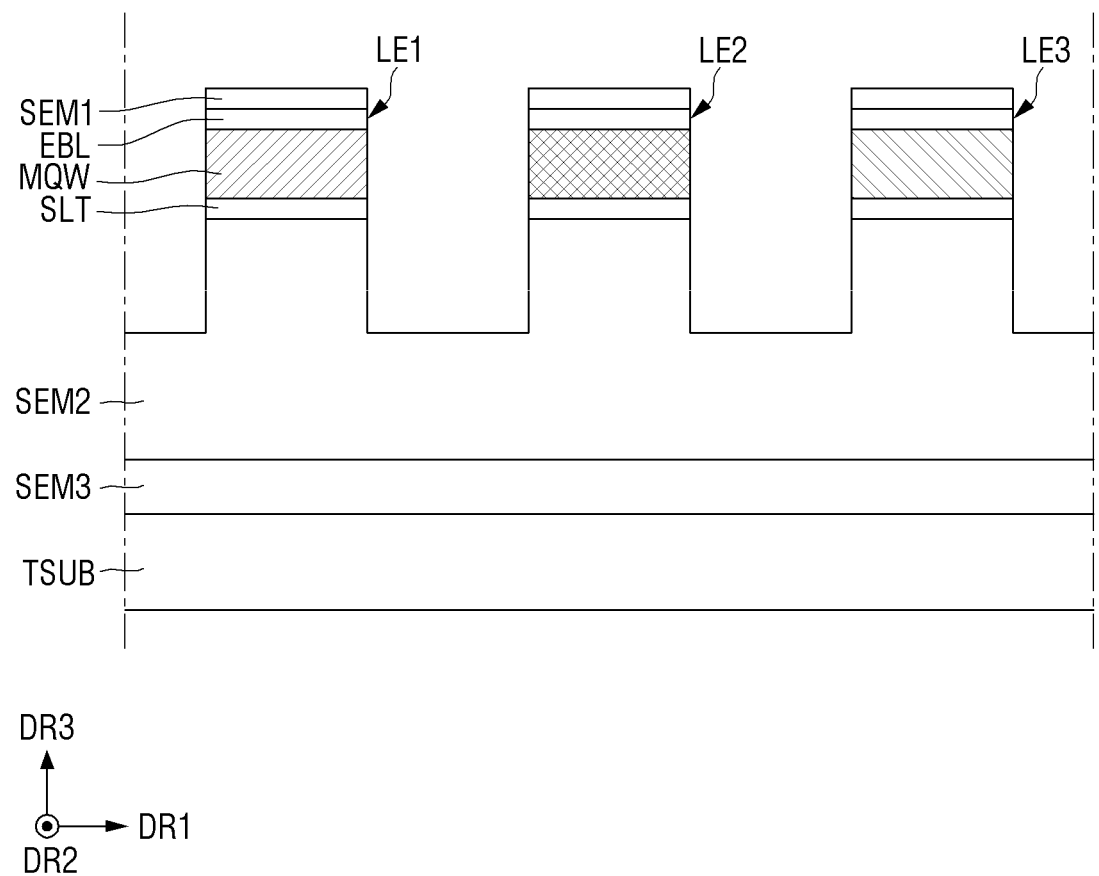

Next, as shown in FIG. 30, the first insulating member IP1 and the second insulating member IP2 are etched and removed to form the first light-emitting element LE1, the second light-emitting element LE2 and the third light-emitting element LE3 on the target substrate TSUB.

Figure 31:
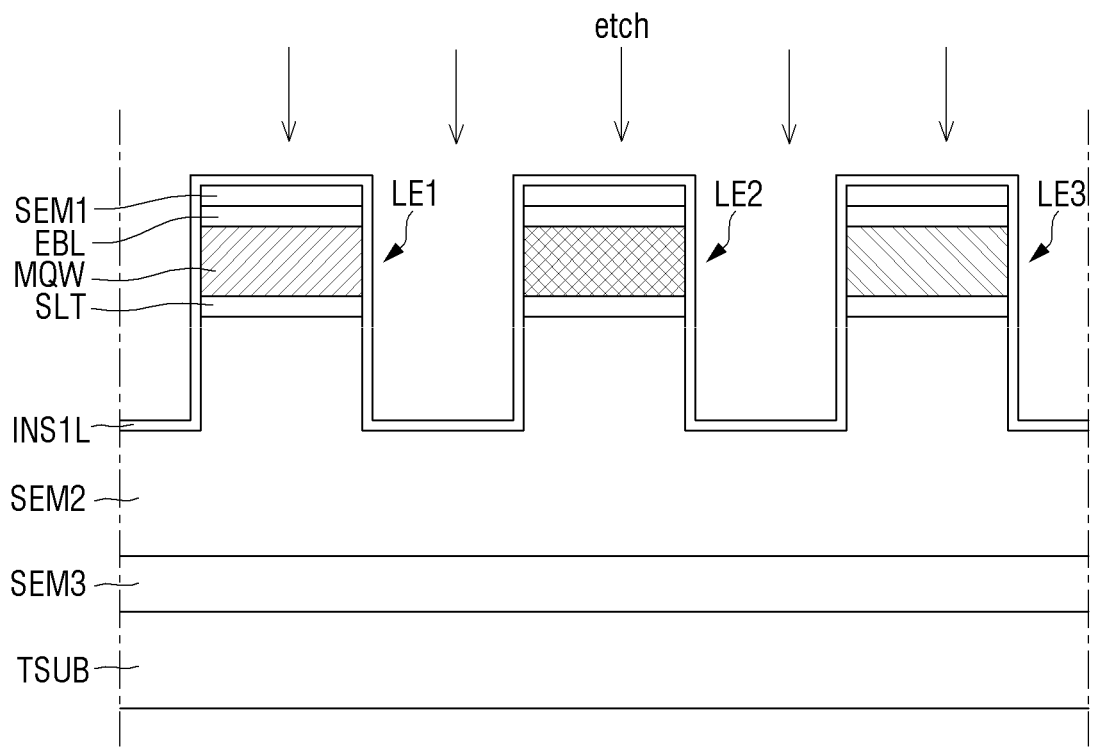
Figure 31:
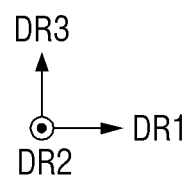

Subsequently, referring to FIG. 31, a first insulating layer INS1 is formed on the target substrate TSUB including the plurality of light-emitting elements LE1, LE2 and LE3.

In detail, a first insulating material layer INS1L is formed on the target substrate TSUB. The first insulating material layer INS1L may completely cover the plurality of light-emitting elements LE1, LE2, and LE3. The first insulating material layer INS1L may be formed in such a manner that an insulating material is coated on or dipped in the target substrate TSUB. For example, the first insulating material layer INS1L may be formed by an atomic layer deposition (ALD) method.

Figure 32:
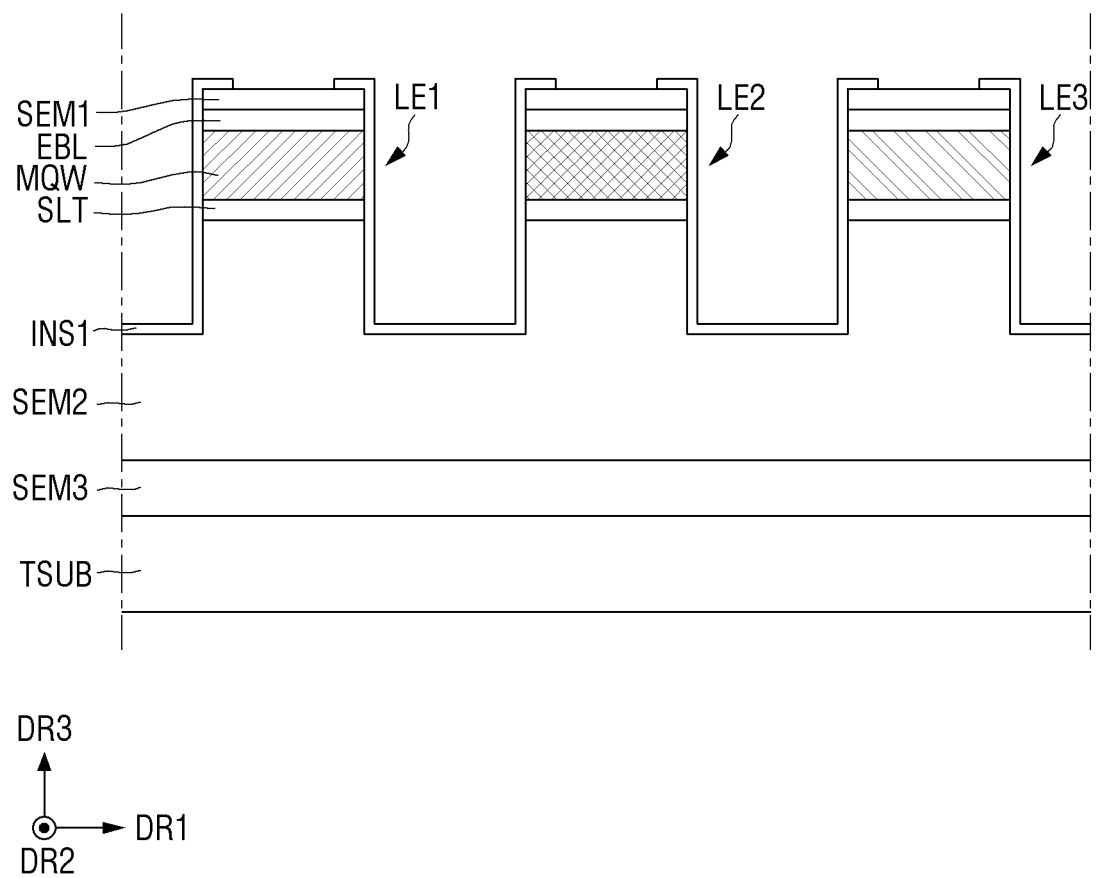

Subsequently, referring to FIG. 32, the first insulating material layer INS1L is partially etched and removed to expose the upper surface of the first semiconductor layer SEM1 disposed on the upper surfaces of the plurality of light-emitting elements LE1, LE2, and LE3, whereby the first insulating layer INS1 is formed. The first insulating material layer INS1L may be removed by the above-described etching method.

Figure 33:
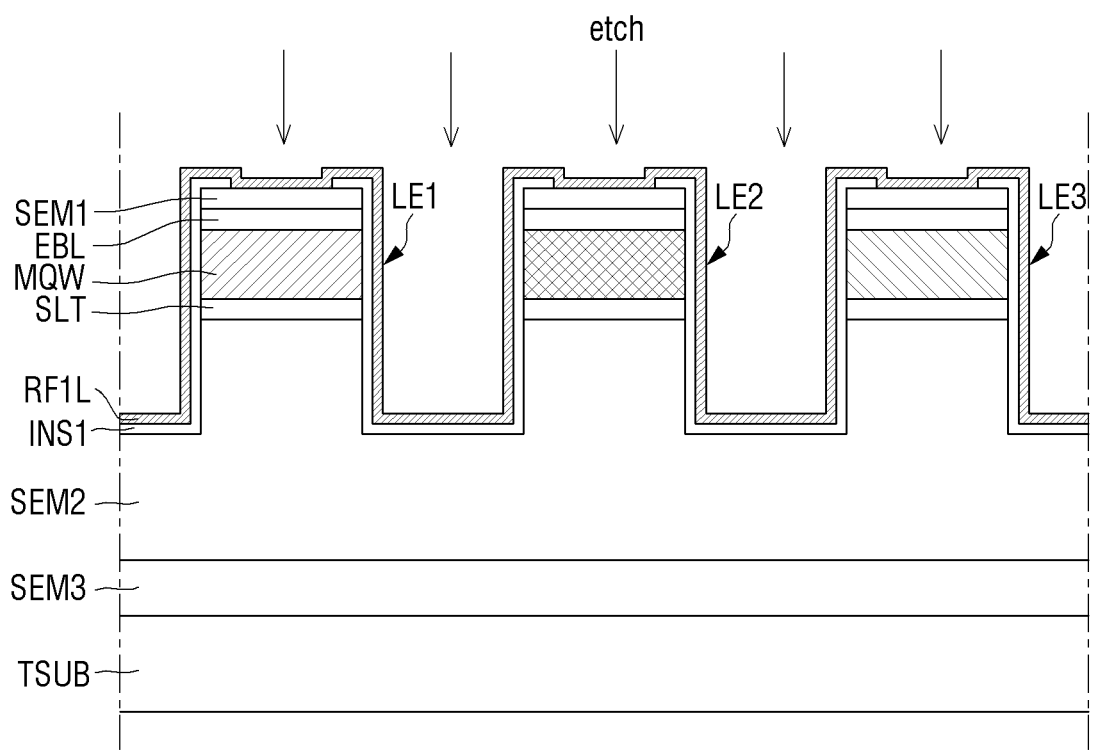
Figure 34:
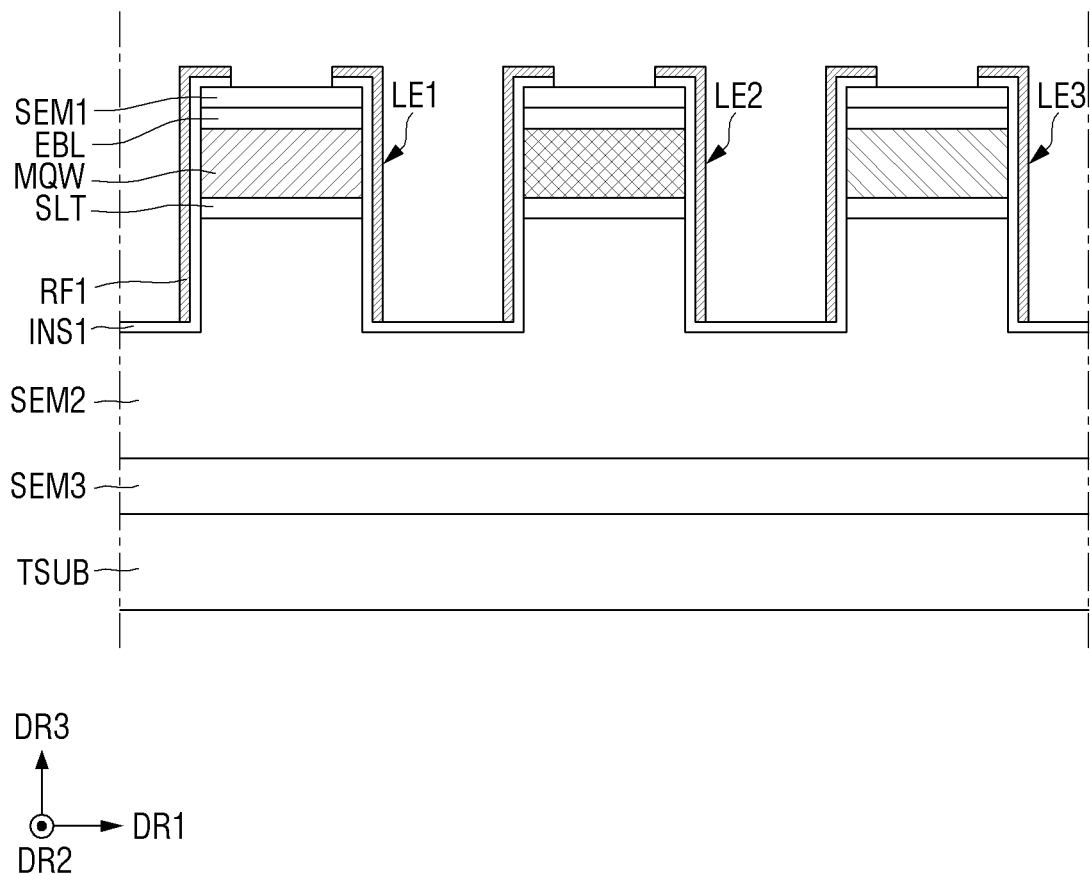

Then, referring to FIGS. 33 and 34, a first reflective layer RF1 is formed on the first insulating layer INS1.

In detail, a first reflective material layer RF1L is formed on the target substrate TSUB in which the first insulating layer INS1 is formed. The first reflective material layer RF1L may include a metal having high reflectance, such as aluminum (Al). The first reflective material layer RF1L may be formed by the metal deposition method such as sputtering. The first reflective material layer RF1L may be deposited entirely on the first insulating layer INS1 and the plurality of light-emitting elements LE1, LE2, and LE3.

Next, the first reflective material layer RF1L is etched to form the first reflective layer RF1. The first reflective layer RF1 may be disposed on a side and an upper surface of the first insulating layer INS1 disposed on sides and upper surfaces of the plurality of light-emitting elements LE. Also, the first reflective layer RF1 may be spaced from another first reflective layer between the light-emitting elements LE1, LE2, and LE3 adjacent to one another.

Figure 35:
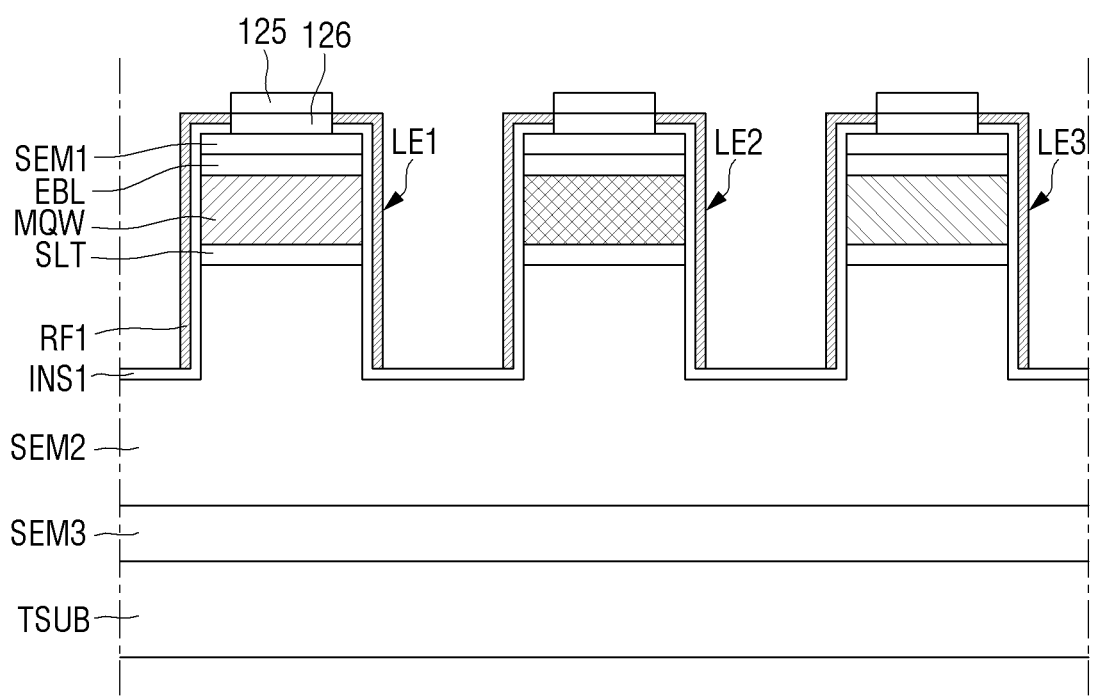

Referring to FIG. 35, ohmic contact layers 126 and connection electrodes 125 are formed on the plurality of light-emitting elements LE.

In detail, electrode material layers are sequentially deposited on the target substrate TSUB and then etched to form the ohmic contact layers 126 and the connection electrodes 125 on the plurality of light-emitting elements LE1, LE2, and LE3 exposed by the first insulating layer INS1 and the first reflective layer RF1. The ohmic contact layers 126 may be formed directly on the upper surface of the first semiconductor layer SEM1 of each of the light-emitting elements LE1, LE2, and LE3. The connection electrodes 125 may be formed on the uppermost portion of each of the light-emitting elements LE1, LE2, and LE3.

Figure 36:
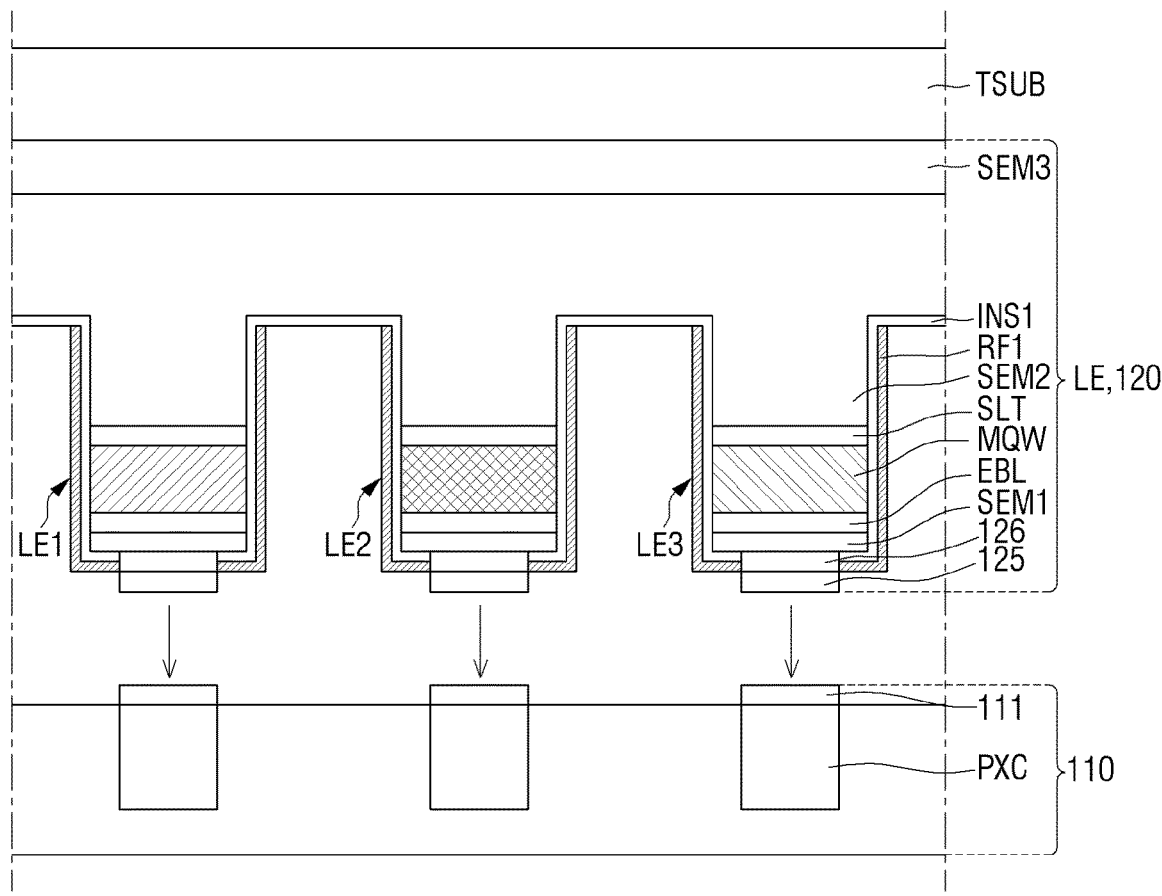
Figure 36:
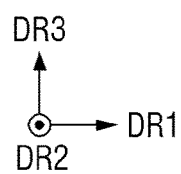
Figure 37:
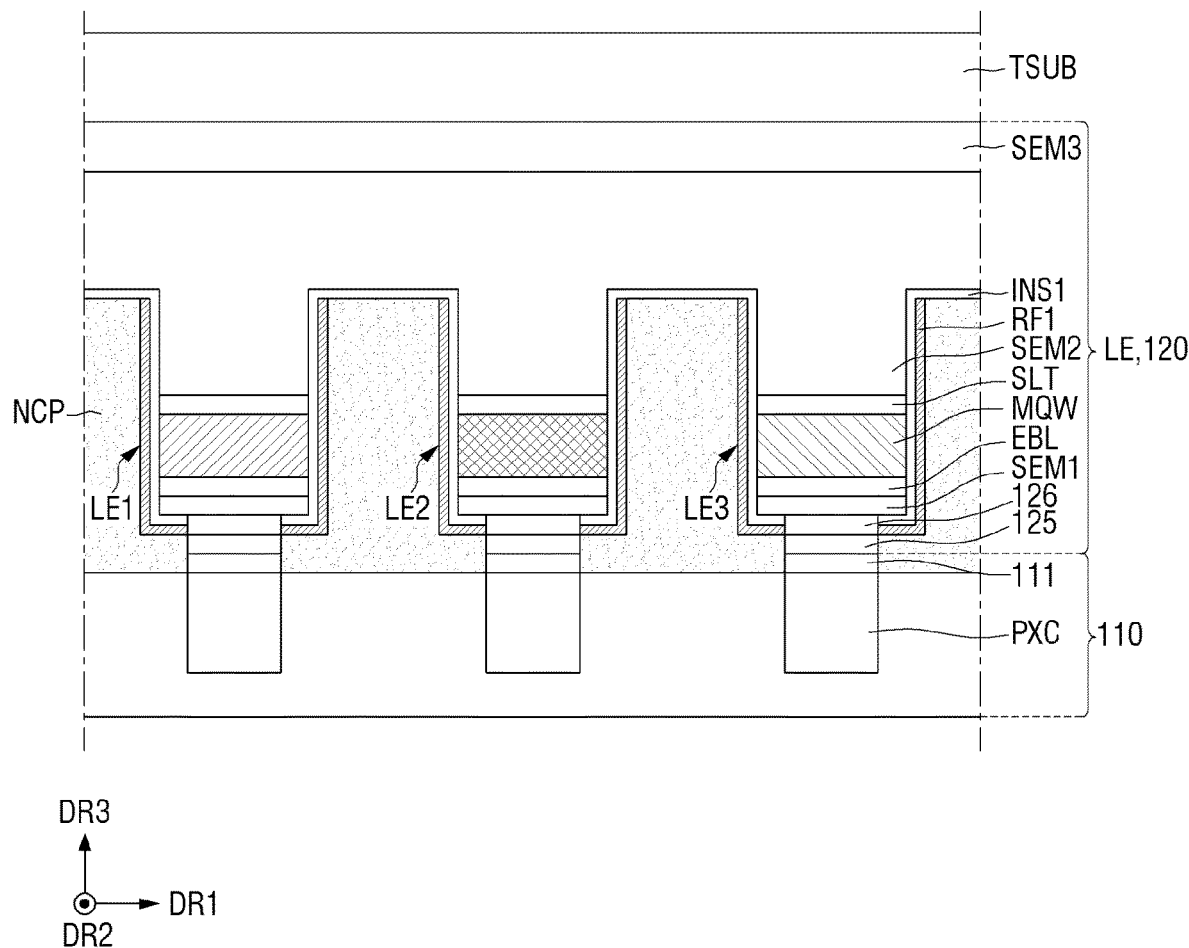

Next, referring to FIGS. 36 and 37, the first to third light-emitting elements LE1, LE2 and LE3 are bonded onto the semiconductor circuit board 110, and the target substrate TSUB is separated (S600 of FIG. 25).

First of all, the semiconductor circuit board 110 is prepared. The semiconductor circuit board 110 may include a plurality of pixel circuits PXC and a corresponding pixel electrode 111.

In detail, the pixel electrodes 111 are formed on the semiconductor circuit board 110 in which the plurality of pixel circuits PXC are formed. Subsequently, the target substrate TSUB is aligned on the semiconductor circuit board 110. Alignment keys may be disposed on the semiconductor circuit board 110 and the target substrate TSUB to align them. Subsequently, the semiconductor circuit board 110 and the target substrate TSUB are bonded to each other.

In detail, the pixel electrodes 111 of the semiconductor circuit board 110 and the corresponding connection electrodes 125 of each of the light-emitting elements LE1, LE2, and LE3 are brought into contact with each other. Then, the pixel electrodes 111 and the connection electrodes 125 are subjected to melt bonding at a suitable temperature (e.g., a set or predetermined temperature), whereby the respective light-emitting elements LE1, LE2, and LE3 are bonded to the semiconductor circuit board 110. At this time, a filler NCP for eutectic bonding is coated between the semiconductor circuit board 110 and the target substrate TSUB. The filler NCP may be filled between the semiconductor circuit board 110 and the light-emitting elements LE1, LE2, and LE3 or between the semiconductor circuit board 110 and the target substrate TSUB.

Figure 38:
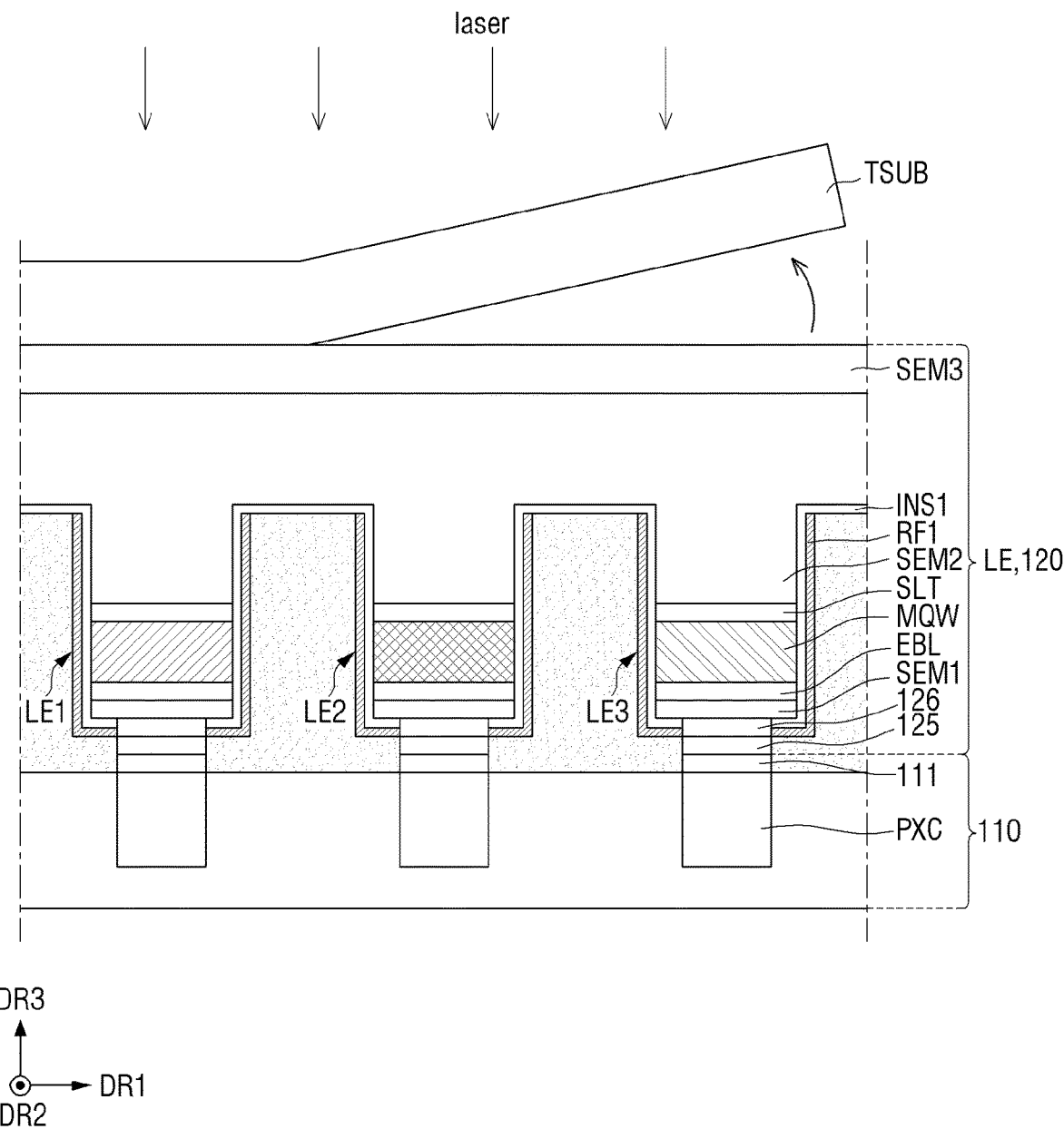

Next, referring to FIG. 38, the target substrate TSUB is separated. In detail, the target substrate TSUB is separated from the third semiconductor layer SEM3. A process of separating the target substrate TSUB may separate the target substrate TSUB by a laser lift-off (LLO) process. The laser lift-off process uses a laser, wherein KrF excimer laser (wavelength of 248 nm) may be used as a source. The excimer laser may be irradiated at an energy density ranging from 550 mJ/cm$^2$ to 950 mJ/cm$^2$, and an incident area may range from 50×50 µm$^2$ to 1×1 cm$^2$, but is not limited thereto.

Figure 39:
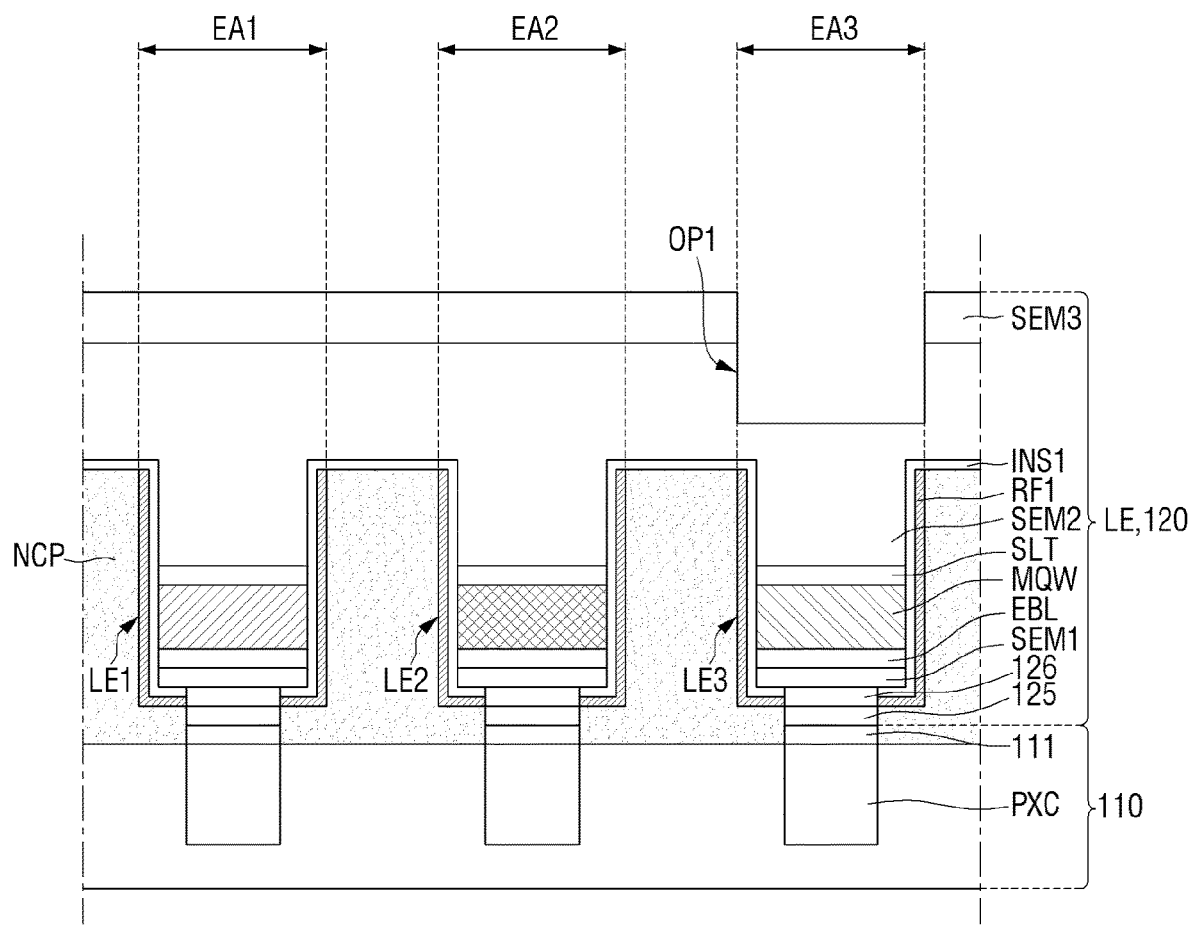

Subsequently, referring to FIG. 39, at least a portion of the second and third semiconductor layers SEM2 and SEM3 that overlap the third light-emitting element LE3 is etched to form the a first opening OP1 (S700 of FIG. 25).

In detail, an area of the third semiconductor layer SE3, which is overlapped with the third light-emitting element LE3, is etched using a photolithography method to expose the second semiconductor layer SEM2, and is further etched to etch a portion of the second semiconductor layer SEM2. Therefore, the first opening OP1 may be formed in a shape that passes through the third semiconductor layer SEM3 and allows a portion of the second semiconductor layer SEM2 to be recessed. A depth of the first opening OP1 may be about 1 µm to 10 µm. The etching process may be the same as the etching process of the semiconductor material layer described above.

Figure 40:
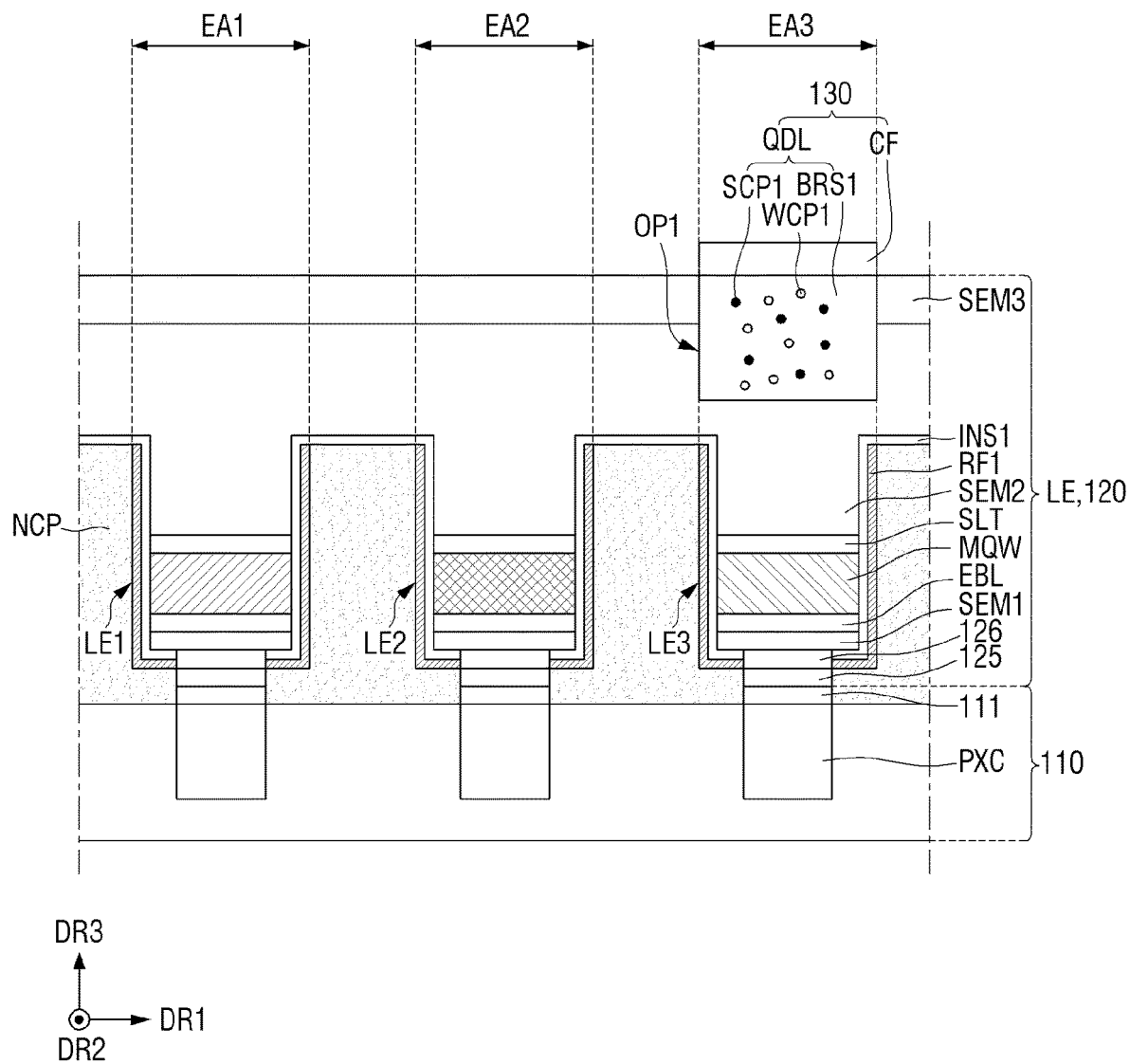

Next, referring to FIG. 40, a wavelength conversion layer QDL is formed in the first opening OP1, and a color filter CF is formed on the wavelength conversion layer QDL (S800 of FIG. 25).

The wavelength conversion layer QDL may be formed in the first opening OP1. The wavelength conversion layer QDL may be formed by a solution process such as imprinting, but is not limited thereto. The wavelength conversion layer QDL may be formed to fill the first opening OP1.

Subsequently, the color filter CF is formed on the wavelength conversion layer QDL. The color filter CF may be formed by a photo process. For example, a color filter material layer is coated on the wavelength conversion layer QDL and the third semiconductor layer SEM3 and patterned through a photo process to form the color filter CF that overlaps the first opening OP1 and the wavelength conversion layer QDL. A thickness of the color filter CF may be 1 µm or less, but is not limited thereto.

As described above, in the display device according to one or more embodiments of the present disclosure, the opening may be formed on the light-emitting element for emitting the first light, and the wavelength conversion member for converting the first light into the third light may be formed, whereby the third light may be implemented at a low current density to improve internal quantum efficiency.

Also, in the display device according to one or more embodiments of the present disclosure, the opening may be formed to be deep so that the color filter and the wavelength conversion layer may be formed in the opening, whereby the color filter and the wavelength conversion layer may easily be aligned. The thickness of the wavelength conversion layer may be increased to improve optical conversion efficiency.

Also, the display device according to one or more embodiments of the present disclosure may include the light-shielding member around (or surrounding) the light-emission areas to prevent a color mixture from occurring due to permeation of light into the portions between the light emission areas, thereby improving a color reproduction rate.

Figure 41:
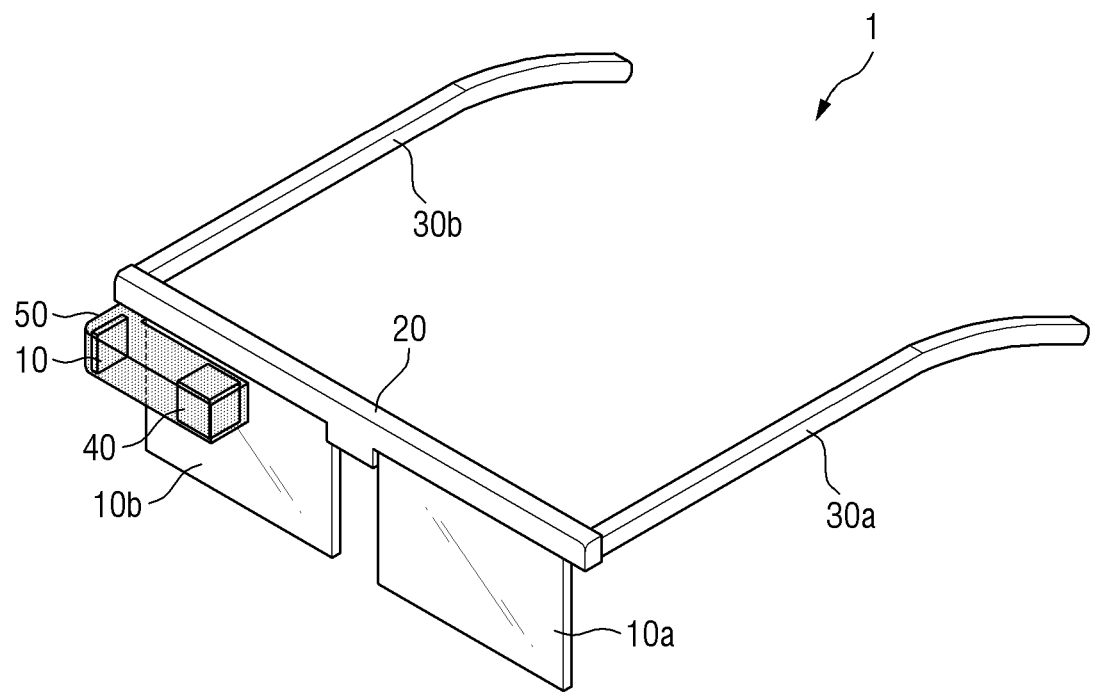
FIG. 41 is a view illustrating a virtual reality device including a display device according to one or more embodiments.

FIG. 41 is a view illustrating a virtual reality device including a display device according to one or more embodiments. In FIG. 41, a virtual reality device 1 to which a display device 10 according to one or more embodiments is applied is shown.

Referring to FIG. 41, the virtual reality device 1 according to one or more embodiments may be a glasses-type device. The virtual reality device 1 according to one or more embodiments may include a display device 10, a left-eye lens 10a, a right-eye lens 10b, a support frame 20, glasses frame legs 30a and 30b, a reflection member 40, and a display device accommodating portion 50.

Although FIG. 41 illustrates the virtual reality device 1 that includes glasses frame legs 30a and 30b, the virtual reality device 1 according to one or more embodiments may be applied to a head mounted display including a head mounting band, which may be mounted on a head, instead of the glasses frame legs 30a and 30b. That is, the virtual reality device 1 according to one or more embodiments is not limited to that shown in FIG. 41, and is applicable to various electronic devices in various forms.

The display device accommodating portion 50 may include a display device 10 and a reflection member 40. An image displayed on the display device 10 may be reflected by the reflection member 40 and provided to a user's right eye through the right-eye lens 10b. For this reason, the user may view a virtual reality image displayed on the display device 10 through the right eye.

Although FIG. 41 illustrates that the display device accommodating portion 50 is disposed at a right end of the support frame 20, one or more embodiments of the present disclosure are not limited thereto. For example, the display device accommodating portion 50 may be disposed at a left end of the support frame 20, and in this case, the image displayed on the display device 10 may be reflected by the reflection member 40 and provided to the user's left eye through the left-eye lens 10a. For this reason, the user may view the virtual reality image displayed on the display device 10 through the left eye. Alternatively, the display device accommodating portion 50 may be disposed at both the left end and the right end of the support frame 20, and in this case, the user may view the virtual reality image displayed on the display device 10 through both the left eye and the right eye.

Figure 42:
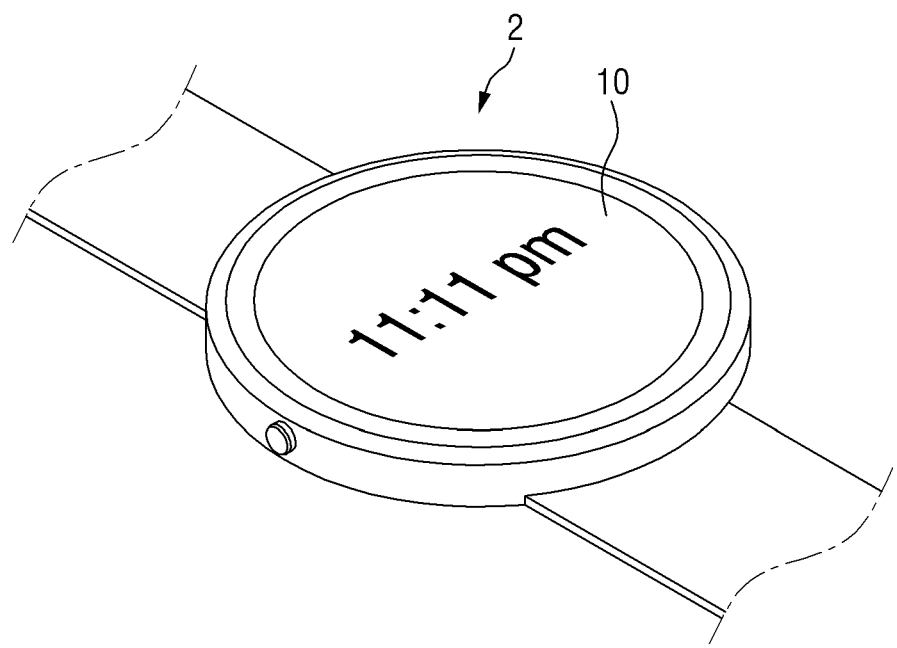
FIG. 42 is a view illustrating a smart device including a display device according to one or more embodiments.

FIG. 42 is a view illustrating a smart device including a display device according to one or more embodiments.

Referring to FIG. 42, a display device 10 according to one or more embodiments may be applied to a smart watch 2 that is one of the smart device.

Figure 43:
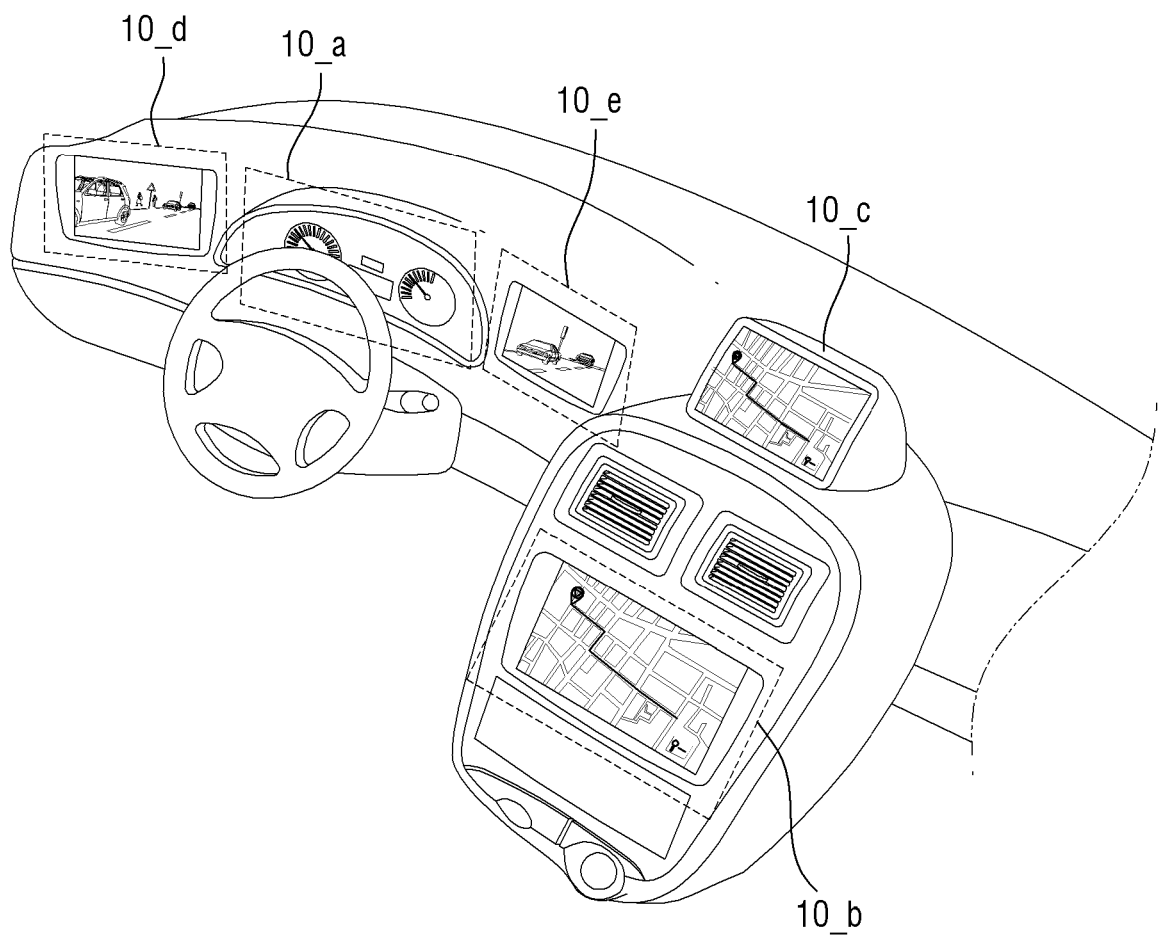
FIG. 43 is a view illustrating a vehicle including a display device according to one or more embodiments.

FIG. 43 is a view illustrating a vehicle including a display device according to one or more embodiments. A vehicle to which the display device 10 according to one or more embodiment is applied is shown in FIG. 43.

Referring to FIG. 43, display devices 10_a, 10_b, and 10_c according to one or more embodiments may be applied to a dashboard of the vehicle, applied to a center fascia of the vehicle, or applied to a center information display (CID) disposed on the dashboard of the vehicle. In addition, display devices 10_d and 10_e according to one or more embodiments may be applied to a room mirror display that replaces a side mirror of the vehicle.

Figure 44:
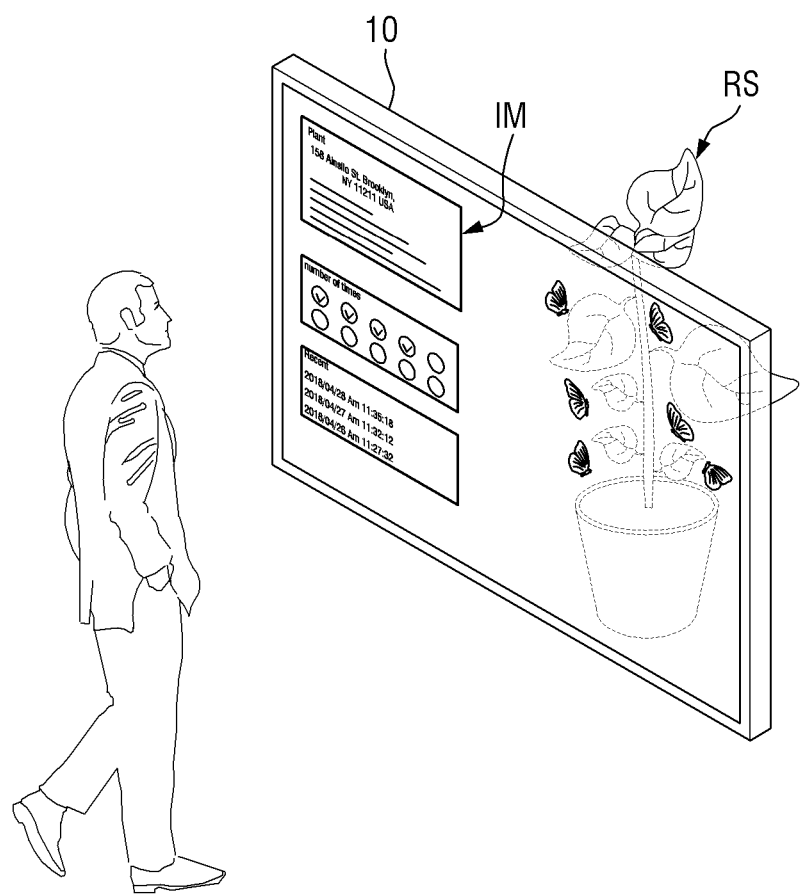
FIG. 44 is a view illustrating a transparent display device including a display device according to one or more embodiments.

FIG. 44 is a view illustrating a transparent display device including a display device according to one or more embodiments.

Referring to FIG. 44, a display device 10 according to one or more embodiments may be applied to the transparent display device. The transparent display device may display an image IM and at the same time transmit light. Therefore, a user located on a front surface of the transparent display device may not only view the image IM displayed on the display device 10 but also view an object RS or background located on a rear surface of the transparent display device. When the display device 10 is applied to the transparent display device, the semiconductor circuit board 110 of the display device 10 shown in FIG. 4 may include a light transmitting portion capable of transmitting light or may be formed of a material capable of transmitting light.

In concluding the detailed description, those skilled in the art will appreciate that many variations and modifications can be made to the embodiments without substantially departing from the scope and principles of the present disclosure. Therefore, the embodiments of the present disclosure are used in a generic and descriptive sense only and not for purposes of limitation.

What is claimed is:

1. A display device comprising:
  a substrate;
  a first light-emitting element, a second light-emitting element, and a third light-emitting element on the substrate, each of the first, second, and third light-emitting elements comprising a first semiconductor layer, an active layer, a second semiconductor layer, and a third semiconductor layer;
  an opening defined by the second semiconductor layer and the third semiconductor layer of the third light-emitting element, such that a thickness of the second semiconductor layer overlapping the third light-emitting element is less than a thickness of the second semiconductor layer overlapping the first light-emitting element or the second light-emitting element; and
  a wavelength conversion member located at the opening,
  wherein the first light-emitting element and the third light-emitting element are configured to emit first light, and the second light-emitting element is configured to emit second light, and
  wherein the wavelength conversion member is configured to convert the first light from the third light-emitting element into third light.

2. The display device of claim 1, wherein the second semiconductor layer and the third semiconductor layer are common layers that are continuous at the first light-emitting element, the second light-emitting element, and the third light-emitting element.

3. The display device of claim 1, wherein the opening overlaps the third light-emitting element, and does not overlap the first light-emitting element and the second light-emitting element.

4. The display device of claim 1, wherein the opening is formed in a shape that passes through the third semiconductor layer and allows at least a portion of the second semiconductor layer to be recessed at a suitable thickness.

5. The display device of claim 1, wherein a depth of the opening is smaller than a sum of thicknesses of the second semiconductor layer and the third semiconductor layer.

6. The display device of claim 1, wherein a thickness of the second semiconductor layer that overlaps the opening is at least 1 µm.

7. The display device of claim 1, wherein the wavelength conversion member comprises a wavelength conversion layer configured to convert the first light into the third light, the opening being filled with the wavelength conversion layer.

8. The display device of claim 7, wherein the wavelength conversion member comprises a color filter on the wavelength conversion layer, wherein the color filter is configured to transmit the third light.

9. The display device of claim 8, wherein a lower surface of the color filter is aligned and matched with an upper surface of the third semiconductor layer.

10. The display device of claim 8, wherein an upper surface of the color filter is aligned and matched with that of the third semiconductor layer.

11. The display device of claim 8, further comprising a light-shielding member on the third semiconductor layer, wherein the light-shielding member does not overlap the first light-emitting element, the second light-emitting element, and the third light-emitting element, and wherein the light-shielding member is at a same layer as the color filter.

12. The display device of claim 1, wherein the first semiconductor layer, the active layer, the second semiconductor layer, and the third semiconductor layer are located sequentially in a direction away from the substrate.

13. The display device of claim 1, wherein a width of the opening is the same as that of the third light-emitting element or greater than that of the third light-emitting element.

14. The display device of claim 1, further comprising a reflective layer on an inner side of the opening.

15. The display device of claim 1, wherein the first light is blue light, the second light is green light, and the third light is red light.

16. The display device of claim 1, wherein the substrate further comprises:
a plurality of pixel circuits comprising at least one transistor; and
pixel electrodes on the plurality of pixel circuits and respectively connected with the plurality of pixel circuits.

17. The display device of claim 16, wherein the first light-emitting element, the second light-emitting element, and the third light-emitting element are bonded to corresponding ones of the pixel electrodes, and the display device further comprises a filler filled between the first to third light-emitting elements and the substrate.

18. The display device of claim 1, further comprising a transparent substrate on the third semiconductor layer, wherein the opening passes through the transparent substrate.

19. A display device comprising:
a substrate;
a first light-emitting element, a second light-emitting element, and a third light-emitting element on the substrate, each of the first, second, and third light-emitting elements comprising a first semiconductor layer, an active layer, a second semiconductor layer, and a third semiconductor layer, a thickness of the second semiconductor layer overlapping the third light-emitting element being less than a thickness of the second semiconductor layer overlapping the first light-emitting element or the second light-emitting element; and
a wavelength conversion member overlapping the third light-emitting element,
wherein the first light-emitting element is configured to emit first light, the second light-emitting element is configured to emit second light, and the third light-emitting element is configured to emit third light, and
wherein the wavelength conversion member is configured to transmit the third light from the third light-emitting element.

20. The display device of claim 19, wherein the wavelength conversion member comprises a color filter configured to transmit the third light and to shield the first light and the second light.

21. The display device of claim 19, further comprising an opening formed in the second semiconductor layer and the third semiconductor layer of the third light-emitting element, wherein the opening overlaps the third light-emitting element.

22. The display device of claim 21, wherein the wavelength conversion member is located in the opening, and wherein an upper surface of the wavelength conversion member is aligned and matched with that of the third semiconductor layer.

23. A display device comprising:
a substrate comprising a first light emission area for emitting first light, a second light emission area for emitting second light, and a third light emission area for emitting third light;
a plurality of light-emitting elements on the substrate, located at corresponding ones of the first light emission area, the second light emission area, and the third light emission area, and comprising semiconductor layers;
an opening overlapping the third light emission area, and at least partially defined by one of the semiconductor layers, such that an upper surface of the one of the semiconductor layers overlapping the third light emission area is lower than an upper surface of the one of the semiconductor layers overlapping the first light emission area or the second light emission area; and
a wavelength conversion member located in the opening.

24. The display device of claim 23, wherein the plurality of light-emitting elements comprises a first light-emitting element overlapping the first light emission area, the first light-emitting element being configured to emit the first light, a second light-emitting element overlapping the second light emission area, the second light-emitting element being configured to emit the second light, and a third light-emitting element overlapping the third light emission area, the third light-emitting element being configured to emit the first light.

25. The display device of claim 24, wherein the wavelength conversion member comprises a wavelength conversion layer configured to convert the first light emitted from the third light-emitting element into the third light.

26. The display device of claim 25, wherein the wavelength conversion member comprises a color filter on the wavelength conversion layer, the color filter being configured to transmit the third light and to shield the first light and the second light.

27. The display device of claim 23, wherein each of the plurality of light-emitting elements comprises a first semiconductor layer, an active layer, a second semiconductor layer, and a third semiconductor layer located sequentially in a direction away from the substrate, wherein the opening penetrates through the third semiconductor layer and has a recess at the second semiconductor layer.

28. An electronic device comprising:
a substrate;
a first light-emitting element, a second light-emitting element, and a third light-emitting element on the substrate, each of the first, second, and third light-emitting elements comprising a first semiconductor layer, an active layer, a second semiconductor layer, and a third semiconductor layer;
an opening defined by the second semiconductor layer and the third semiconductor layer of the third light-emitting element, such that a thickness of the second semiconductor layer overlapping the third light-emitting element is less than a thickness of the second semiconductor layer overlapping the first light-emitting element or the second light-emitting element; and
a wavelength conversion member located at the opening,
wherein the first light-emitting element and the third light-emitting element are configured to emit first light, and the second light-emitting element is configured to emit second light, and
wherein the wavelength conversion member is configured to convert the first light from the third light-emitting element into third light.

29. The electronic device of claim 28, wherein the electronic device is applied to a virtual reality device, a smart device, a vehicle, or a transparent display device.

\* \* \* \* \*